United States Patent
Yoshimoto et al.

(10) Patent No.: US 12,142,215 B2
(45) Date of Patent: Nov. 12, 2024

(54) SEMICONDUCTOR DEVICE, DISPLAY APPARATUS, AND ELECTRONIC DEVICE

(71) Applicant: SEMICONDUCTOR ENERGY LABORATORY CO., LTD., Atsugi (JP)

(72) Inventors: Satoshi Yoshimoto, Kanagawa (JP); Susumu Kawashima, Kanagawa (JP); Kazunori Watanabe, Tokyo (JP); Tomoaki Atsumi, Kanagawa (JP); Koji Kusunoki, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 18/279,110

(22) PCT Filed: Feb. 22, 2022

(86) PCT No.: PCT/IB2022/051530
§ 371 (c)(1),
(2) Date: Aug. 28, 2023

(87) PCT Pub. No.: WO2022/185143
PCT Pub. Date: Sep. 9, 2022

(65) Prior Publication Data
US 2024/0144879 A1    May 2, 2024

(30) Foreign Application Priority Data
Mar. 5, 2021 (JP) .................................. 2021-035145

(51) Int. Cl.
*G09G 3/3233* (2016.01)
*H10K 59/35* (2023.01)

(52) U.S. Cl.
CPC ... *G09G 3/3233* (2013.01); *G09G 2300/0842* (2013.01); *G09G 2310/0286* (2013.01); *G09G 2330/021* (2013.01); *H10K 59/35* (2023.02)

(58) Field of Classification Search
CPC ......... G09G 3/3233; G09G 2300/0842; G09G 2310/0286; G09G 2330/021;
(Continued)

(56) References Cited

U.S. PATENT DOCUMENTS 7,333,586 B2  2/2008  Jang
7,529,334 B2  5/2009  Jang
(Continued)

FOREIGN PATENT DOCUMENTS

CN  001797609 A  7/2006
CN  102467891 A  5/2012
(Continued)

OTHER PUBLICATIONS

International Search Report (Application No. PCT/IB2022/051530) Dated Apr. 12, 2022.
(Continued)

*Primary Examiner* — Abhishek Sarma
(74) *Attorney, Agent, or Firm* — NIXON PEABODY LLP; Jeffrey L. Costellia

(57) ABSTRACT

Provided is a highly reliable semiconductor device. The present invention relates to a shift register circuit including a plurality of stages of sequential circuits. An output signal of a sequential circuit is input to a sequential circuit in the subsequent stage. Before a sequential circuit outputs a signal and after the sequential circuit outputs the signal, the potential of a gate of a transistor included in the sequential circuit is changed in accordance with a clock signal so as to avoid voltage stress application between the gate and a source of the transistor for a long time. The shift register circuit can be
(Continued)

applied to a scan line driver circuit of a display apparatus, for example.

15 Claims, 50 Drawing Sheets

(58) Field of Classification Search
CPC ....... G09G 2330/00; G09G 2300/0426; G09G 2310/0267; G09G 2310/08; G09G 3/20; G09G 3/3266; H10K 59/35; H10K 59/1213; H10K 59/131; G11C 19/28; H05B 33/12
See application file for complete search history.

(56) References Cited

U.S. PATENT DOCUMENTS

| | | |
|---|---|---|
| 7,664,218 B2 | 2/2010 | Tobita |
| 8,320,516 B2 | 11/2012 | Toyotaka |
| 8,576,978 B2 | 11/2013 | Toyotaka |
| 8,737,560 B2 | 5/2014 | Tan et al. |
| 2006/0146978 A1 | 7/2006 | Jang |
| 2008/0101529 A1 | 5/2008 | Tobita |
| 2011/0216874 A1 | 9/2011 | Toyotaka |
| 2012/0105393 A1 | 5/2012 | Tan et al. |

FOREIGN PATENT DOCUMENTS

| | | |
|---|---|---|
| CN | 102783025 A | 11/2012 |
| JP | 2006-190437 A | 7/2006 |
| JP | 2008-108374 A | 5/2008 |
| JP | 2011-030171 A | 2/2011 |
| JP | 2011-205624 A | 10/2011 |
| JP | 2012-099211 A | 5/2012 |
| KR | 2006-0079037 A | 7/2006 |
| KR | 2012-0046061 A | 5/2012 |
| KR | 2012-0139755 A | 12/2012 |
| WO | WO-2011/108343 | 9/2011 |
| WO | WO-2018/087625 | 5/2018 |

OTHER PUBLICATIONS

Written Opinion (Application No. PCT/IB2022/051530) Dated Apr. 12, 2022.

10a

10a

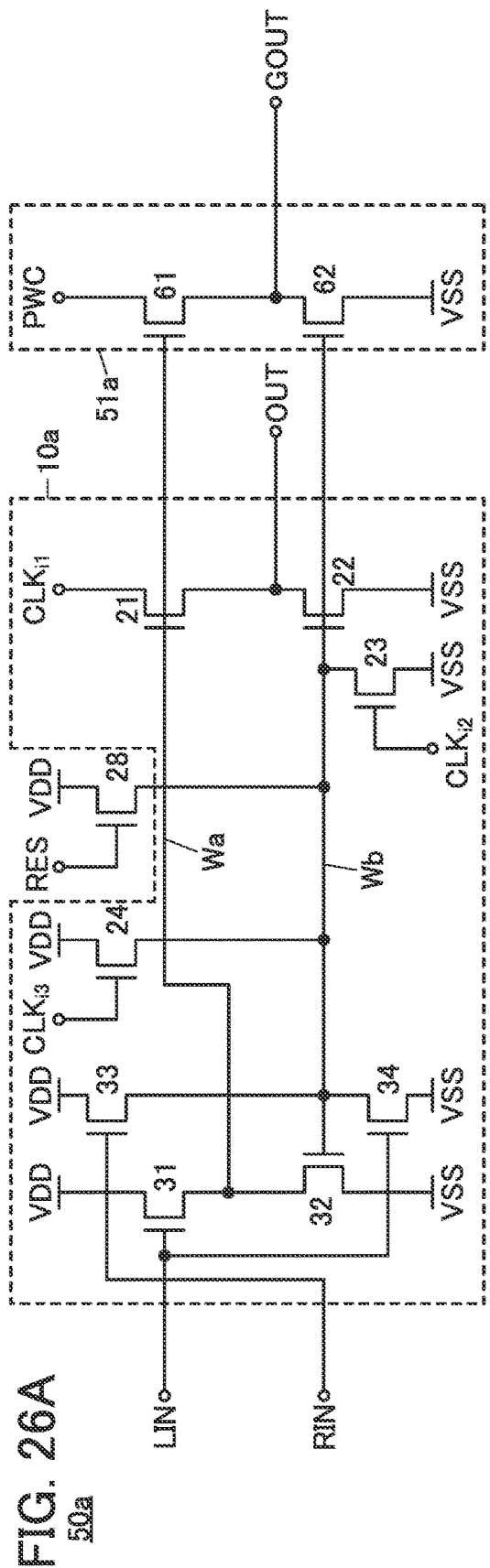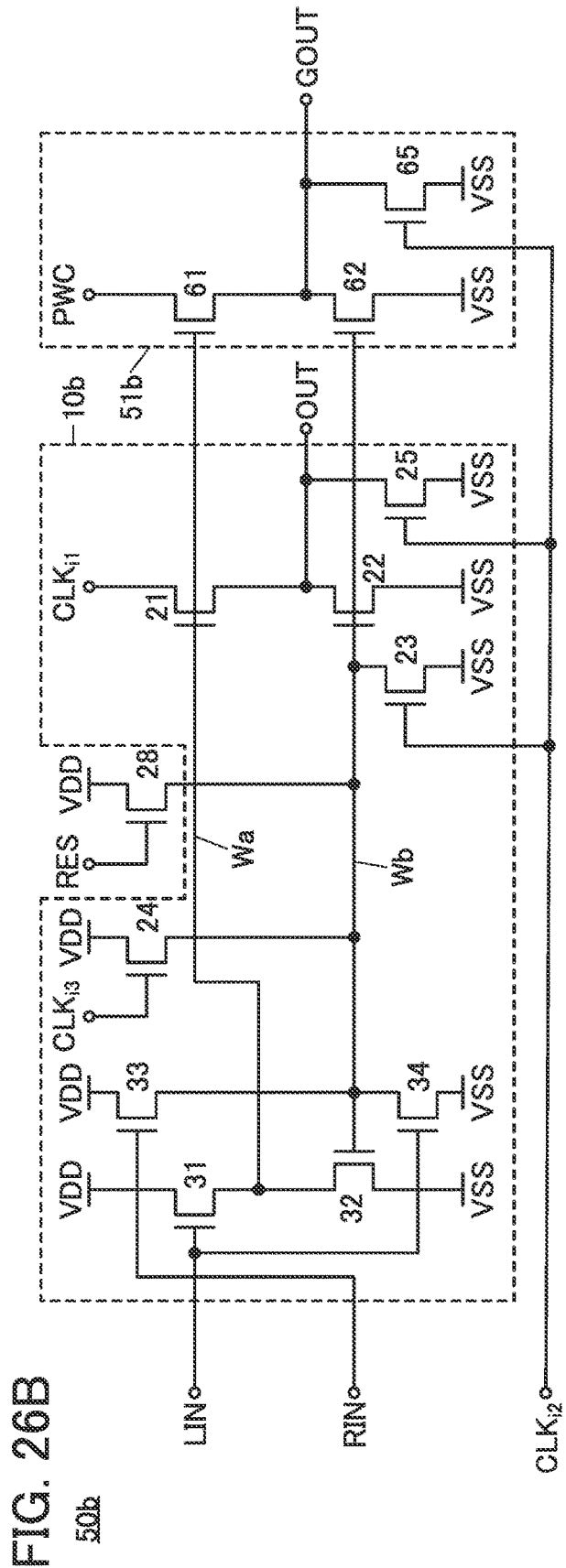

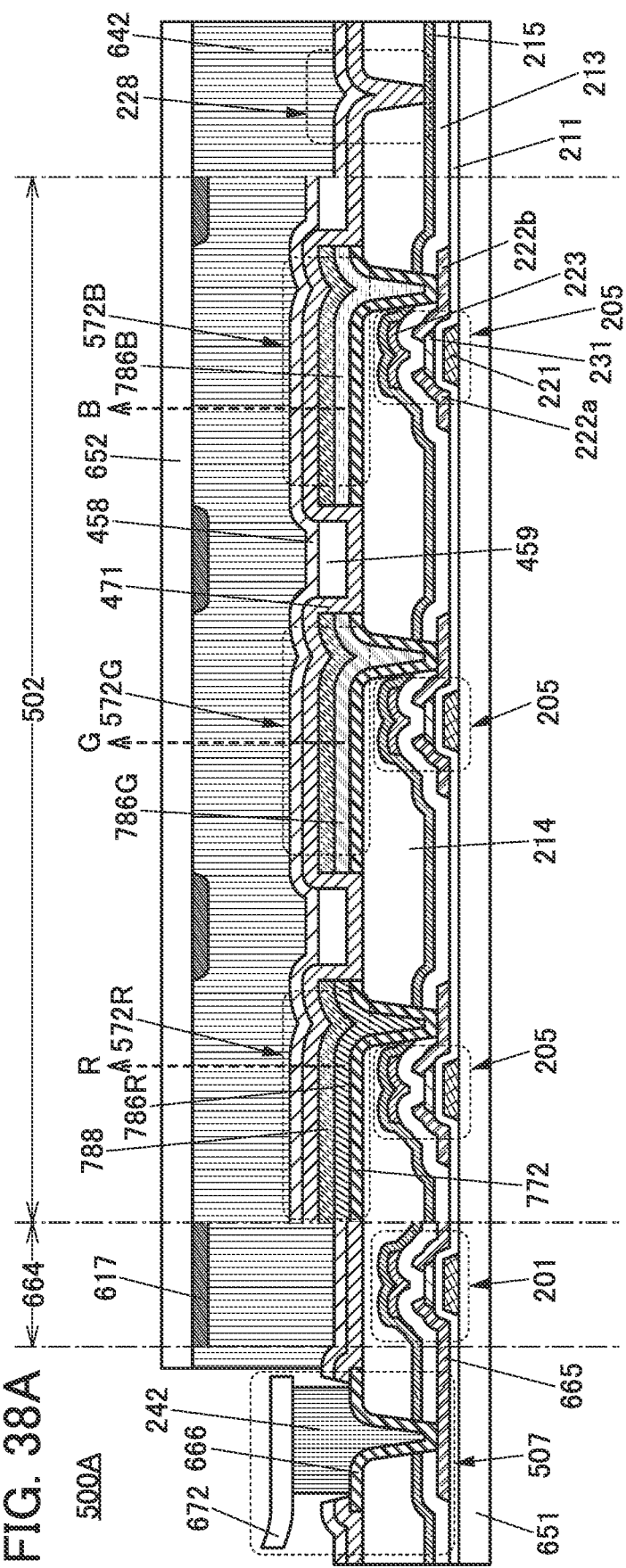
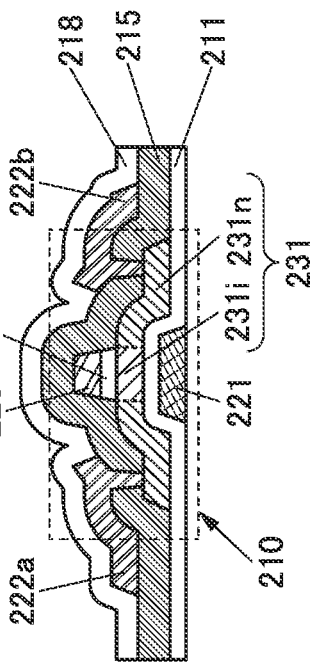
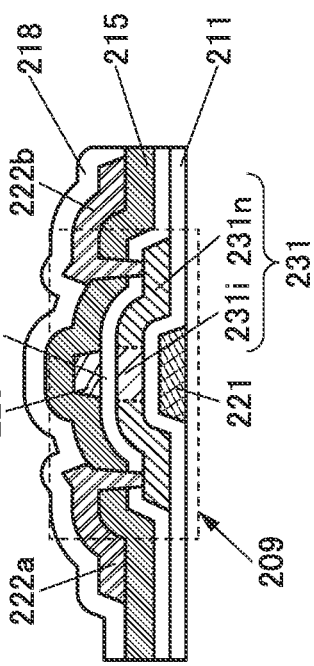
FIG. 38A
FIG. 38B
FIG. 38C

FIG. 48A
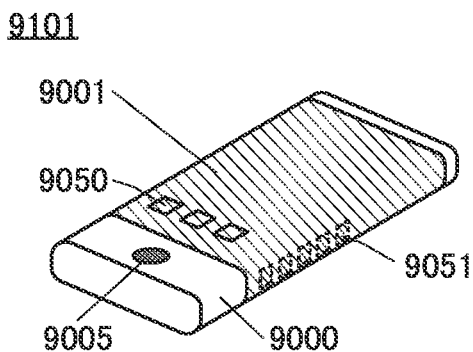
FIG. 48B
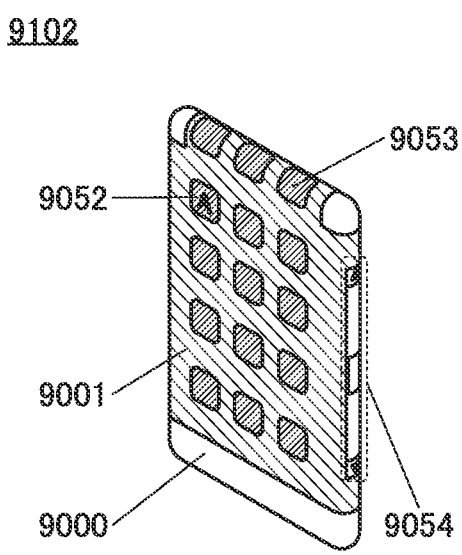
FIG. 48C
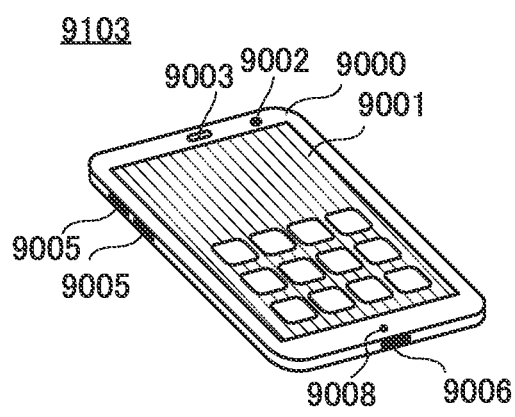
FIG. 48D
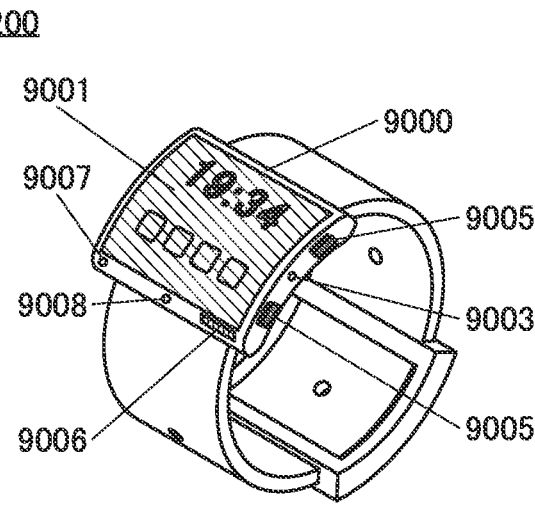
FIG. 48E
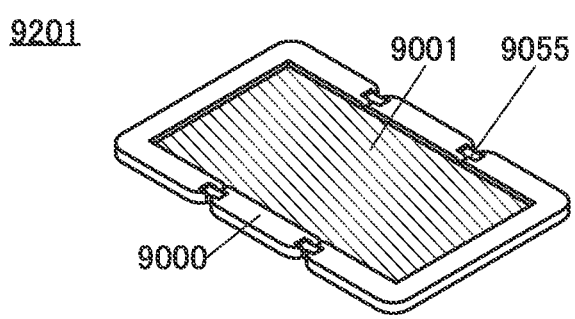
FIG. 48F
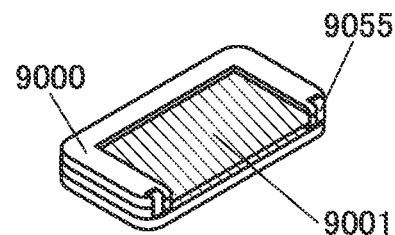
FIG. 48G

SEMICONDUCTOR DEVICE, DISPLAY APPARATUS, AND ELECTRONIC DEVICE

TECHNICAL FIELD

One embodiment of the present invention relates to a semiconductor device. One embodiment of the present invention relates to a display apparatus. One embodiment of the present invention relates to an electronic device.

Note that one embodiment of the present invention is not limited to the above technical field. Examples of the technical field of one embodiment of the present invention disclosed in this specification and the like can include a semiconductor device, a display apparatus, a light-emitting apparatus, a power storage device, a memory device, an electronic device, a lighting device, an input device, an input/output device, a driving method thereof, and a fabrication method thereof. A semiconductor device refers to any device that can function by utilizing semiconductor characteristics.

BACKGROUND ART

In recent years, display apparatuses have been expected to be applied to a variety of uses. Examples of uses for a large display apparatus include a television device for home use (also referred to as a TV or a television receiver), digital signage, and a PID (Public Information Display). In addition, a smartphone, a tablet terminal, and the like including a touch panel are being developed as portable information terminals.

Furthermore, display apparatuses have been required to have higher definition. For example, devices for virtual reality (VR), augmented reality (AR), substitutional reality (SR), or mixed reality (MR) are given as devices requiring high-definition display apparatuses and have been actively developed.

Light-emitting apparatuses including light-emitting elements have been developed as display apparatuses, for example. Light-emitting elements (also referred to as light-emitting devices, EL elements, or EL devices) utilizing electroluminescence (hereinafter referred to as EL) have features such as ease of reduction in thickness and weight, high-speed response to input signals, and driving with a constant DC voltage power source, and have been used in display apparatuses.

Patent Document 1 discloses a display apparatus using an organic EL element (also referred to as an organic EL device) for VR.

REFERENCE

Patent Document

[Patent Document 1] PCT International Publication No. 2018/087625

SUMMARY OF THE INVENTION

Problems to be Solved by the Invention

A variety of semiconductor devices are provided in a display apparatus. For example, a semiconductor device is provided in a driver circuit such as a scan line driver circuit for driving a pixel circuit. Here, since a high-definition display apparatus has high pixel density, the number of pixel circuits electrically connected to a scan line or the like per unit length becomes large. Accordingly, gate capacitance or the like of a transistor that is provided in a pixel circuit and is electrically connected to a scan line or the like results in an increase in wiring capacitance of the scan line or the like. Furthermore, when a large number of pixel circuits are provided in a display apparatus, the number of scan lines or the like increases. Thus, it is necessary to shorten one horizontal period, which is a period from supply of a signal to a scan line to supply of a signal to a scan line in the subsequent row, in order to ensure the frame frequency, for example. Such an increase in wiring capacitance of a scan line or the like and a shortened horizontal period make it necessary to increase current flowing in the scan line or the like in the case of charging the scan line or the like.

To increase current flowing in a scan line or the like, the potential of a signal output from a scan line driver circuit or the like to the scan line or the like needs to be increased. In that case, high voltage stress is applied to a transistor that is provided in the scan line driver circuit or the like and is electrically connected to the scan line or the like. Thus, in a high-definition display apparatus and a display apparatus including a large number of pixels, the reliability of a semiconductor device provided in the display apparatus is decreased in some cases.

An object of one embodiment of the present invention is to provide a highly reliable semiconductor device and a highly reliable display apparatus. An object of one embodiment of the present invention is to provide a high-definition display apparatus. An object of one embodiment of the present invention is to provide a display apparatus including a large number of pixels. An object of one embodiment of the present invention is to provide a novel semiconductor device and a novel display apparatus. An object of one embodiment of the present invention is to provide a driving method of the above semiconductor device or the like. An object of one embodiment of the present invention is to provide a fabrication method of the above display apparatus or the like.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is a semiconductor device including a first circuit and a second circuit; the first circuit includes a first wiring, a second wiring, a first transistor, a second transistor, a third transistor, and a fourth transistor; a gate of the first transistor is electrically connected to the second circuit through the first wiring; a gate of the second transistor, one of a source and a drain of the third transistor, and one of a source and a drain of the fourth transistor are electrically connected to the second circuit through the second wiring; one of a source and a drain of the first transistor is electrically connected to one of a source and a drain of the second transistor; a first clock signal is input to the other of the source and the drain of the first transistor; a first potential is supplied to the other of the source and the drain of the second transistor; a second clock signal is input to a gate of the third transistor; a second potential is supplied to the other of the source and the drain of the third transistor; a third clock signal is input to a gate of the fourth transistor; a third potential is supplied to the other of the source and the drain of the fourth transistor; a difference between the third potential and the first potential is larger than a difference between the second potential and the first potential; the second circuit has a function of supplying a first control potential to the first wiring in accordance with a first signal and a second signal input to the second circuit; and the second circuit has a function of supplying a second control potential to the second wiring in accordance with the first signal and the second signal.

In the above embodiment, the second circuit may have a function of making the second control potential an inversion potential of the first control potential when a potential of the second signal is an inversion potential of a potential of the first signal.

In the above embodiment, the second circuit may include a fifth transistor, a sixth transistor, a seventh transistor, and an eighth transistor; one of a source and a drain of the fifth transistor and one of a source and a drain of the sixth transistor may be electrically connected to the first wiring; a gate of the sixth transistor, one of a source and a drain of the seventh transistor, and one of a source and a drain of the eighth transistor may be electrically connected to the second wiring; the first signal may be input to a gate of the fifth transistor and a gate of the eighth transistor; and the second signal may be input to a gate of the seventh transistor.

In the above embodiment, a fourth potential may be supplied to the other of the source and the drain of the fifth transistor; a fifth potential may be supplied to the other of the source and the drain of the sixth transistor; a sixth potential may be supplied to the other of the source and the drain of the seventh transistor; a seventh potential may be supplied to the other of the source and the drain of the eighth transistor; the fifth potential may be an inversion potential of the fourth potential; and the seventh potential may be an inversion potential of the sixth potential.

In the above embodiment, the first circuit may include a ninth transistor; the ninth transistor may be electrically connected to one of the source and the drain of the first transistor; the second clock signal may be input to a gate of the ninth transistor; an eighth potential may be supplied to the other of a source and a drain of the ninth transistor; and a difference between the second potential and the eighth potential may be smaller than a difference between the third potential and the eighth potential.

Another embodiment of the present invention is a semiconductor device including a first circuit and a second circuit; the first circuit includes a first wiring, a second wiring, a first transistor, a second transistor, a third transistor, a fourth transistor, a fifth transistor, and a capacitor; one of a source and a drain of the first transistor is electrically connected to one of a source and a drain of the second transistor; one of the source and the drain of the second transistor is electrically connected to one electrode of the capacitor; one of a source and a drain of the fifth transistor is electrically connected to the second circuit through the first wiring; the other of the source and the drain of the fifth transistor is electrically connected to a gate of the first transistor; the gate of the first transistor is electrically connected to the other electrode of the capacitor; a gate of the second transistor, one of a source and a drain of the third transistor, and one of a source and a drain of the fourth transistor are electrically connected to the second circuit through the second wiring; a first clock signal is input to the other of the source and the drain of the first transistor; a first potential is supplied to the other of the source and the drain of the second transistor; a second clock signal is input to a gate of the third transistor; a second potential is supplied to the other of the source and the drain of the third transistor; a third clock signal is input to a gate of the fourth transistor; a third potential is supplied to the other of the source and the drain of the fourth transistor; a difference between the third potential and the first potential is larger than a difference between the second potential and the first potential; the second circuit has a function of supplying a first control potential to the first wiring in accordance with a first signal and a second signal input to the second circuit; and the second circuit has a function of supplying a second control potential to the second wiring in accordance with the first signal and the second signal.

In the above embodiment, a fourth clock signal may be input to a gate of the fifth transistor.

In the above embodiment, the second circuit may have a function of making the second control potential an inversion potential of the first control potential when a potential of the second signal is an inversion potential of a potential of the first signal.

In the above embodiment, the second circuit may include a sixth transistor, a seventh transistor, an eighth transistor, and a ninth transistor; one of a source and a drain of the sixth transistor and one of a source and a drain of the seventh transistor may be electrically connected to the first wiring; a gate of the seventh transistor, one of a source and a drain of the eighth transistor, and one of a source and a drain of the ninth transistor may be electrically connected to the second wiring; the first signal may be input to a gate of the sixth transistor and a gate of the ninth transistor; and the second signal may be input to a gate of the eighth transistor.

In the above embodiment, a fourth potential may be supplied to the other of the source and the drain of the sixth transistor; a fifth potential may be supplied to the other of the source and the drain of the seventh transistor; a sixth potential may be supplied to the other of the source and the drain of the eighth transistor; a seventh potential may be supplied to the other of the source and the drain of the ninth transistor; the fifth potential may be an inversion potential of the fourth potential; and the seventh potential may be an inversion potential of the sixth potential.

In the above embodiment, the first circuit may include a tenth transistor; the tenth transistor may be electrically connected to one of the source and the drain of the first transistor; the second clock signal may be input to a gate of the tenth transistor; an eighth potential may be supplied to the other of a source and a drain of the tenth transistor; and a difference between the second potential and the eighth potential may be smaller than a difference between the third potential and the eighth potential.

A display apparatus including the semiconductor device of one embodiment of the present invention, a first light-emitting element, a second light-emitting element, and an insulating layer, in which the first light-emitting element includes a first lower electrode, a first light-emitting layer over the first lower electrode, and a first upper electrode over the first light-emitting layer, the second light-emitting element includes a second lower electrode, a second light-emitting layer over the second lower electrode, and a second upper electrode over the second light-emitting layer, and the insulating layer is provided to cover an end portion of the first upper electrode and an end portion of the second upper electrode is also one embodiment of the present invention.

An electronic device including the display apparatus of one embodiment of the present invention and at least one of a battery, a camera, a speaker, and a microphone is also one embodiment of the present invention.

Effect of the Invention

According to one embodiment of the present invention, a highly reliable semiconductor device and a highly reliable display apparatus can be provided. According to one embodiment of the present invention, a high-definition display apparatus can be provided. According to one embodiment of the present invention, a display apparatus including a large number of pixels can be provided. According to one embodiment of the present invention, a novel semiconductor device and a novel display apparatus can be provided. According to one embodiment of the present invention, a driving method of the above semiconductor device or the like can be provided. According to one embodiment of the present invention, a fabrication method of the above display apparatus or the like can be provided.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 26A and FIG. 26B are diagrams illustrating configuration examples of sequential circuits.

FIG. 38A is a diagram illustrating a structure example of a display apparatus. FIG. 38B and FIG. 38C are diagrams illustrating structure examples of transistors.

FIG. 48A to FIG. 48G are diagrams illustrating examples of electronic devices.

MODE FOR CARRYING OUT THE INVENTION

Figure 1A:
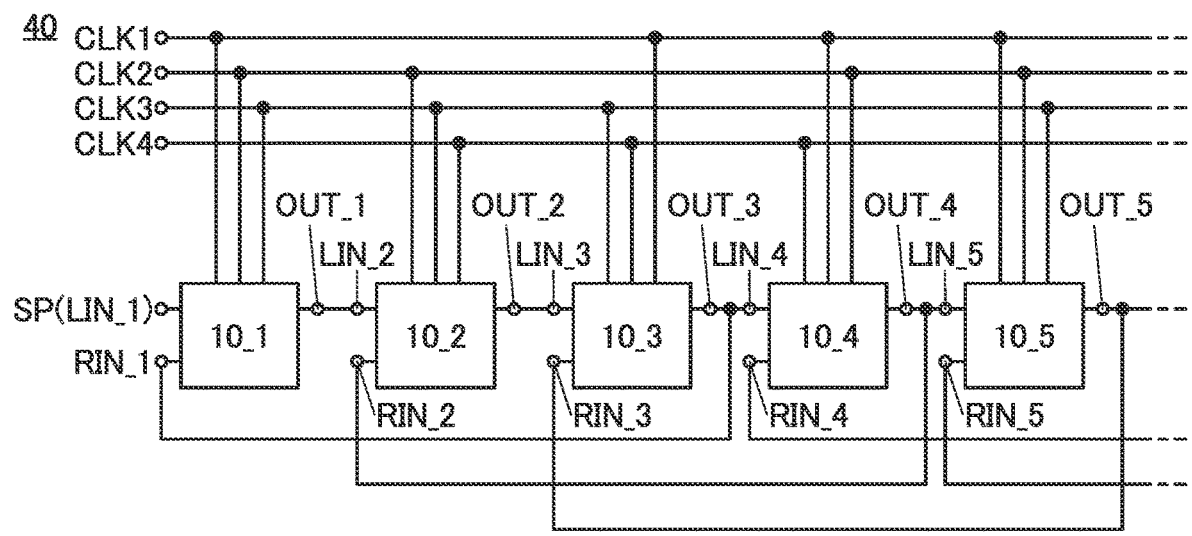
FIG. 1A is a diagram illustrating a configuration example of a shift register circuit.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first," "second," and the like are used in order to avoid confusion among components and do not limit the number.

A transistor is a kind of semiconductor element and can amplify current or voltage, for example. Furthermore, a transistor can perform switching operation for controlling conduction or non-conduction, for example. An IGFET (Insulated Gate Field Effect Transistor) and a thin film transistor (TFT) are in the category of a transistor in this specification and the like.

Functions of a "source" and a "drain" are sometimes replaced with each other when a transistor of opposite polarity is used or when the direction of current is changed in circuit operation, for example. Therefore, the terms "source" and "drain" can be switched in this specification and the like.

In this specification and the like, the expression "electrically connected" includes the case where components are connected through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

In this specification and the like, a display panel that is one embodiment of a display apparatus has a function of displaying (outputting), for example, an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, configuration examples and the like of a semiconductor device and a display apparatus of one embodiment of the present invention will be described.

The semiconductor device of one embodiment of the present invention relates to a shift register circuit including a plurality of stages of sequential circuits. An output signal of a sequential circuit is input to a sequential circuit in the subsequent stage. Before a sequential circuit outputs a signal and after the sequential circuit outputs the signal, the potential of a gate of a transistor included in the sequential circuit is changed in accordance with a clock signal so as to avoid voltage stress application between the gate and a source of the transistor for a long time. Accordingly, a change in electrical characteristics of the transistor, for example, a change in threshold voltage, can be inhibited. Thus, the shift register circuit can be a highly reliable semiconductor device.

The semiconductor device of one embodiment of the present invention can be used for a display apparatus. Specifically, the semiconductor device of one embodiment of the present invention can be used for a scan line driver circuit included in a display apparatus, for example. As described above, the semiconductor device of one embodiment of the present invention has high reliability. Thus, the use of the semiconductor device of one embodiment of the present invention for a display apparatus can increase the reliability of the display apparatus.

In this specification and the like, a display apparatus in which the semiconductor device of one embodiment of the present invention is used is referred to as a display apparatus of one embodiment of the present invention.

The display apparatus of one embodiment of the present invention includes a light-emitting element such as an organic EL element and can display an image by controlling the luminance of light emitted from the light-emitting element. The light-emitting element includes at least a light-emitting layer, and the light-emitting layer can be separated between light-emitting elements. The light-emitting layer can be separated by a photolithography method, for example. In other words, the light-emitting layer can be separated without using a shadow mask such as a metal mask. Accordingly, the display apparatus of one embodiment of the present invention can be a high-definition display apparatus.

Since a high-definition display apparatus has high pixel density as described above, the number of pixel circuits electrically connected to a scan line per unit length, for example, becomes large. Accordingly, gate capacitance of a transistor that is provided in a pixel circuit and is electrically connected to a scan line results in an increase in wiring capacitance of the scan line, for example. Furthermore, when a large number of pixel circuits are provided in a display apparatus, the number of scan lines, for example, increases. Thus, it is necessary to shorten one horizontal period, which is a period from supply of a signal to a scan line to supply of a signal to a scan line in the subsequent row, in order to ensure the frame frequency, for example. Such an increase in wiring capacitance of a scan line or the like and a shortened horizontal period make it necessary to increase current flowing in the scan line or the like in the case of charging the scan line or the like.

To increase current flowing in a scan line, for example, the potential of a signal output from a scan line driver circuit, which is the semiconductor device of one embodiment of the present invention, to the scan line needs to be increased. In that case, high voltage stress is applied to a transistor that is provided in the scan line driver circuit and is electrically connected to the scan line, for example. Thus, in a high-definition display apparatus and a display apparatus including a large number of pixels, the reliability of a semiconductor device provided in the display apparatus is decreased in some cases.

The semiconductor device that can be used for the display apparatus of one embodiment of the present invention can shorten a period during which voltage stress is applied to a transistor electrically connected to a scan line, for example. Thus, a change in electrical characteristics of the transistor, for example, a change in threshold voltage, can be inhibited. Hence, the use of the semiconductor device of one embodiment of the present invention can increase the reliability of the display apparatus. Accordingly, the display apparatus of one embodiment of the present invention can be a high-definition display apparatus with a large number of pixels and high reliability.

Configuration Example_1 of Shift Register Circuit

FIG. 1A is a block diagram illustrating a configuration example of a shift register circuit 40 which is the semiconductor device of one embodiment of the present invention. The shift register circuit 40 includes a plurality of sequential circuits 10. FIG. 1A illustrates a sequential circuit 10_1 to a sequential circuit 10_5.

In this specification and the like, the sequential circuits 10 can be the semiconductor devices of one embodiment of the present invention. Furthermore, other circuits described in this specification and the like can be the semiconductor devices of one embodiment of the present invention. Moreover, components of circuits described in this specification and the like, such as a transistor, can be the semiconductor devices of one embodiment of the present invention.

A signal LIN and a signal RIN are input to each of the sequential circuits 10. A signal OUT is output from each of the sequential circuits 10. A start pulse signal SP is input as the signal LIN to the sequential circuit 10_1. The signal OUT output from the sequential circuit 10 in the previous stage is input as the signal LIN to each of the sequential circuit 10_2 and the sequential circuits 10 in the subsequent stages. Furthermore, in the example illustrated in FIG. 1A, the signal OUT output from the sequential circuit 10 in the second subsequent stage is input as the signal RIN to each of the sequential circuits 10.

In this specification and the like, the sequential circuit 10_1 to which the start pulse signal SP is input is regarded as being in the first stage, and the sequential circuit 10 in the n-th stage (n is an integer greater than or equal to one) is referred to as a sequential circuit 10_n. A signal input to the sequential circuit 10_n and a signal output from the sequential circuit 10 are expressed using reference numerals to which _n is added. The same applies to the other sequential circuits.

In the example illustrated in FIG. 1A, the start pulse signal SP (a signal LIN_1) and a signal RIN_1 are input to and a signal OUT_1 is output from the sequential circuit 10_1. The signal OUT_1 is input as a signal LIN_2 to the sequential circuit 10_2. A signal RIN_2 is input to and a signal OUT_2 is output from the sequential circuit 10_2. The signal OUT_2 is input as a signal LIN_3 to the sequential circuit 10_3. A signal RIN_3 is input to and a signal OUT_3 is output from the sequential circuit 10_3. The signal OUT_3 is input as the signal RIN_1 to the sequential circuit 10_1 and is input as a signal LIN_4 to the sequential circuit 10_4. The signal RIN_4 is input to and a signal OUT_4 is output from the sequential circuit 10_4. The signal OUT_4 is input as the signal RIN_2 to the sequential circuit 10_2 and is input as a signal LIN_5 to the sequential circuit 10_5. A signal RIN_5 is input to and a signal OUT_5 is output from the sequential circuit 10_5. The signal OUT_5 is input as the signal RIN_3 to the sequential circuit 10_3.

In addition to the above signals, a clock signal CLK1, a clock signal CLK2, a clock signal CLK3, and a clock signal CLK4 are input to the sequential circuits 10. For example, three of the clock signal CLK1, the clock signal CLK2, the clock signal CLK3, and the clock signal CLK4 are input to one sequential circuit 10.

For example, the clock signal CLK1, the clock signal CLK2, and the clock signal CLK3 are input to the sequential circuit 10_1; the clock signal CLK2, the clock signal CLK3, and the clock signal CLK4 are input to the sequential circuit 10_2; the clock signal CLK3, the clock signal CLK4, and the clock signal CLK1 are input to the sequential circuit 10_3; the clock signal CLK4, the clock signal CLK1, and the clock signal CLK2 are input to the sequential circuit 10_4; and the clock signal CLK1, the clock signal CLK2, and the clock signal CLK3 are input to the sequential circuit 10_5. In the example illustrated in FIG. 1A, every four stages have the same combination of clock signals input to the sequential circuit 10. In other words, in the case where the clock signal CLK1, the clock signal CLK2, and the clock signal CLK3 are input to the sequential circuit 10_n, for example, the clock signal CLK2, the clock signal CLK3, and the clock signal CLK4 are input to a sequential circuit 10_n+1; the clock signal CLK3, the clock signal CLK4, and the clock signal CLK1 are input to a sequential circuit 10_n+2; and the clock signal CLK4, the clock signal CLK1, and the clock signal CLK2 are input to a sequential circuit 10_n+3. The combination of clock signals input to the sequential circuit 10_n and the combination of clock signals input to a sequential circuit 10_n+4 are the same.

In this specification and the like, a clock signal refers to a signal in which a high potential and a low potential are alternated and an interval between a potential rise and a next potential rise or an interval between a potential fall and a next potential fall is constant.

In this specification and the like, a high potential is referred to as a potential VDD and a low potential is referred to as a potential VSS in some cases.

Note that the configuration of the shift register circuit 40 is not limited to the configuration illustrated in FIG. 1A. Although FIG. 1A illustrates the configuration in which three kinds of clock signals among four kinds of clock signals are input to each of the sequential circuits 10, a configuration in which three or more kinds of clock signals among five or more kinds of clock signals are input may be employed, for example. Although FIG. 1A illustrates the configuration in which the signal RIN input to the sequential circuit 10 is the signal OUT output from the sequential circuit 10 in the second subsequent stage, the signal RIN may be the signal OUT output from the sequential circuit 10 in the third or more subsequent stage.

Driving Method Example_1 of Shift Register Circuit

Figure 1B:
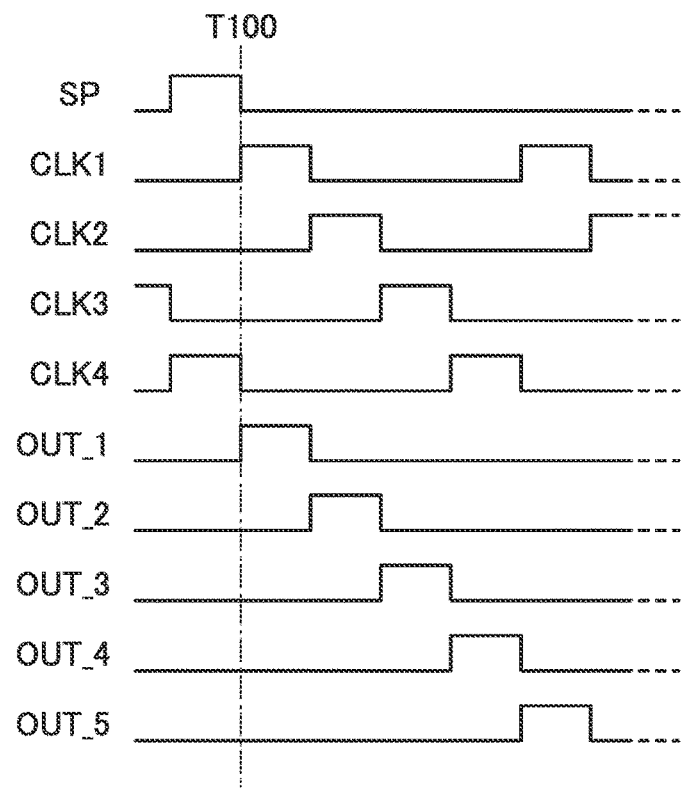
FIG. 1B is a timing chart showing an example of a driving method of the shift register circuit.

FIG. 1B is a timing chart showing an example of a driving method of the shift register circuit 40. FIG. 1B shows changes in potentials of the start pulse signal SP, the clock signal CLK1 to the clock signal CLK4, and the signal OUT_1 to the signal OUT_5 from the top. Note that in the timing chart shown in FIG. 1B, the influence of the threshold voltage of a transistor, the on-state resistance of the transistor, the gate capacitance of the transistor, wiring resistance, parasitic capacitance, and the like is not considered. The same applies to other timing charts unless otherwise specified.

As shown in FIG. 1B, the clock signal CLK1 to the clock signal CLK4 can be signals each shifted by one-quarter cycle period. Furthermore, the clock signal CLK1 to the clock signal CLK4 can be signals whose periods during which the signals are at high potentials do not overlap with one another. Note that parts of the periods during which the clock signal CLK1 to the clock signal CLK4 are at high potentials may overlap with one another.

Before Time T100 shown in FIG. 1B, the start pulse signal SP is at a high potential and the clock signal CLK1 is at a low potential. At this time, the potentials of the signal OUT_1 to the signal OUT_5 are low potentials.

At Time T100, the clock signal CLK1 changes from a low potential to a high potential, that is, the clock signal CLK1 rises, so that the signal OUT_1 at a high potential is output from the sequential circuit 10_1. Next, in response to the rises of the clock signal CLK2 to the clock signal CLK4, the signal OUT_2 to the signal OUT_4 at high potentials are sequentially output from the sequential circuit 10_2 to the sequential circuit 10_4. After that, in response to the rises of the clock signal CLK1 to the clock signal CLK4, the signal OUT_5 and subsequent signals OUT at high potentials are sequentially output from the sequential circuit 10_5 and the sequential circuits 10 in the subsequent stages.

Configuration Example_1 of Sequential Circuit

Figure 2:
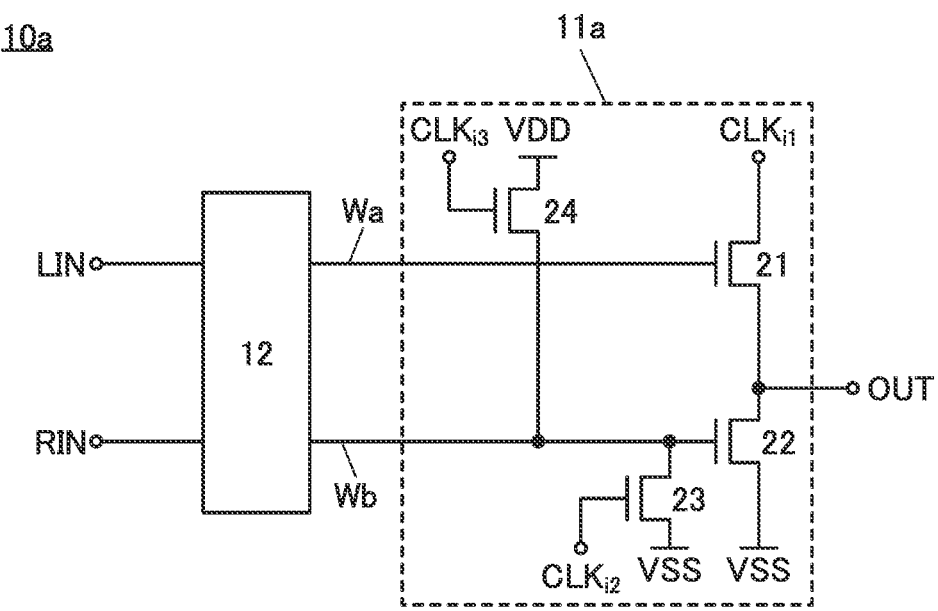
FIG. 2 is a diagram illustrating a configuration example of a sequential circuit.

FIG. 2 is a circuit diagram illustrating a configuration example of a sequential circuit 10a applicable to the sequential circuits 10. The sequential circuit 10a includes a circuit 11a and a circuit 12. The circuit 11a and the circuit 12 are electrically connected to each other through a wiring Wa. The circuit 11a and the circuit 12 are electrically connected to each other through a wiring Wb. The circuit 12 can be regarded as a control circuit.

In this specification and the like, a high potential and a low potential are in an inverted relationship. That is, a high potential is an inversion potential of a low potential and a low potential is an inversion potential of a high potential.

The signal LIN and the signal RIN are input to the circuit 12. The circuit 12 has a function of supplying potentials based on the potential of the signal LIN and the potential of the signal RIN as control potentials to the wiring Wa and the wiring Wb. For example, in the case where the potential of the signal LIN is a high potential and the potential of the signal RIN is a low potential, the circuit 12 supplies a high potential and a low potential to the wiring Wa and the wiring Wb, respectively, as the control potentials. In the case where the potential of the signal LIN is a low potential and the potential of the signal RIN is a high potential, the circuit 12 supplies a low potential and a high potential to the wiring Wa and the wiring Wb, respectively, as the control potentials. This means that when the potential supplied from the circuit 12 to the wiring Wa is referred to as a first control potential, the potential supplied from the circuit 12 to the wiring Wb is referred to as a second control potential, and the potential of the signal RIN is an inversion potential of the potential of the signal LIN, for example, the second control potential can be an inversion potential of the first control potential.

The circuit 11a includes a transistor 21, a transistor 22, a transistor 23, and a transistor 24. As a semiconductor where a channel is formed in each of the transistor 21 to the transistor 24, a metal oxide exhibiting semiconductor characteristics (hereinafter, also referred to as an oxide semiconductor) can be suitably used. Note that the semiconductor is not limited to the oxide semiconductor; a semiconductor such as silicon (single crystal silicon, polycrystalline silicon, or amorphous silicon) or germanium may be used, or a compound semiconductor may be used. The same applies to transistors included in circuits other than the circuit 11a.

In the following description, unless otherwise specified, all the transistors included in a circuit and the like according to one embodiment of the present invention are n-channel transistor; however, the following description can also apply to the case where some or all of the transistors are p-channel transistors when a high potential and a low potential are interchanged as necessary, for example.

A gate of the transistor 21 is electrically connected to the wiring Wa. A gate of the transistor 22, one of a source and a drain of the transistor 23, and one of a source and a drain of the transistor 24 are electrically connected to the wiring Wb. One of a source and a drain of the transistor 21 is electrically connected to one of a source and a drain of the transistor 22, and the signal OUT is output.

A clock signal $CLK_{i1}$ is input to the other of the source and the drain of the transistor 21. A clock signal $CLK_{i2}$ is input to a gate of the transistor 23. A clock signal $CLK_{i3}$ is input to a gate of the transistor 24.

Here, each of the clock signal $CLK_{i1}$ to the clock signal $CLK_{i3}$ is any of the clock signal CLK1 to the clock signal CLK4 illustrated in FIG. 1A and the like. For example, in the sequential circuit 101 and the sequential circuit 105, the clock signal $CLK_{i1}$ is the clock signal CLK1, the clock signal $CLK_{i2}$ is the clock signal CLK2, and the clock signal $CLK_{i3}$ is the clock signal CLK3. In the sequential circuit 102, the clock signal $CLK_{i1}$ is the clock signal CLK2, the clock signal $CLK_{i2}$ is the clock signal CLK3, and the clock signal $CLK_{i3}$ is the clock signal CLK4. In the sequential circuit 103, the clock signal $CLK_{i1}$ is the clock signal CLK3, the clock signal $CLK_{i2}$ is the clock signal CLK4, and the clock signal $CLK_{i3}$ is the clock signal CLK1. In the sequential circuit 104, the clock signal $CLK_{i1}$ is the clock signal CLK4, the clock signal $CLK_{i2}$ is the clock signal CLK1, and the clock signal $CLK_{i3}$ is the clock signal CLK2.

Low potentials are supplied to the other of the source and the drain of the transistor 22 and the other of the source and the drain of the transistor 23. A high potential is supplied to the other of the source and the drain of the transistor 24. Here, the potential supplied to the other of the source and the drain of the transistor 22 is referred to as a first potential, the potential supplied to the other of the source and the drain of the transistor 23 is referred to as a second potential, and the potential supplied to the other of the source and the drain of the transistor 24 is referred to as a third potential. In this case, the difference between the third potential and the first potential and the difference between the third potential and the second potential are larger than the difference between the second potential and the first potential. The third potential can be an inversion potential of the first potential or an inversion potential of the second potential.

A small difference between potentials in this specification and the like means that, unless otherwise specified, the "absolute value" of the difference between the potentials is small. Note that even when not specified, in some cases, a small potential difference means that the potential difference considering the signs is small, that is, a potential difference is large in the negative direction.

Figure 3A:
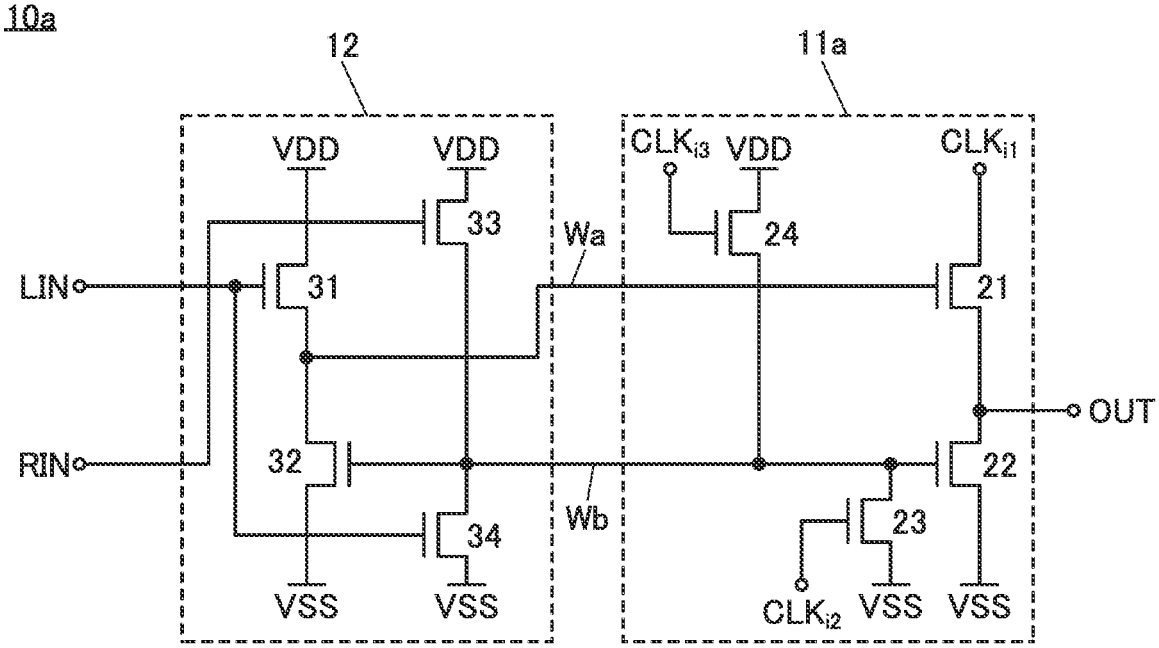
FIG. 3A is a diagram illustrating a configuration example of a sequential circuit.

FIG. 3A is a circuit diagram illustrating a more detailed configuration example of the sequential circuit 10a illustrated as an example in FIG. 2. The circuit 12 included in the sequential circuit 10 includes a transistor 31, a transistor 32, a transistor 33, and a transistor 34.

One of a source and a drain of the transistor 31 and one of a source and a drain of the transistor 32 are electrically connected to the wiring Wa. A gate of the transistor 32, one of a source and a drain of the transistor 33, and one of a source and a drain of the transistor 34 are electrically connected to the wiring Wb. The signal LIN is input to a gate of the transistor 31 and a gate of the transistor 34. The signal RIN is input to a gate of the transistor 33.

High potentials are supplied to the other of the source and the drain of the transistor 31 and the other of the source and the drain of the transistor 33. Low potentials are supplied to the other of the source and the drain of the transistor 32 and the other of the source and the drain of the transistor 34. Thus, when the potential supplied to the other of the source and the drain of the transistor 31, the potential supplied to the other of the source and the drain of the transistor 32, the potential supplied to the other of the source and the drain of the transistor 33, and the potential supplied to the other of the source and the drain of the transistor 34 are referred to as a fourth potential, a fifth potential, a sixth potential, and a seventh potential, respectively, the fifth potential can be an inversion potential of the fourth potential and the seventh potential can be an inversion potential of the sixth potential.

Driving Method Example_1 of Sequential Circuit

Figure 3B:
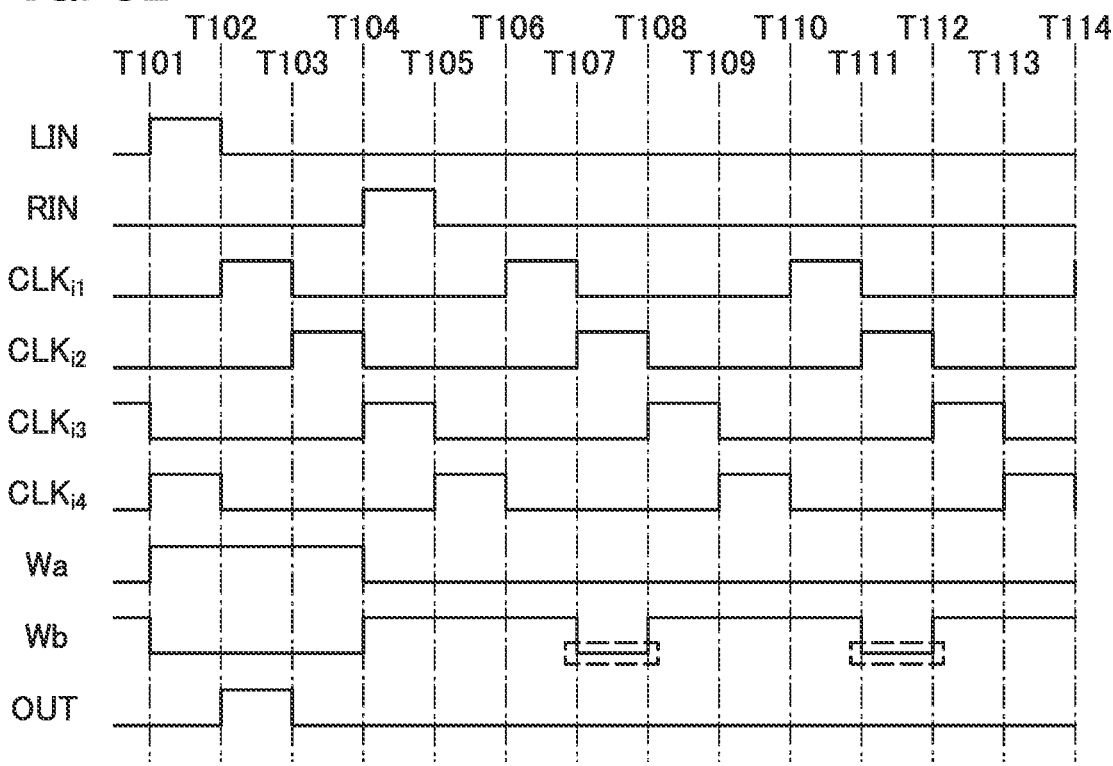
FIG. 3B is a timing chart showing an example of a driving method of the sequential circuit.

An example of a driving method of the sequential circuit 10a illustrated in FIG. 3A is described below with reference to FIG. 3B and FIG. 4A to FIG. 7B. FIG. 3B is a timing chart showing the example of the driving method of the sequential circuit 10a illustrated in FIG. 3A. FIG. 3B shows changes in potentials of the signal LIN, the signal RIN, the clock signal $CLK_{i1}$ to a clock signal $CLK_{i4}$, the wiring Wa, the wiring Wb, and the signal OUT from the top. FIG. 4A to FIG. 7B are circuit diagrams illustrating the example of the driving method of the sequential circuit 10a.

Here, the clock signal $CLK_{i4}$ is, for example, a signal that is not any of the clock signal $CLK_{i1}$ to the clock signal $CLK_{i3}$ among the clock signal CLK1 to the clock signal CLK4 illustrated in FIG. 1A. For example, in the sequential circuit 10_1 and the sequential circuit 105, the clock signal $CLK_{i4}$ is the clock signal CLK4. In the sequential circuit 102, the clock signal $CLK_{i4}$ is the clock signal CLK1. In the sequential circuit 103, the clock signal $CLK_{i4}$ is the clock signal CLK2. In the sequential circuit 104, the clock signal $CLK_{i4}$ is the clock signal CLK3.

In FIG. 4A to FIG. 7B, a transistor in an off state is marked with x. Furthermore, a high potential is denoted by "H" and a low potential is denoted by "L". Similar representations are used in other circuit diagrams illustrating driving methods of circuits.

Before Time T101, the potential of the signal LIN, the potential of the signal RIN, the potential of the clock signal $CLK_{i1}$, the potential of the clock signal $CLK_{i2}$, the potential of the clock signal $CLK_{i4}$, the potential of the wiring Wa, and the potential of the signal OUT are low potentials. The potential of the clock signal $CLK_{i3}$ and the potential of the wiring Wb are high potentials.

Figure 4A:
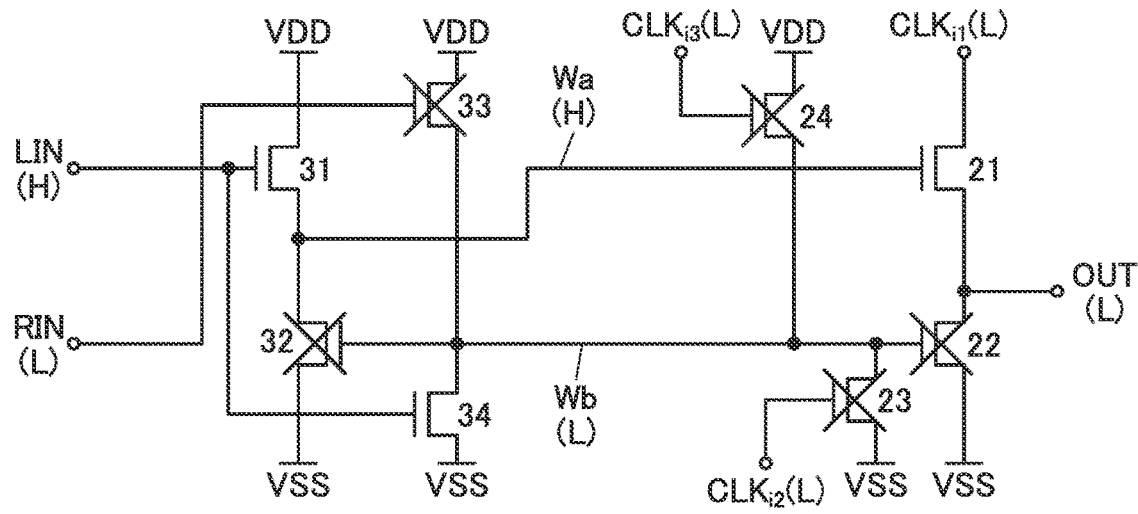
FIG. 4A and FIG. 4B are diagrams illustrating an example of a driving method of a sequential circuit.

FIG. 4A is a circuit diagram illustrating the state of the sequential circuit 10a from Time T101 to Time T102. At Time T101, the potential of the signal LIN becomes a high potential. Furthermore, the potential of the clock signal $CLK_{i3}$ becomes a low potential and the potential of the clock signal $CLK_{i4}$ becomes a high potential. Since the potential of the signal LIN becomes a high potential, the transistor 31 and the transistor 34 are brought into an on state. When the transistor 31 is brought into an on state, the potential of the wiring Wa becomes a high potential; as a result, the transistor 21 is brought into an on state. When the transistor 34 is brought into an on state, the potential of the wiring Wb becomes a low potential; as a result, the transistor 22 and the transistor 32 are brought into an off state.

Figure 4B:
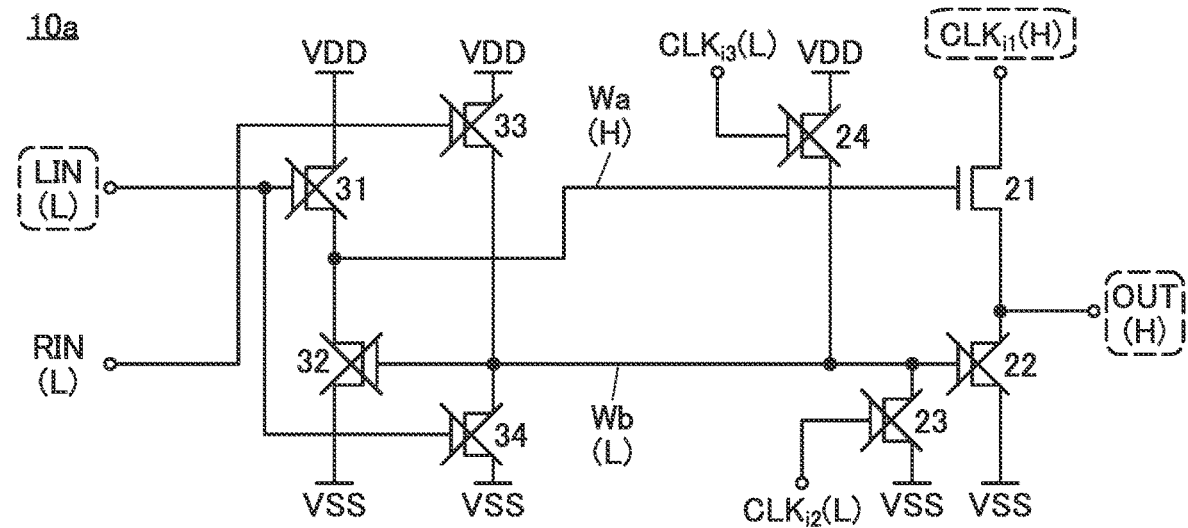

FIG. 4B is a circuit diagram illustrating the state of the sequential circuit 10a from Time T102 to Time T103. In FIG. 4B, a signal whose potential is changed from that from Time T101 to Time T102 is surrounded by a dashed line.

At Time T102, the potential of the signal LIN becomes a low potential. Furthermore, the potential of the clock signal $CLK_{i1}$ becomes a high potential and the potential of the clock signal $CLK_{i4}$ becomes a low potential. Since the potential of the signal LIN becomes a low potential, the transistor 31 is brought into an off state; thus, the wiring Wa is brought into a floating state whereas the transistor 21 remains in an on state. When the potential of the clock signal $CLK_{i1}$ becomes a high potential in this state, the potential of the signal OUT becomes a high potential.

Figure 5A:
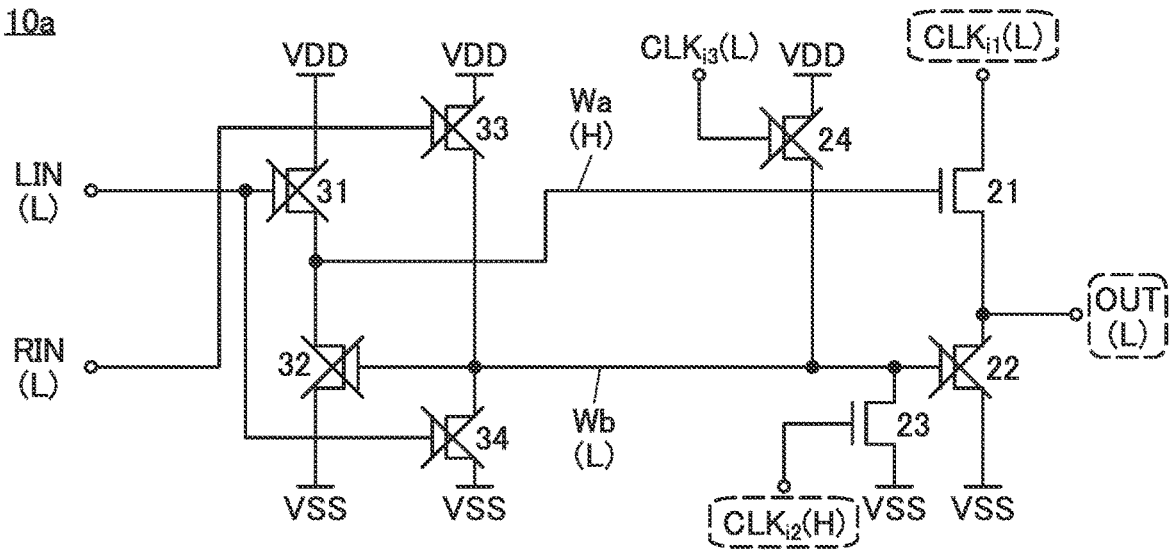
FIG. 5A and FIG. 5B are diagrams illustrating an example of a driving method of a sequential circuit.

FIG. 5A is a circuit diagram illustrating the state of the sequential circuit 10a from Time T103 to Time T104. In FIG. 5A, a signal whose potential is changed from that from Time T102 to Time T103 is surrounded by a dashed line.

At Time T103, the potential of the clock signal $CLK_{i1}$ becomes a low potential and the potential of the clock signal $CLK_{i2}$ becomes a high potential. Since the transistor 21 remains in an on state from Time T102 to Time T103, the potential of the signal OUT becomes a low potential when the potential of the clock signal $CLK_{i1}$ becomes a low potential. Since the potential of the clock signal $CLK_{i2}$ becomes a high potential, the transistor 23 is brought into an on state.

Figure 5B:
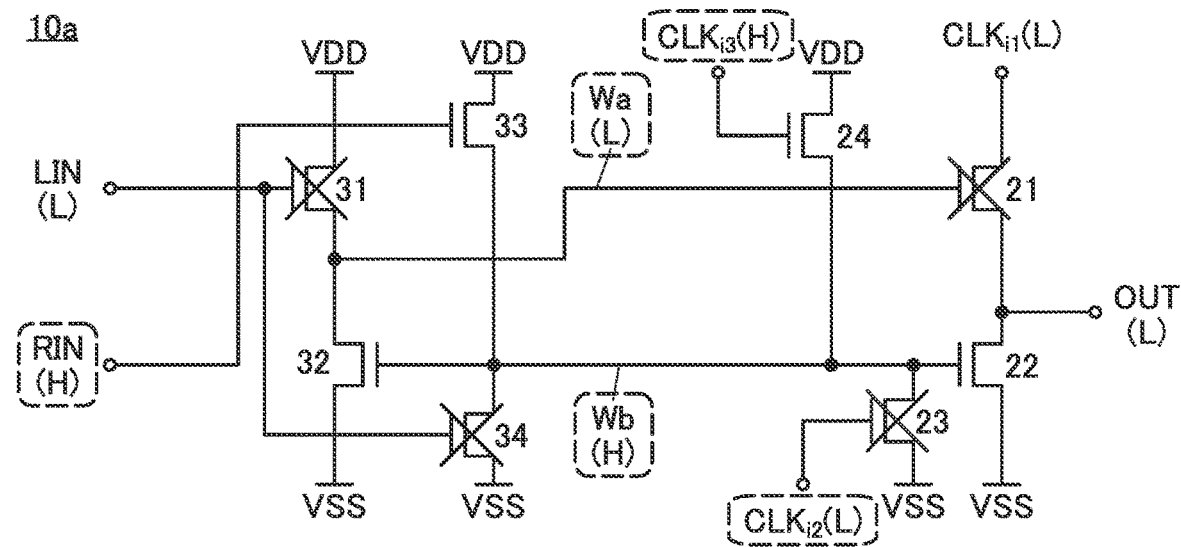

FIG. 5B is a circuit diagram illustrating the state of the sequential circuit 10a from Time T104 to Time T105. In FIG. 5B, a signal and a wiring whose potentials are changed from those from Time T103 to Time T104 are surrounded by dashed lines.

At Time T104, the potential of the signal RIN becomes a high potential. Furthermore, the potential of the clock signal $CLK_{i2}$ becomes a low potential and the potential of the clock signal $CLK_{i3}$ becomes a high potential. Since the potential of the signal RIN becomes a high potential, the transistor 33 is brought into an on state, and since the potential of the clock signal $CLK_{i3}$ becomes a high potential, the transistor 24 is brought into an on state. Furthermore, since the potential of the clock signal $CLK_{i2}$ becomes a low potential, the transistor 23 is brought into an off state. Accordingly, the potential of the wiring Wb becomes a high potential. When the potential of the wiring Wb becomes a high potential, the transistor 22 and the transistor 32 are brought into an on state. Since the transistor 32 is brought into an on state, the potential of the wiring Wa becomes a low potential; as a result, the transistor 21 is brought into an off state. When the transistor 21 is brought into an off state and the transistor 22 is brought into an on state, the potential of the signal OUT becomes a low potential regardless of the potential of the clock signal $CLK_{i1}$.

Figure 6A:
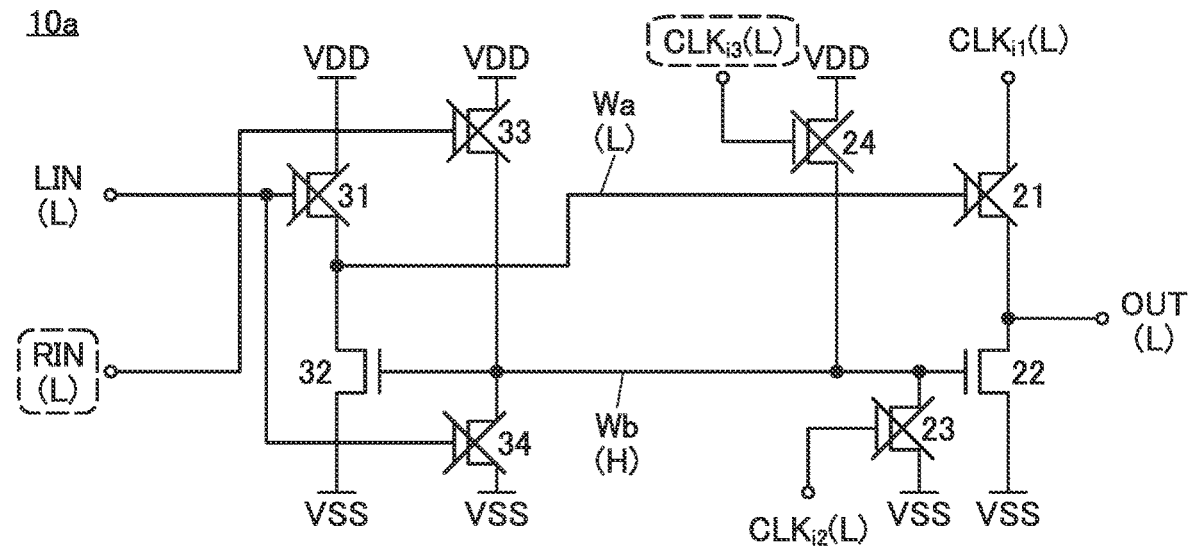
FIG. 6A and FIG. 6B are diagrams illustrating an example of a driving method of a sequential circuit.

FIG. 6A is a circuit diagram illustrating the state of the sequential circuit 10a from Time T105 to Time T106. In FIG. 6A, a signal whose potential is changed from that from Time T104 to Time T105 is surrounded by a dashed line.

At Time T105, the potential of the signal RIN becomes a low potential. Furthermore, the potential of the clock signal $CLK_{i3}$ becomes a low potential and the potential of the clock signal $CLK_{i4}$ becomes a high potential. Since the potential of the signal RIN becomes a low potential, the transistor 33 is brought into an off state, and since the potential of the clock signal $CLK_{i3}$ becomes a low potential, the potential of the transistor 24 is brought into an off state. Accordingly, the wiring Wb is brought into a floating state.

Figure 6B:
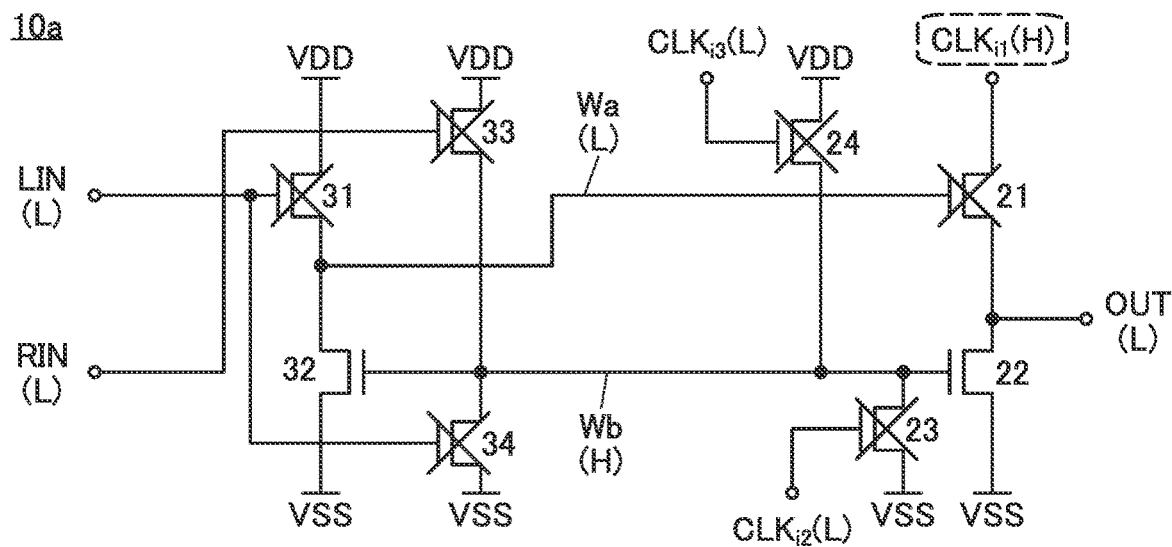

FIG. 6B is a circuit diagram illustrating the state of the sequential circuit 10a from Time T106 to Time T107. In FIG. 6B, a signal whose potential is changed from that from Time T105 to Time T106 is surrounded by a dashed line.

At Time T106, the potential of the clock signal $CLK_{i1}$ becomes a high potential and the potential of the clock signal $CLK_{i4}$ becomes a low potential. Although the potential of the clock signal $CLK_{i1}$ becomes a high potential, the potential of the signal OUT does not change because the transistor 21 is in an off state.

Figure 7A:
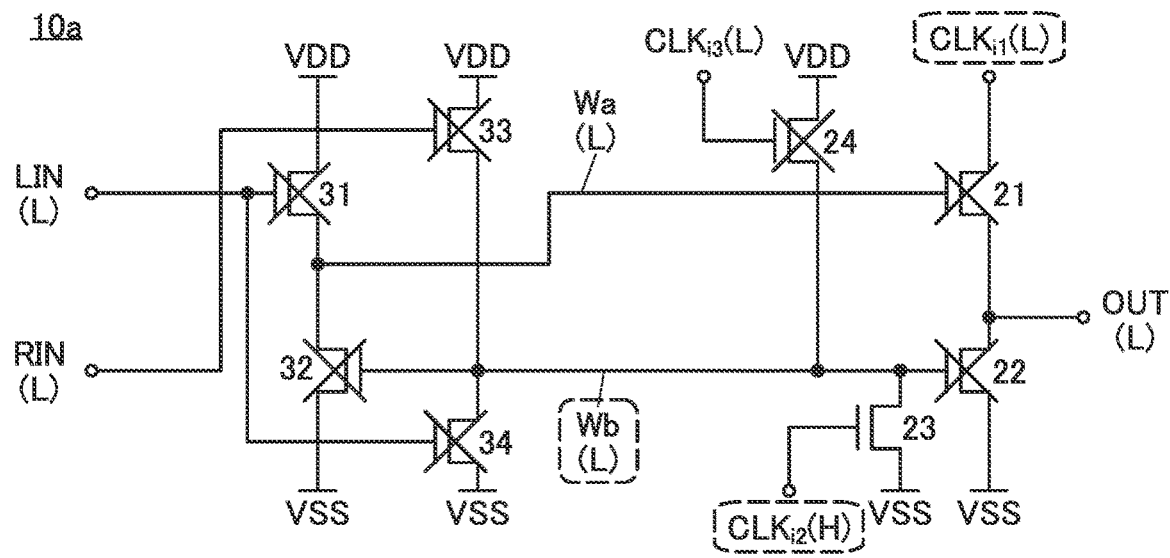
FIG. 7A and FIG. 7B are diagrams illustrating an example of a driving method of a sequential circuit.

FIG. 7A is a circuit diagram illustrating the state of the sequential circuit 10a from Time T107 to Time T108. In FIG. 7A, a signal and a wiring whose potentials are changed from those from Time T106 to Time T107 are surrounded by dashed lines.

At Time T107, the potential of the clock signal $CLK_{i1}$ becomes a low potential and the potential of the clock signal $CLK_{i2}$ becomes a high potential. Since the potential of the clock signal $CLK_{i2}$ becomes a high potential, the transistor 23 is brought into an on state. Accordingly, the potential of the wiring Wb becomes a low potential; thus, the transistor 22 and the transistor 32 are brought into an off state.

Figure 7B:
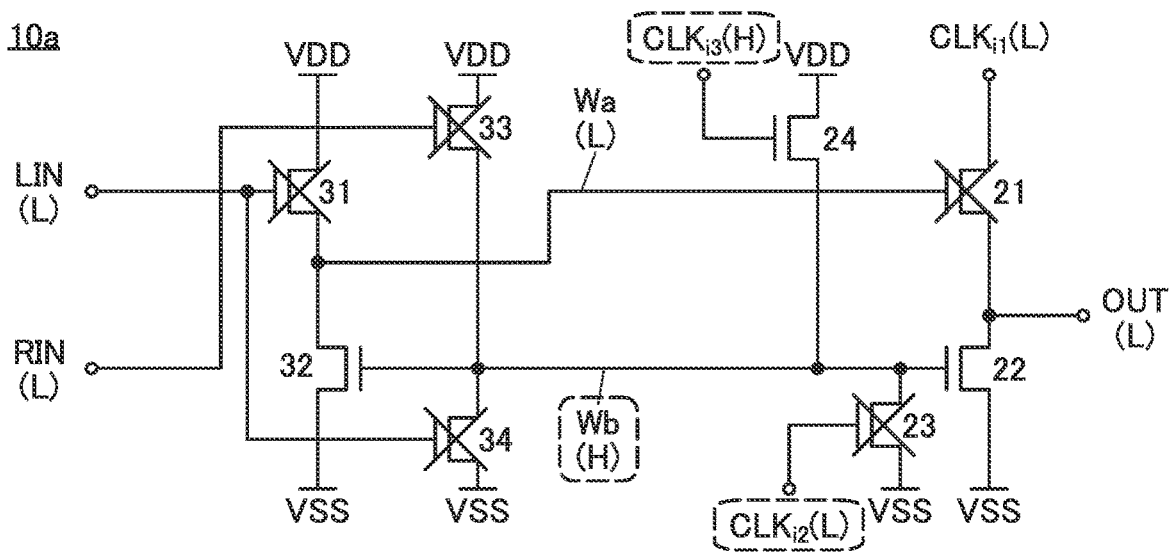

FIG. 7B is a circuit diagram illustrating the state of the sequential circuit 10a from Time T108 to Time T109. In FIG. 7B, a signal and a wiring whose potentials are changed from those from Time T107 to Time T108 are surrounded by dashed lines.

At Time T108, the potential of the clock signal $CLK_{i2}$ becomes a low potential and the potential of the clock signal $CLK_{i3}$ becomes a high potential. Since the potential of the clock signal $CLK_{i2}$ becomes a low potential, the transistor 23 is brought into an off state, and since the potential of the clock signal $CLK_{i3}$ becomes a high potential, the transistor 24 is brought into an on state. Accordingly, the potential of the wiring Wb becomes a high potential; thus, the transistor 22 and the transistor 32 are brought into an on state.

At Time T109, the potential of the clock signal $CLK_{i3}$ becomes a low potential and the potential of the clock signal $CLK_{i4}$ becomes a high potential. Since the potential of the clock signal $CLK_{i3}$ becomes a low potential, the transistor 24 is brought into an off state. Accordingly, the wiring Wb is brought into a floating state.

From Time T110 to Time T114, the sequential circuit 10a performs operations similar to those from Time T106 to Time T110. The operations similar to those from Time T106 to Time T110 are repeated until the sequential circuit 10a in the last stage outputs the signal OUT at a high potential, for example. Note that the operations similar to those from Time T106 to Time T110 are also performed before Time T101.

When the transistor 24 is provided in the circuit 11a, the potential of the wiring Wb can be a high potential in a period during which the clock signal $CLK_{i1}$ is at a high potential in a period during which the potential of the wiring Wa is a low potential. As a result, the transistor 32 is in an on state in a period during which the potential of the clock signal $CLK_{i1}$ changes from a low potential to a high potential. Accordingly, the wiring Wa is not brought into a floating state in the period. Hence, an increase in the potential of the wiring Wa by a bootstrap effect due to the gate capacitance of the transistor 21 can be inhibited, for example. This can inhibit an increase in the potential of the signal OUT, which is caused when the transistor 21 is unintentionally brought into an on state, in the period during which the clock signal $CLK_{i1}$ is at a high potential. Thus, a malfunction of the shift register circuit 40 can be prevented. Accordingly, the shift register circuit 40 can be a highly reliable semiconductor device. Note that in the case where a malfunction of the shift register circuit 40 does not occur even when the potential of the wiring Wb is a low potential in the period during which the potential of the wiring Wa is a low potential and the clock signal $CLK_{i1}$ is at a high potential or the malfunction is within tolerance, the transistor 24 can be eliminated.

The above is an example of the driving method of the sequential circuit 10a.

The sequential circuit 10 which is the semiconductor device of one embodiment of the present invention includes the transistor 23, and a clock signal is input to the gate of the transistor 23. In the case where the sequential circuit 10 does not include the transistor 23, for example, the potential of the wiring Wb is always a high potential after Time T104. Furthermore, although not shown in FIG. 3B, the potential of the wiring Wb is always a high potential before Time T101. As a result, voltage stress is applied between the gate and the source of the transistor 22 and between the gate and the source of the transistor 32 for a long time, which easily causes changes in threshold voltages of the transistor 22 and the transistor 32. In one embodiment of the present invention, on the other hand, the potential of the wiring Wb becomes a low potential in a certain cycle after Time T104 as shown in FIG. 3B. Furthermore, although not shown in FIG. 3B, the potential of the wiring Wb becomes a low potential in a certain cycle before Time T101. In FIG. 3B, a period during which the potential of the wiring Wb becomes a low potential after Time T104 is surrounded by a dashed line.

When the potential of the wiring Wb becomes a low potential in a certain cycle, a period during which voltage stress is applied between the gate and the source of the transistor 22 and between the gate and the source of the transistor 32 can be short as compared to the case where the potential of the wiring Wb is a high potential for a long time. Accordingly, changes in electrical characteristics of the transistor 22 and the transistor 32, for example, changes in threshold voltages, can be inhibited. Thus, the sequential circuit 10 can be a highly reliable semiconductor device.

Note that the signal input to the gate of the transistor 23 is not necessarily a clock signal. For example, a signal whose potential is controlled independently of other signals may be input to the gate of the transistor 23. In that case, the period during which the potential of the wiring Wb is a low potential can be long, for example, and accordingly, the period during which voltage stress is applied between the gate and the source of the transistor 22 and between the gate and the source of the transistor 32 can be shortened. Thus, the reliability of the sequential circuit 10 can be further increased.

Configuration Example_2 of Sequential Circuit

Figure 8:
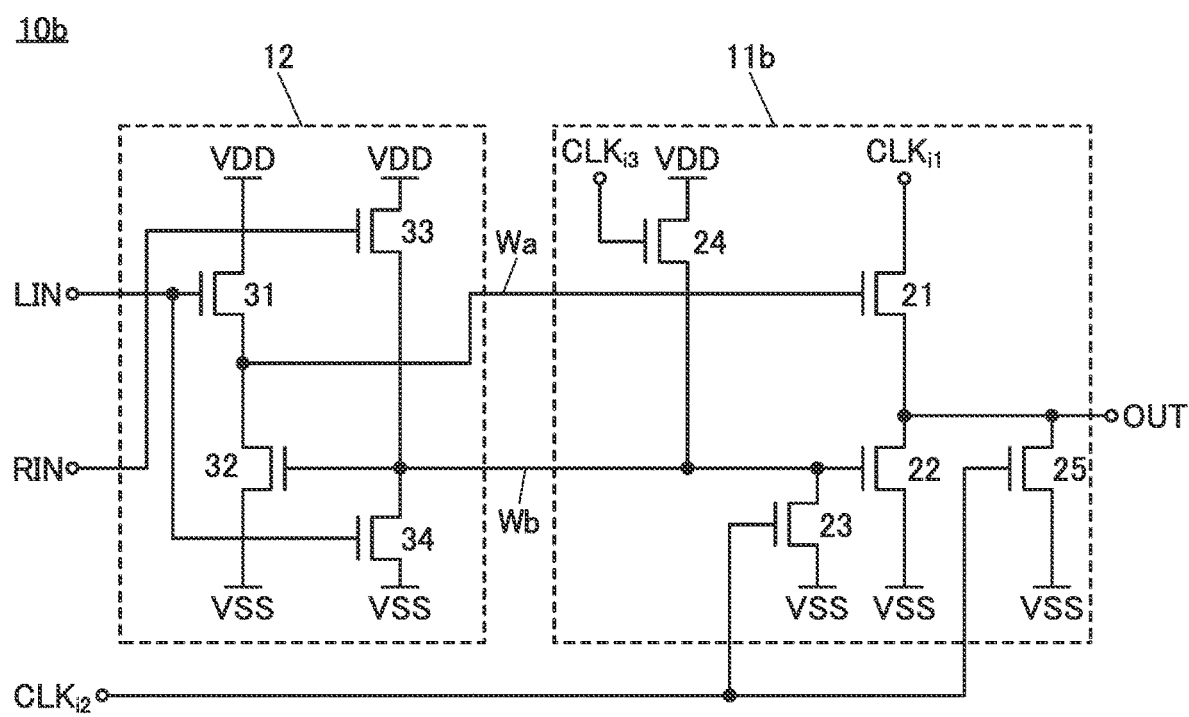
FIG. 8 is a diagram illustrating a configuration example of a sequential circuit.

FIG. 8 is a circuit diagram illustrating a configuration example of a sequential circuit 10b applicable to the sequential circuits 10. The sequential circuit 10b includes a circuit 11b and the circuit 12. The circuit 11b is a modification example of the circuit 11a and is different from the circuit 11a in that a transistor 25 is included.

One of a source and a drain of the transistor 25 is electrically connected to one of a source and a drain of the transistor 21 and one of a source and a drain of the transistor 22. The clock signal $CLK_{i2}$ is input to a gate of the transistor 25.

A low potential is supplied to the other of the source and the drain of the transistor 25. Thus, when the potential supplied to the other of the source and the drain of the transistor 25 is referred to as an eighth potential, the difference between the first potential and the eighth potential and the difference between the second potential and the eighth potential are smaller than the difference between the third potential and the eighth potential. The eighth potential can be an inversion potential of the third potential.

The sequential circuit 10b can be driven by a method similar to the method shown in FIG. 3B, for example. In that case, both of the potential of the wiring Wa and the potential of the wiring Wb become a low potential as those from Time T107 to Time T108 and Time T111 to Time T112 shown in FIG. 3B, for example; thus, one of the source and the drain of the transistor 21 can be prevented from being in a floating state even in a period during which both of the transistor 21 and the transistor 22 are in an off state. Accordingly, a malfunction of the shift register circuit 40 caused when the potential of the signal OUT becomes an unintended potential can be prevented. Hence, the shift register circuit 40 can be a highly reliable semiconductor device.

Configuration Example_3 of Sequential Circuit

FIG. 9 is a circuit diagram illustrating a configuration example of a sequential circuit 10c applicable to the sequential circuits 10. The sequential circuit 10c includes a circuit 11c and the circuit 12. The circuit 11c is a modification example of the circuit 11a and is different from the circuit 11a in that a transistor 26 and a capacitor 27 are included.

One of a source and a drain of the transistor 21 is electrically connected to one of a source and a drain of the transistor 22 and one electrode of the capacitor 27. One of a source and a drain of the transistor 26 is electrically connected to the circuit 12 through the wiring Wa. The other of the source and the drain of the transistor 26 is electrically connected to a gate of the transistor 21. The gate of the transistor 21 is electrically connected to the other electrode of the capacitor 27. Here, a node to which the gate of the transistor 21, the other of the source and the drain of the transistor 26, and the other electrode of the capacitor 27 are electrically connected is referred to as a node N. A high potential can be supplied to the gate of the transistor 26.

Driving Method Example_2 of Sequential Circuit

Figure 9A:
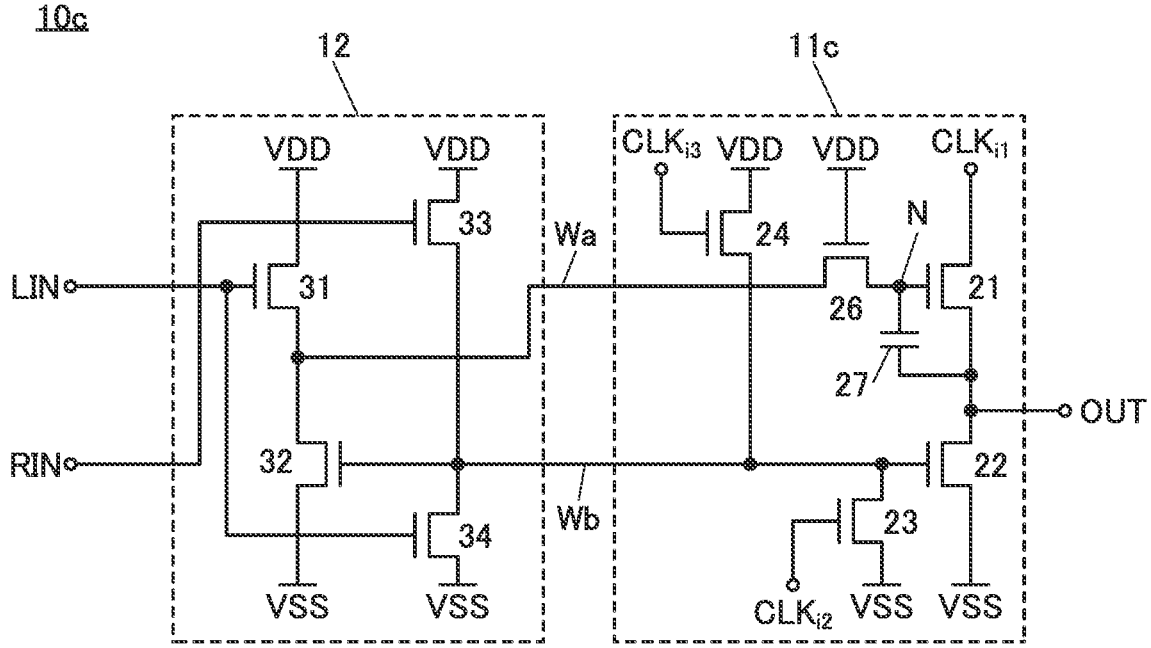
FIG. 9A is a diagram illustrating a configuration example of a sequential circuit.
Figure 9B:
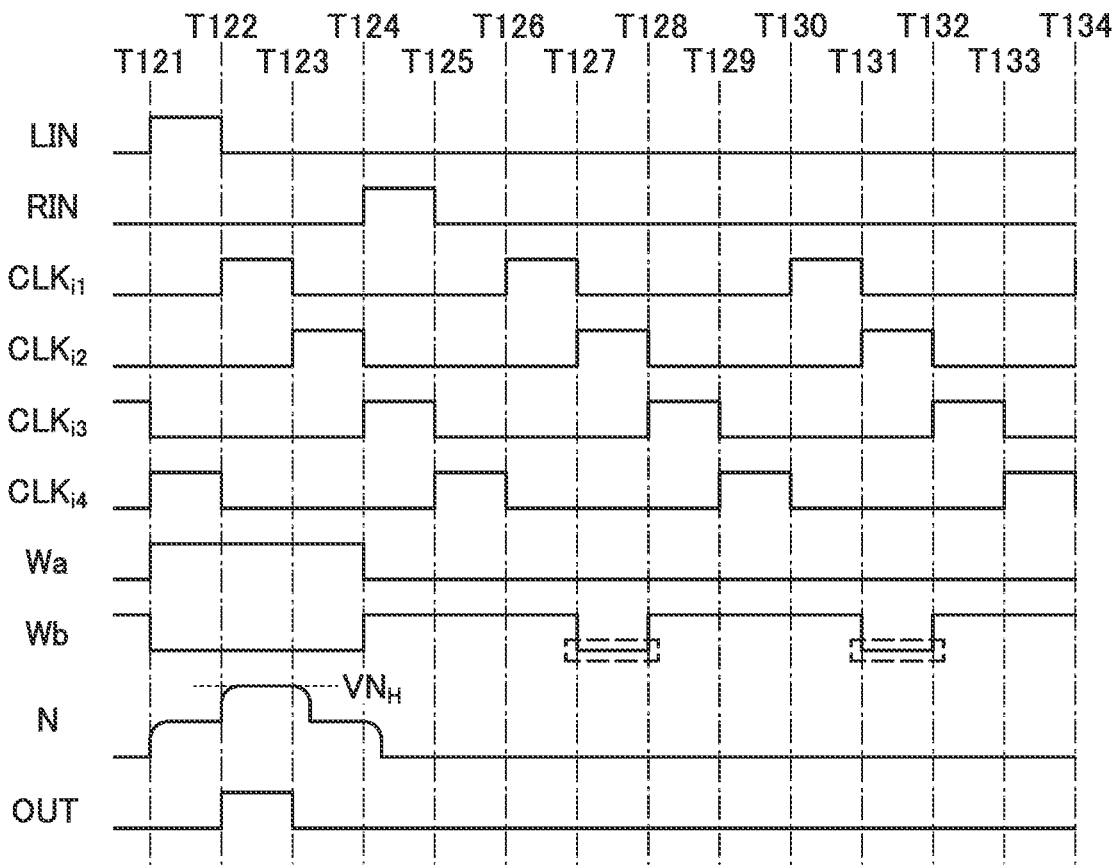
FIG. 9B is a timing chart showing an example of a driving method of the sequential circuit.

FIG. 9B is a timing chart showing an example of a driving method of the sequential circuit 10c illustrated in FIG. 9A. FIG. 9B shows a change in potential of the node N in addition to the potential changes of the signals and the wirings shown in FIG. 3B.

Changes in potentials of the signal LIN, the signal RIN, the clock signal $CLK_{i1}$ to the clock signal $CLK_{i4}$, the wiring Wa, the wiring Wb, and the signal OUT from Time T121 to Time T134 are similar to the changes in potentials from Time T101 to Time T114 shown in FIG. 3B. The potential of the node N before Time T121 is a low potential.

At Time T121, the signal LIN becomes a high potential and the transistor 31 is brought into an on state, whereby the potential of the wiring Wa becomes a high potential. Accordingly, the potential of the node N increases to a potential that is lower than the potential of the wiring Wa by the threshold voltage of the transistor 26 from Time T121 to Time T122.

Figure 10:
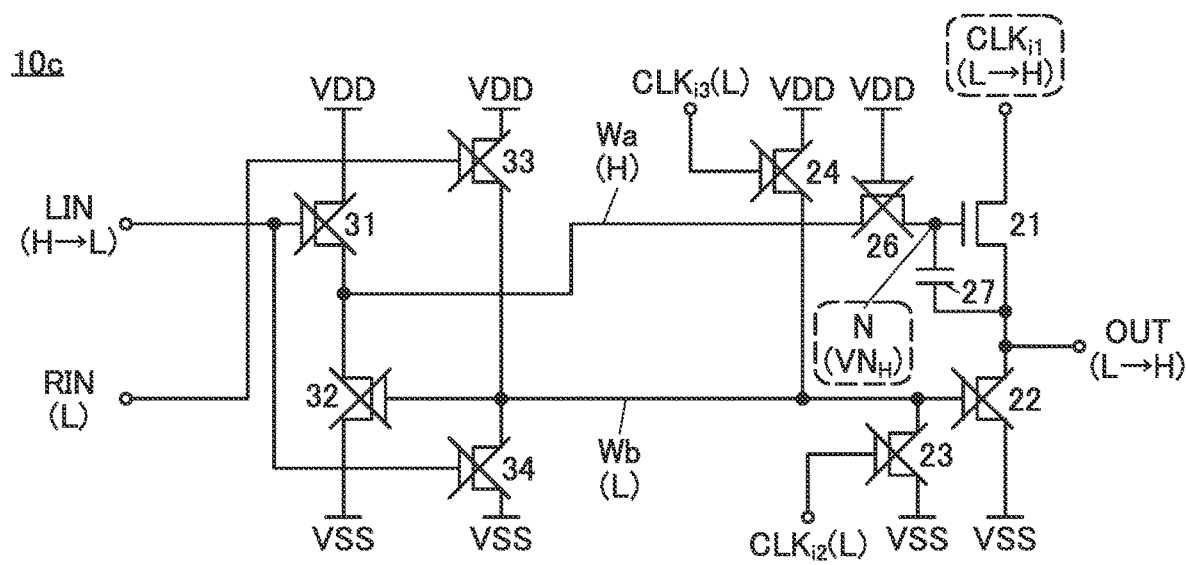
FIG. 10 is a diagram illustrating an example of a driving method of a sequential circuit.

FIG. 10 is a circuit diagram illustrating the state of the sequential circuit 10c from Time T122 to Time T123. In FIG. 10, "L→H" means a change from a low potential to a high potential at Time T122 and "H→L" means a change from a high potential to a low potential at Time T122. In FIG. 10, the clock signal $CLK_{i1}$ and the node N are surrounded by dashed lines to be emphasized.

At Time T122, the potential of the clock signal $CLK_{i1}$ changes from a low potential to a high potential. Since the potential of the clock signal $CLK_{i1}$ changes from a low potential to a high potential after the potential of the node N increases to the potential that is lower than the potential of the wiring Wa by the threshold voltage of the transistor 26, the potential of the node N increases because of the bootstrap effect. The increase in the potential of the node N makes the potential difference between the gate and the source of the transistor 26 smaller than the threshold voltage of the transistor 26 (large in the negative direction). Accordingly, the transistor 26 is brought into an off state and the node N is brought into a floating state. Here, the potential of the node N at Time T123 is referred to as a potential $VN_H$.

In the case where the sequential circuit 10 does not include the transistor 26 nor the capacitor 27, a potential that is lower than a high potential of the clock signal $CLK_{i1}$ by the threshold voltage of the transistor 21 is output as the signal OUT from Time T122 to Time T123. In the case where the sequential circuit 10 includes the transistor 26 and the capacitor 27 on the other hand, the gate potential of the transistor 21 increases to a potential close to twice as high as the potential VDD (e.g., a potential close to twice as high as the difference between the potential VDD and the potential VSS). Accordingly, a high potential of the clock signal $CLK_{i1}$ can be output as the signal OUT without being affected by the threshold voltage of the transistor 21. Thus, the sequential circuit 10 with high output performance can be obtained without an increase in the kinds of power supply potentials.

Note that in the case where the potential of the node N is the potential $VN_H$ as described above, for example, the transistor 26 is in an off state. Thus, an increase in the potential of the wiring Wa from Time T122 to Time T123 can be inhibited. As a result, application of a high voltage to the transistor 31 and the transistor 32 can be inhibited. Accordingly, the sequential circuit 10c can be a highly reliable semiconductor device.

At Time T123, the clock signal $CLK_{i1}$ becomes a low potential. Accordingly, the potential of the node N decreases from Time T123 to Time T124. For example, the potential of the node N decreases to a potential substantially equal to that from Time T121 to Time T122.

At Time T124, the wiring Wb has a high potential and the transistor 32 is brought into an on state, whereby the potential of the wiring Wa becomes a low potential. Accordingly, the potential difference between the gate and the source of the transistor 26 becomes higher than or equal to the threshold voltage of the transistor 26, which brings the transistor 26 into an on state. In this manner, the potential of the node N becomes a low potential from Time T124 to Time T125. The potential of the node N is a low potential also after Time T125. The above is an example of the driving method of the sequential circuit 10c.

Configuration Example_4 of Sequential Circuit

Figure 11A:
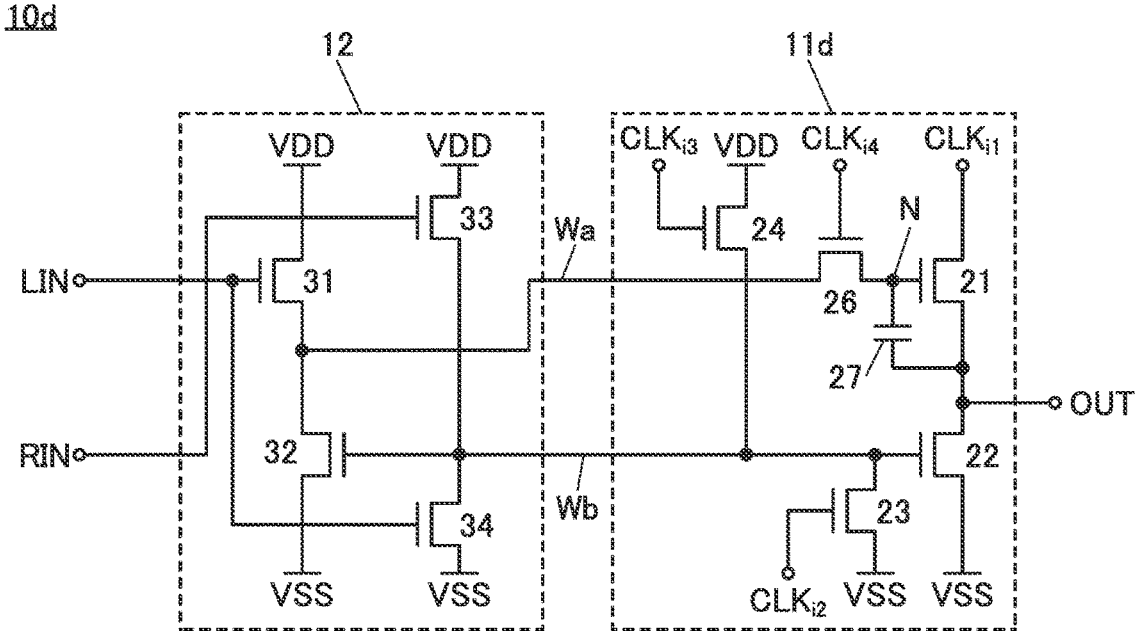
FIG. 11A and FIG. 11B are diagrams illustrating configuration examples of sequential circuits.

FIG. 11A is a circuit diagram illustrating a configuration example of a sequential circuit 10d applicable to the sequential circuits 10. The sequential circuit 10d includes a circuit 11d and the circuit 12. The circuit 11d is a modification example of the circuit 11c and is different from the circuit 11c in that the clock signal $CLK_{i4}$ is input to a gate of the transistor 26.

In the case where the gate potential of the transistor 26 is a high potential and the potential of the wiring Wa or the potential of the node N is a low potential, voltage stress is applied between the gate and a source of the transistor 26. When the clock signal $CLK_{i4}$ is input to the gate of the transistor 26, a period during which voltage stress is applied between the gate and the source of the transistor 26 can be shortened. Accordingly, a change in electrical characteristics of the transistor 26, for example, a change in threshold voltage, can be inhibited. Thus, the sequential circuit 10d can be a highly reliable semiconductor device.

When a clock signal is input to the gate of the transistor 26, the control of the driving of the sequential circuit 10 can be facilitated as compared to the case where a signal whose potential is controlled independently of other signals is input to the gate of the transistor 26. Note that the signal whose potential is controlled independently of other signals may be input to the gate of the transistor 26. In that case, a period during which the gate potential of the transistor 26 is a low potential can be long, for example, and accordingly, the period during which voltage stress is applied between the gate and the source of the transistor 26 can be shortened. Thus, the reliability of the sequential circuit 10d can be further increased.

Configuration Example_5 of Sequential Circuit

Figure 11B:
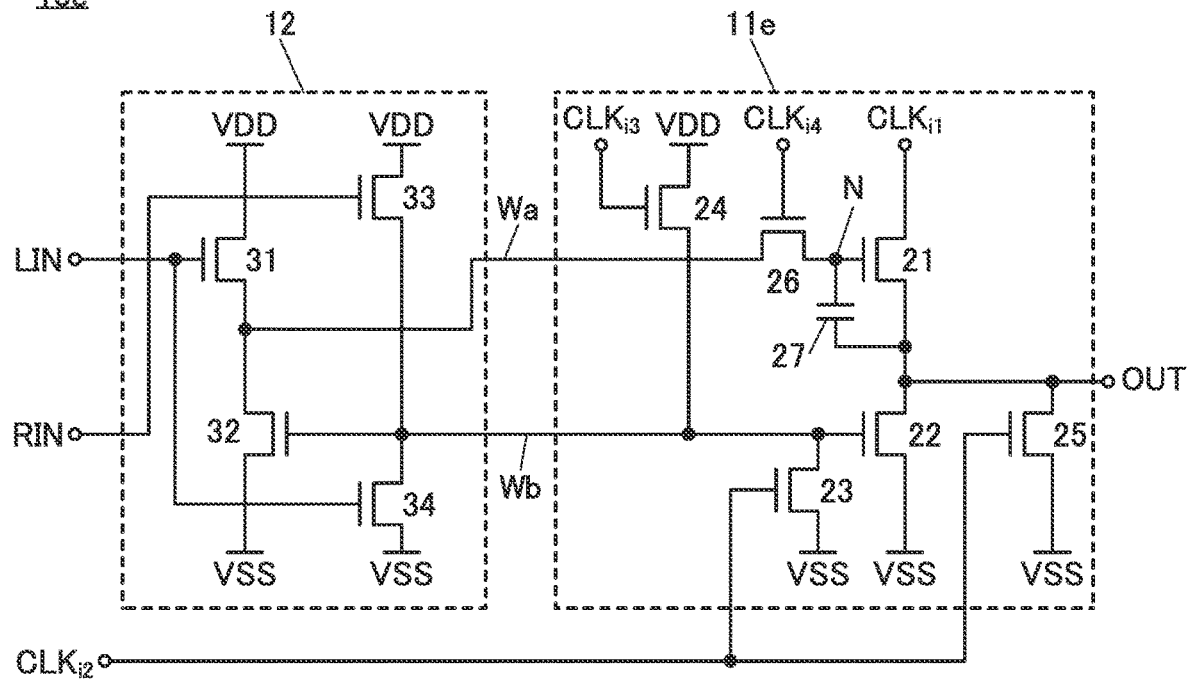

FIG. 11B is a circuit diagram illustrating a configuration example of a sequential circuit 10e applicable to the sequential circuits 10. The sequential circuit 10e includes a circuit 11e and the circuit 12. The circuit 11e is a modification example of the circuit 11d and is different from the circuit 11d in that the transistor 25 is included. The circuit 11e has a configuration in which the configuration of the circuit 11b and the configuration of the circuit 11d are combined.

Configuration Example_2 of Shift Register Circuit

Figure 12A:
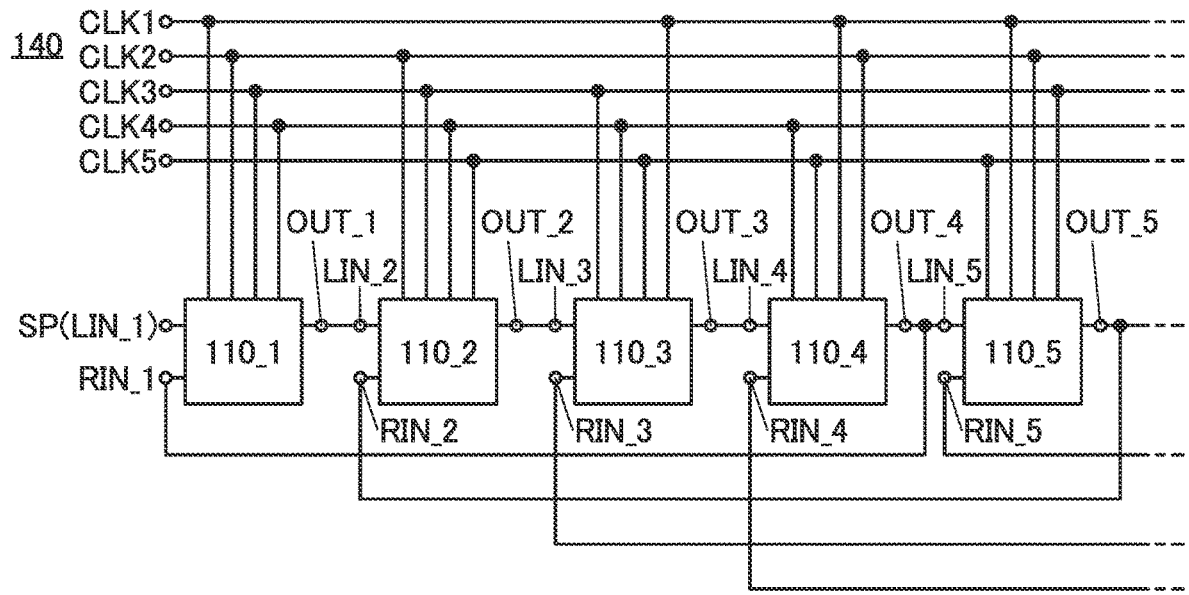
FIG. 12A is a diagram illustrating a configuration example of a shift register circuit.

FIG. 12A is a block diagram illustrating a configuration example of a shift register circuit 140 which is the semiconductor device of one embodiment of the present invention. The shift register circuit 140 is a modification example of the shift register circuit 40 illustrated in FIG. 1A, and sequential circuits 110 are provided instead of the sequential circuits 10.

In the shift register circuit 140, the signal OUT_4, for example, is input as the signal RIN_1 to a sequential circuit 110_1. Furthermore, the signal OUT_5 is input as the signal RIN_2 to a sequential circuit 110_2. That is, the signal RIN input to the sequential circuit 110 can be the signal OUT output from the sequential circuit 110 in the third subsequent stage. Note that the signal RIN input to the sequential circuit 110 may be the signal OUT output from the sequential circuit 110 in the fourth or more subsequent stage.

In addition to the clock signal CLK1 to the clock signal CLK4, a clock signal CLK5 is input as a clock signal to the sequential circuits 110. Four of the clock signal CLK1 to the clock signal CLK5 can be input to one sequential circuit 110, for example.

For example, the clock signal CLK1, the clock signal CLK2, the clock signal CLK3, and the clock signal CLK4 are input to the sequential circuit 110_1; the clock signal CLK2, the clock signal CLK3, the clock signal CLK4, and the clock signal CLK5 are input to the sequential circuit 110_2; the clock signal CLK3, the clock signal CLK4, the clock signal CLK5, and the clock signal CLK1 are input to a sequential circuit 110_3; the clock signal CLK4, the clock signal CLK5, the clock signal CLK1, and the clock signal CLK2 are input to a sequential circuit 110_4; and the clock signal CLK5, the clock signal CLK1, the clock signal CLK2, and the clock signal CLK3 are input to a sequential circuit 110_5. In the example illustrated in FIG. 12A, every five stages have the same combination of clock signals input to the sequential circuit 110. In other words, in the case where the clock signal CLK1, the clock signal CLK2, the clock signal CLK3, and the clock signal CLK4 are input to a sequential circuit 10_n, for example, the clock signal CLK2, the clock signal CLK3, the clock signal CLK4, and the clock signal CLK5 are input to a sequential circuit 10_n+1; the clock signal CLK3, the clock signal CLK4, the clock signal CLK5, and the clock signal CLK1 are input to a sequential circuit 10_n+2; the clock signal CLK4, the clock signal CLK5, the clock signal CLK1, and the clock signal CLK2 are input to a sequential circuit 10_n+3; and the clock signal CLK5, the clock signal CLK1, the clock signal CLK2, and the clock signal CLK3 are input to a sequential circuit 10_n+4. The combination of clock signals input to the sequential circuit 10_n and the combination of clock signals input to a sequential circuit 10_n+5 are the same. Note that the shift register circuit 140 may have a configuration in which four or more kinds of clock signals among fix or more kinds of clock signals are input.

Driving Method Example_2 of Shift Register Circuit

Figure 12B:
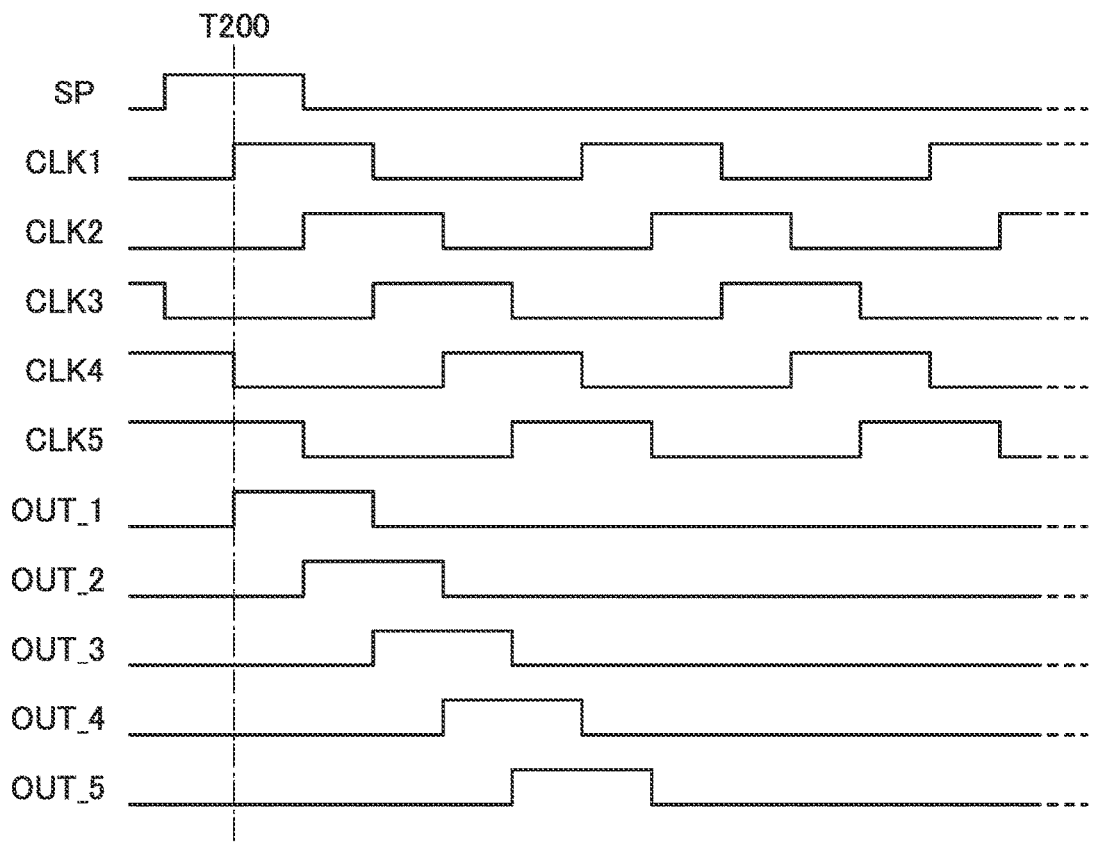
FIG. 12B is a timing chart showing an example of a driving method of the shift register circuit.

FIG. 12B is a timing chart showing an example of a driving method of the shift register circuit 140. FIG. 12B shows changes in potentials of the start pulse signal SP, the clock signal CLK1 to the clock signal CLK5, and the signal OUT_1 to the signal OUT_5 from the top.

As shown in FIG. 12B, the clock signal CLK1 to the clock signal CLK5 can be signals each shifted by one-fifth cycle period. Furthermore, the clock signal CLK1 to the clock signal CLK5 can be signals whose parts of periods during which the signals are at high potentials overlap with one another. For example, periods during which two clock signals are at high potentials can overlap with each other.

Before Time T200 shown in FIG. 12B, the start pulse signal SP is at a high potential and the clock signal CLK1 is at a low potential. At this time, the potentials of the signal OUT_1 to the signal OUT_5 are low potentials.

At Time T200, the clock signal CLK1 changes from a low potential to a high potential, that is, the clock signal CLK1 rises, so that the signal OUT_1 at a high potential is output from the sequential circuit 110_1. Next, in response to the rises of the clock signal CLK2 to the clock signal CLK5, the signal OUT_2 to the signal OUT_5 at high potentials are sequentially output from the sequential circuit 10_2 to the sequential circuit 10_5. After that, in response to the rises of the clock signal CLK1 to the clock signal CLK5, a signal OUT_6 and subsequent signals OUT at high potentials are sequentially output from a sequential circuit 10_6 and the sequential circuits 10 in the subsequent stages.

Configuration Example_6 of Sequential Circuit

Figure 13:
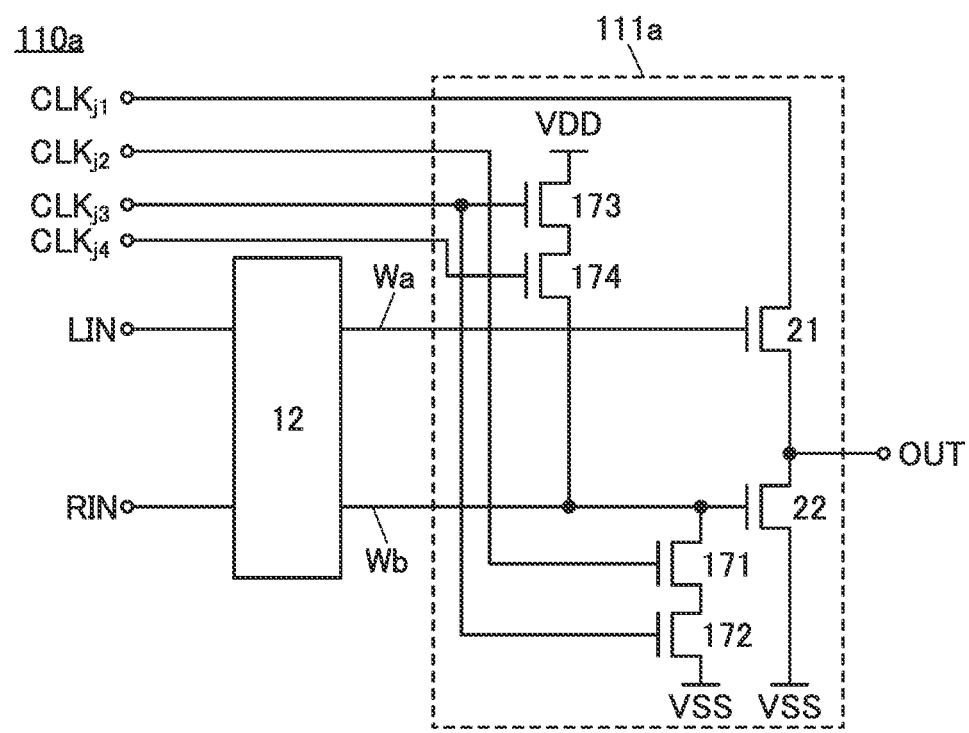
FIG. 13 is a diagram illustrating a configuration example of a sequential circuit.

FIG. 13 is a circuit diagram illustrating a configuration example of a sequential circuit 110a applicable to the sequential circuits 110. The sequential circuit 110a includes a circuit 11a and the circuit 12. The circuit 111a and the circuit 12 are electrically connected to each other through the wiring Wa. The circuit 111a and the circuit 12 are electrically connected to each other through the wiring Wb.

The circuit 11a includes the transistor 21, the transistor 22, a transistor 171, a transistor 172, a transistor 173, and a transistor 174. A gate of the transistor 21 is electrically connected to the wiring Wa. A gate of the transistor 22, one of a source and a drain of the transistor 171, and one of a source and a drain of the transistor 174 are electrically connected to the wiring Wb. The other of the source and the drain of the transistor 171 is electrically connected to one of a source and a drain of the transistor 172. The other of the source and the drain of the transistor 174 is electrically connected to one of a source and a drain of the transistor 173. One of a source and a drain of the transistor 21 is electrically connected to one of a source and a drain of the transistor 22, and the signal OUT is output.

A clock signal $CLK_{j1}$ is input to the other of the source and the drain of the transistor 21. A clock signal $CLK_{j2}$ is input to a gate of the transistor 171. A clock signal $CLK_{j3}$ is input to a gate of the transistor 172 and a gate of the transistor 173. A clock signal $CLK_{j4}$ is input to a gate of the transistor 174.

Here, each of the clock signal $CLK_{j1}$ to the clock signal $CLK_{j4}$ is any of the clock signal CLK1 to the clock signal CLK5 illustrated in FIG. 12A and the like. For example, in the sequential circuit 110_1, the clock signal $CLK_{j1}$ is the clock signal CLK1, the clock signal $CLK_{j2}$ is the clock signal CLK2, the clock signal $CLK_{j3}$ is the clock signal CLK3, and the clock signal $CLK_{j4}$ is the clock signal CLK4. In the sequential circuit 110_2, the clock signal $CLK_{j1}$ is the clock signal CLK2, the clock signal $CLK_{j2}$ is the clock signal CLK3, the clock signal $CLK_{j3}$ is the clock signal CLK4, and the clock signal $CLK_{j4}$ is the clock signal CLK5. In the sequential circuit 110_3, the clock signal $CLK_{j1}$ is the clock signal CLK3, the clock signal $CLK_{j2}$ is the clock signal CLK4, the clock signal $CLK_{j3}$ is the clock signal CLK5, and the clock signal $CLK_{j4}$ is the clock signal CLK1. In the sequential circuit 110_4, the clock signal $CLK_{j1}$ is the clock signal CLK4, the clock signal $CLK_{j2}$ is the clock signal CLK5, the clock signal $CLK_{j3}$ is the clock signal CLK1, and the clock signal $CLK_{j4}$ is the clock signal CLK2. In the sequential circuit 110_5, the clock signal $CLK_{j1}$ is the clock signal CLK5, the clock signal $CLK_{j2}$ is the clock signal CLK1, the clock signal $CLK_{j3}$ is the clock signal CLK2, and the clock signal $CLK_{j4}$ is the clock signal CLK3.

Low potentials are supplied to the other of the source and the drain of the transistor 22 and the other of the source and the drain of the transistor 172. A high potential is supplied to the other of the source and the drain of the transistor 173. Here, the potential supplied to the other of the source and the drain of the transistor 22 is referred to as a first potential, the potential supplied to the other of the source and the drain of the transistor 172 is referred to as a second potential, and the potential supplied to the other of the source and the drain of the transistor 173 is referred to as a third potential. In this case, the difference between the third potential and the first potential and the difference between the third potential and the second potential in the sequential circuit 110a are larger than the difference between the second potential and the first potential in the sequential circuit 110a. The third potential in the sequential circuit 110a can be an inversion potential of the first potential or an inversion potential of the second potential in the sequential circuit 110a.

Figure 14A:
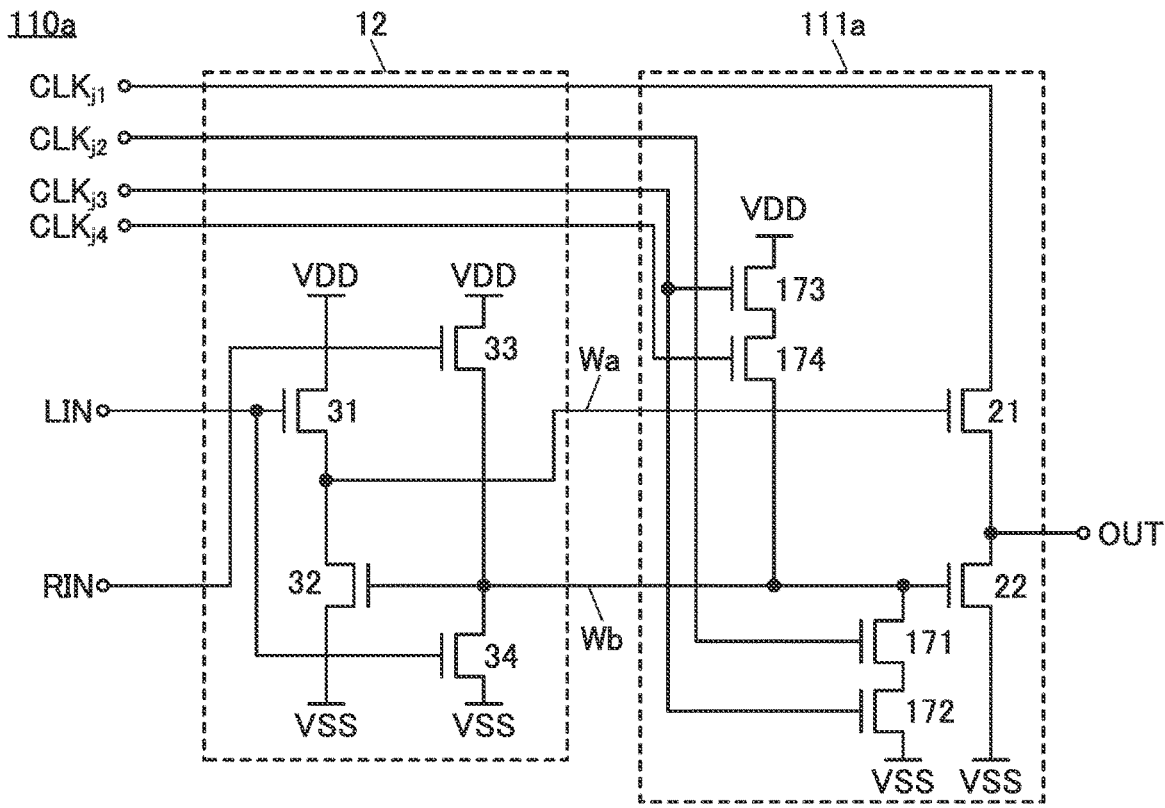
FIG. 14A is a diagram illustrating a configuration example of a sequential circuit.

FIG. 14A is a circuit diagram illustrating a more detailed configuration example of the sequential circuit 110a illustrated as an example in FIG. 13. The configuration of the circuit 12 illustrated in FIG. 14A can be similar to the configuration of the circuit 12 illustrated in FIG. 3A, for example.

Driving Method Example_3 of Sequential Circuit

Figure 14B:
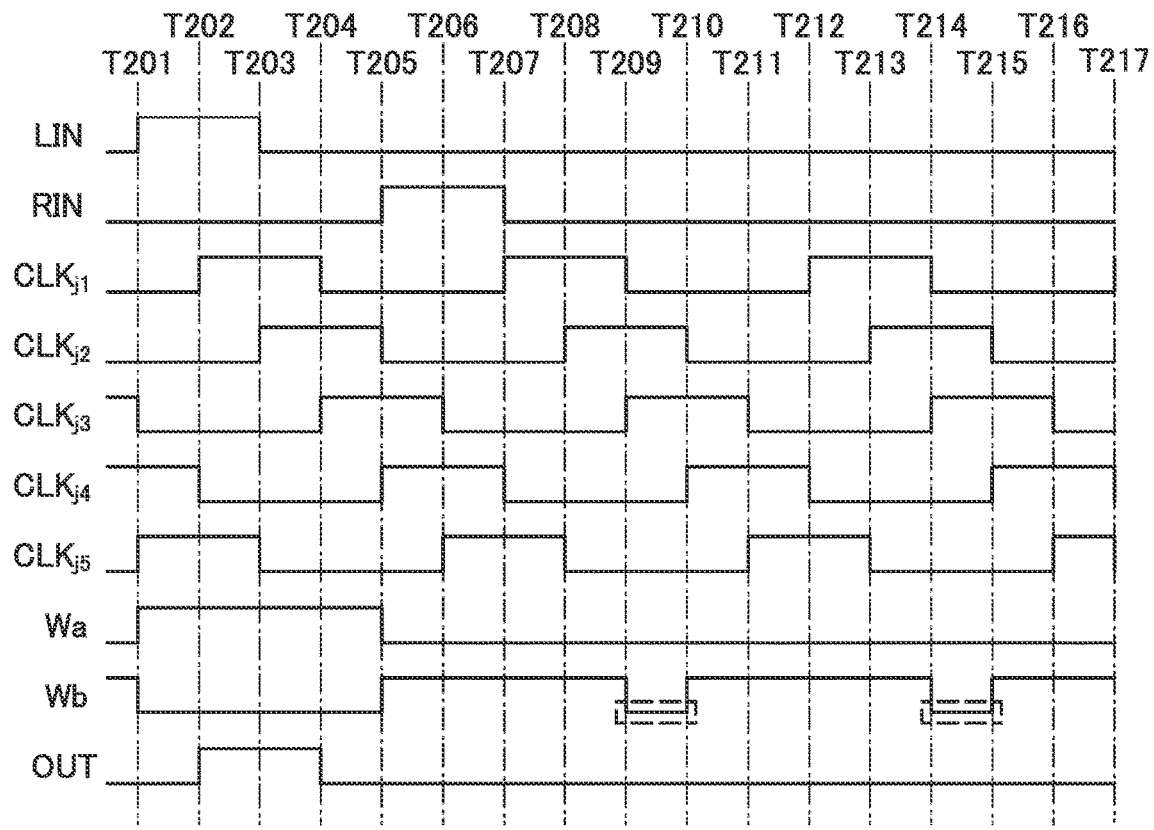
FIG. 14B is a timing chart showing an example of a driving method of the sequential circuit.

An example of a driving method of the sequential circuit 110a illustrated in FIG. 14A is described below with reference to FIG. 14B and FIG. 15A to FIG. 19B. FIG. 14B is a timing chart showing the example of the driving method of the sequential circuit 110a illustrated in FIG. 14A. FIG. 14B shows changes in potentials of the signal LIN, the signal RIN, the clock signal $CLK_{j1}$ to a clock signal $CLK_{j5}$, the wiring Wa, the wiring Wb, and the signal OUT from the top. FIG. 15A to FIG. 19B are circuit diagrams illustrating the example of the driving method of the sequential circuit 110a.

Here, the clock signal $CLK_{j5}$ is, for example, a signal that is not any of the clock signal $CLK_{j1}$ to the clock signal $CLK_{j4}$ among the clock signal CLK1 to the clock signal CLK5 illustrated in FIG. 12A. For example, in the sequential circuit 10_1, the clock signal $CLK_{j5}$ is the clock signal CLK5. In the sequential circuit 10_2, the clock signal $CLK_{j5}$ is the clock signal CLK1. In the sequential circuit 103, the clock signal $CLK_{j5}$ is the clock signal CLK2. In the sequential circuit 104, the clock signal $CLK_{j5}$ is the clock signal CLK3. In the sequential circuit 105, the clock signal $CLK_{j5}$ is the clock signal CLK4.

Before Time T201, the potential of the signal LIN, the potential of the signal RIN, the potential of the clock signal $CLK_{j1}$, the potential of the clock signal $CLK_{j2}$, the potential of the clock signal $CLK_{j5}$, the potential of the wiring Wa, and the potential of the signal OUT are low potentials. The potential of the clock signal $CLK_{j3}$, the potential of the clock signal $CLK_{j4}$, and the potential of the wiring Wb are high potentials.

Figure 15A:
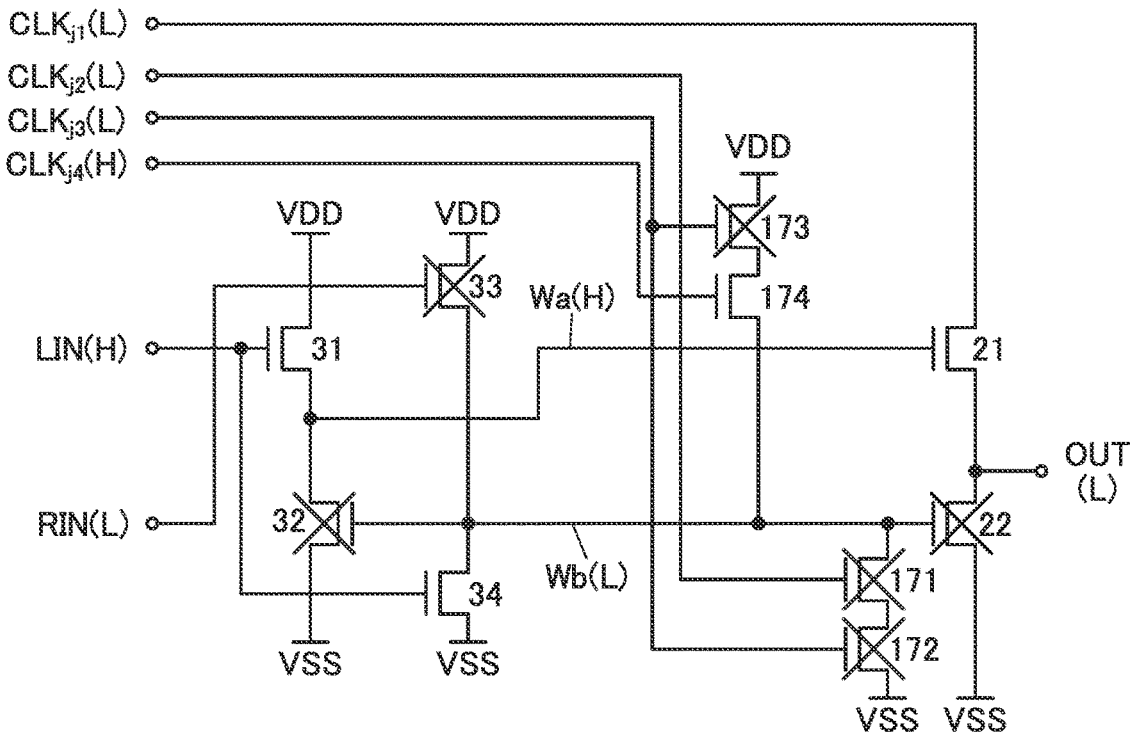
FIG. 15A and FIG. 15B are diagrams illustrating an example of a driving method of a sequential circuit.

FIG. 15A is a circuit diagram illustrating the state of the sequential circuit 110a from Time T201 to Time T202. At Time T201, the potential of the signal LIN becomes a high potential. Furthermore, the potential of the clock signal $CLK_{j3}$ becomes a low potential and the potential of the clock signal $CLK_{j5}$ becomes a high potential. Since the potential of the signal LIN becomes a high potential, the transistor 31 and the transistor 34 are brought into an on state. When the transistor 31 is brought into an on state, the potential of the wiring Wa becomes a high potential; as a result, the transistor 21 is brought into an on state. When the transistor 34 is brought into an on state, the potential of the wiring Wb becomes a low potential; as a result, the transistor 22 and the transistor 32 are brought into an off state.

Figure 15B:
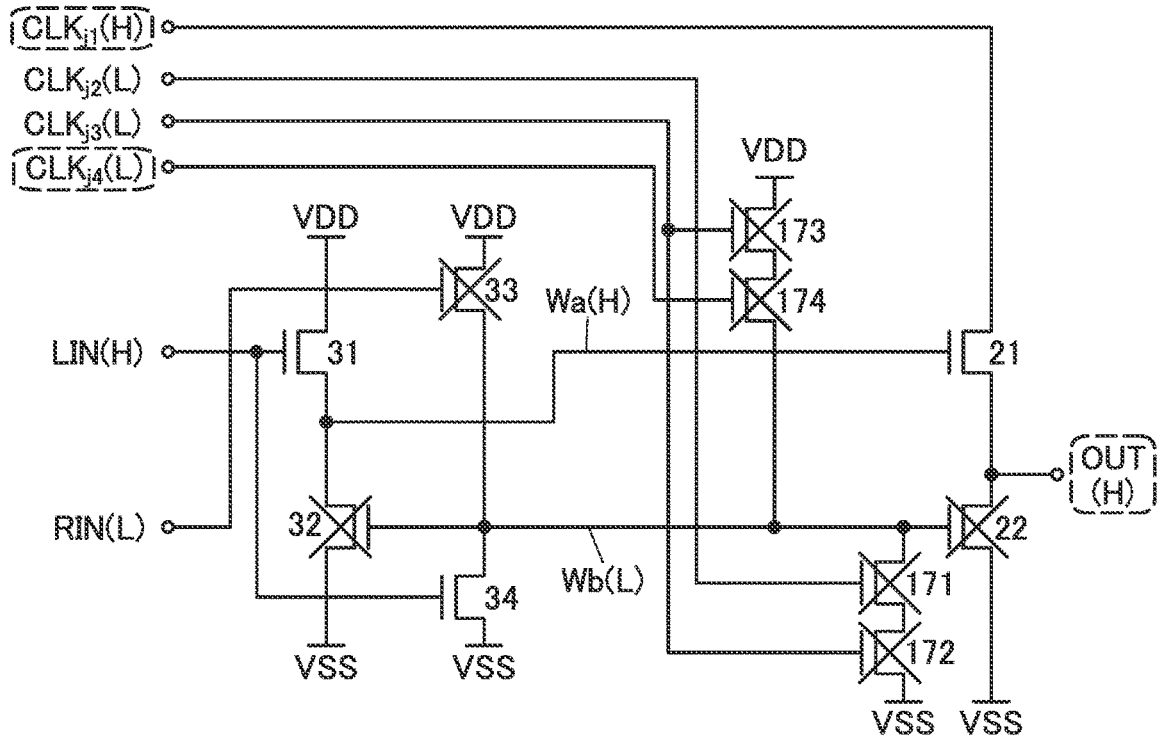

FIG. 15B is a circuit diagram illustrating the state of the sequential circuit 110a from Time T202 to Time T203. In FIG. 15B, a signal whose potential is changed from that from Time T201 to Time T202 is surrounded by a dashed line.

At Time T202, the potential of the clock signal $CLK_{j1}$ becomes a high potential and the potential of the clock signal $CLK_{j4}$ becomes a low potential. Since the potential of the wiring Wa is a high potential and the transistor 21 is in an on state, the potential of the signal OUT becomes a high potential when the potential of the clock signal $CLK_{j1}$ becomes a high potential.

Figure 16A:
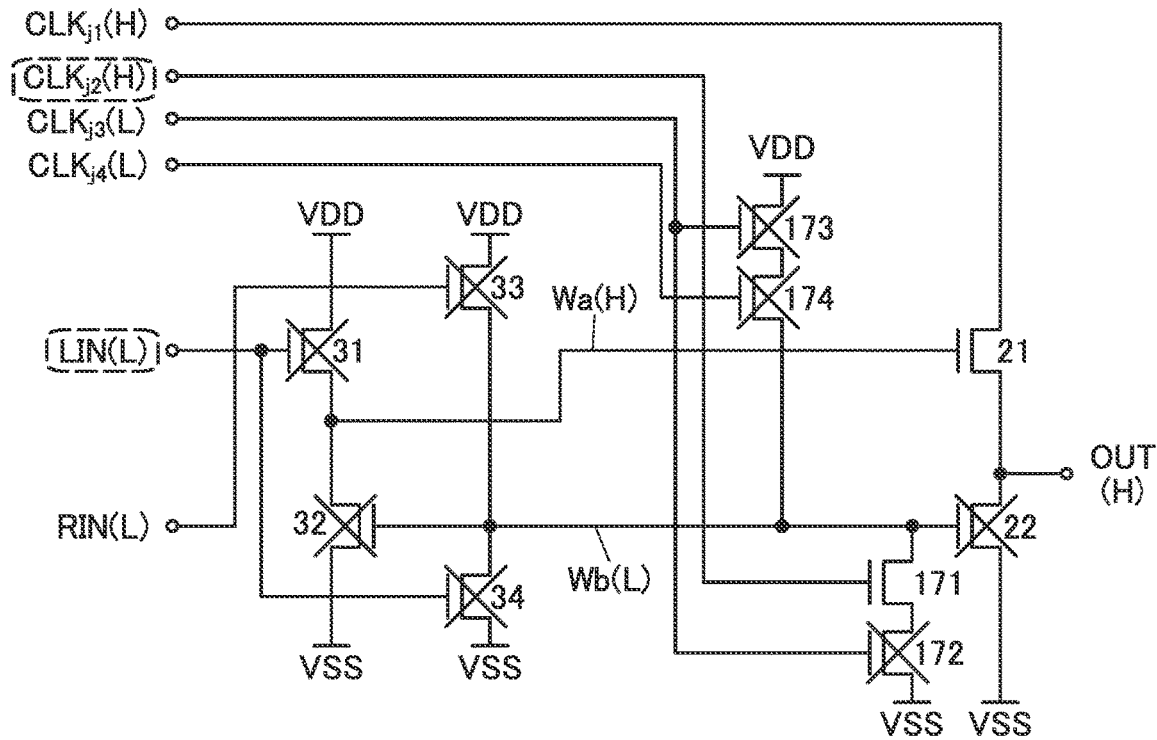
FIG. 16A and FIG. 16B are diagrams illustrating an example of a driving method of a sequential circuit.

FIG. 16A is a circuit diagram illustrating the state of the sequential circuit 110a from Time T203 to Time T204. In FIG. 16A, a signal whose potential is changed from that from Time T202 to Time T203 is surrounded by a dashed line.

At Time T203, the potential of the signal LIN becomes a low potential. Furthermore, the potential of the clock signal $CLK_{j2}$ becomes a high potential and the potential of the clock signal $CLK_{j5}$ becomes a low potential. Since the potential of the signal LIN becomes a low potential, the transistor 31 is brought into an off state; thus, the wiring Wa is brought into a floating state whereas the transistor 21 remains in an on state. The potential of the clock signal $CLK_{j1}$ is a high potential continuously from Time T202 to Time T203. Accordingly, the potential of the signal OUT is a high potential continuously from Time T202 to Time T203. Since the potential of the clock signal $CLK_{j2}$ becomes a high potential, the transistor 171 is brought into an on state.

Figure 16B:
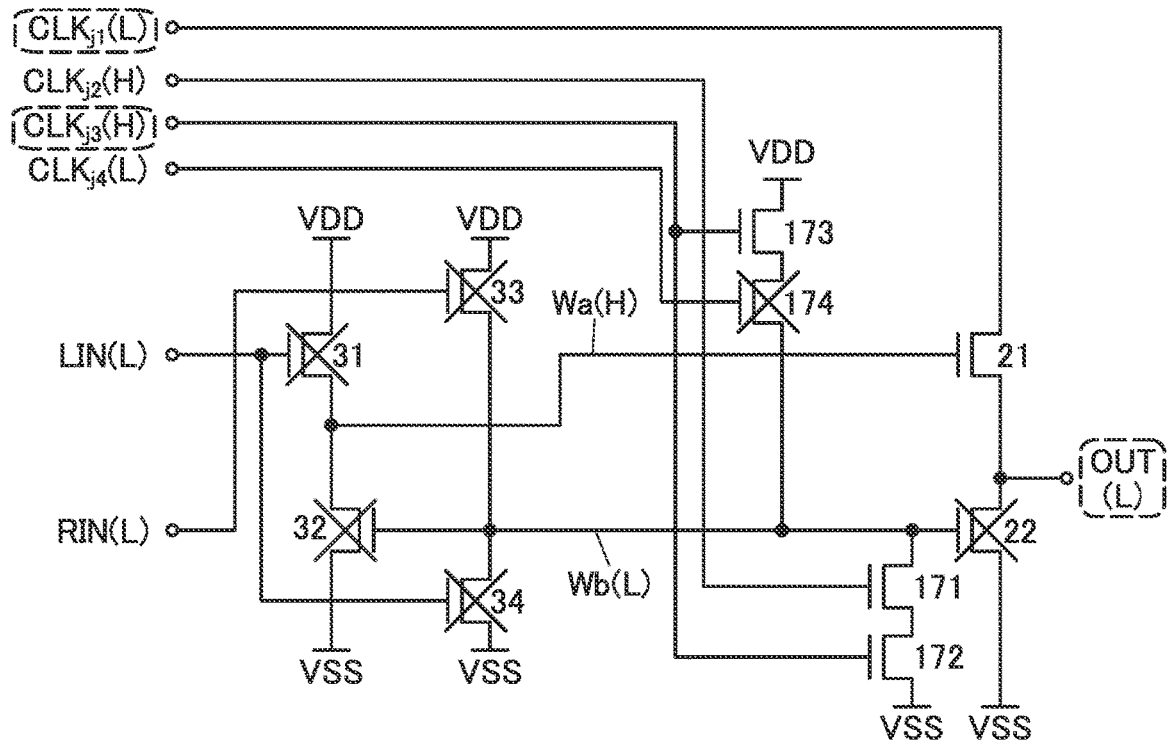

FIG. 16B is a circuit diagram illustrating the state of the sequential circuit 110a from Time T204 to Time T205. In FIG. 16B, a signal whose potential is changed from that from Time T203 to Time T204 is surrounded by a dashed line.

At Time T204, the potential of the clock signal $CLK_{j1}$ becomes a low potential and the potential of the clock signal $CLK_{j3}$ becomes a high potential. Since the transistor 21 remains in an on state from Time T203 to Time T204, the potential of the signal OUT becomes a low potential when the potential of the clock signal $CLK_{j1}$ becomes a low potential.

From Time T204 to Time T205, the potential of the clock signal $CLK_{j3}$ becomes a high potential, whereby the transistor 172 and the transistor 173 are brought into an on state. Since the clock signal $CLK_{j2}$ is at a high potential continuously from Time T203 to Time T204, the transistor 171 is in an on state. When the transistor 171 and the transistor 172 are brought into an on state, a low potential is supplied to the wiring Wb.

Figure 17A:
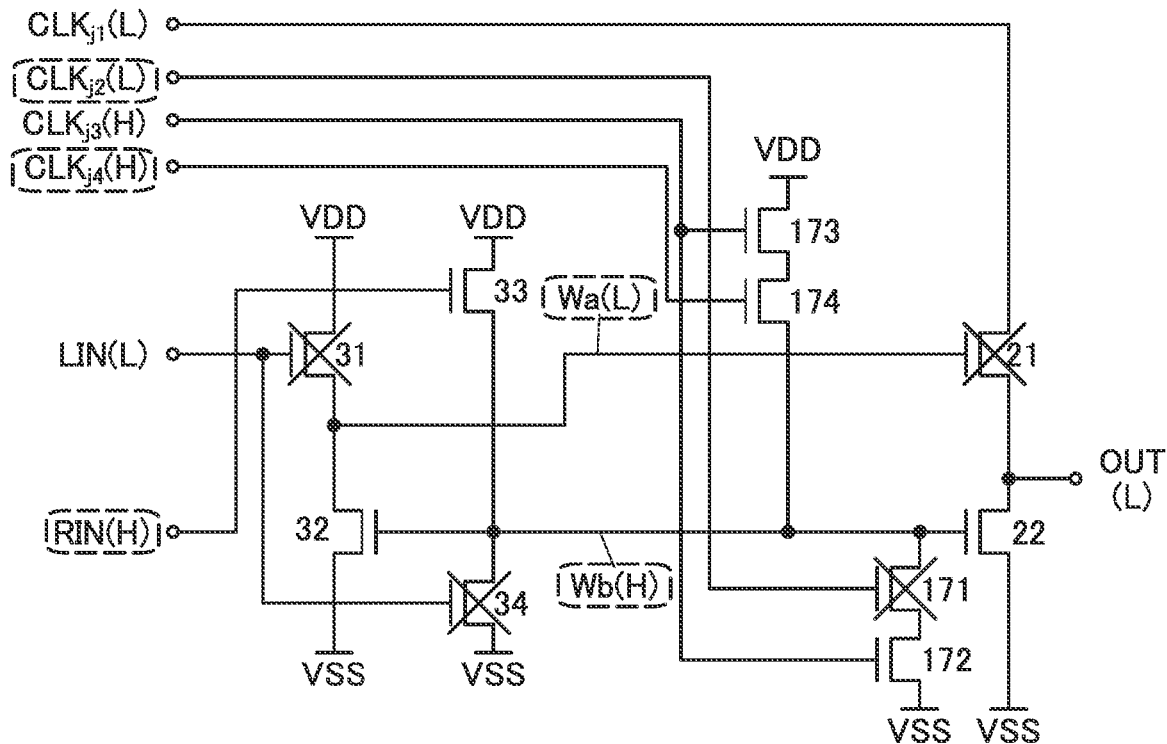
FIG. 17A and FIG. 17B are diagrams illustrating an example of a driving method of a sequential circuit.

FIG. 17A is a circuit diagram illustrating the state of the sequential circuit 110a from Time T205 to Time T206. In FIG. 17A, a signal whose potential is changed from that from Time T204 to Time T205 is surrounded by a dashed line.

At Time T205, the potential of the signal RIN becomes a high potential. Furthermore, the potential of the clock signal $CLK_{j2}$ becomes a low potential and the potential of the clock signal $CLK_{j4}$ becomes a high potential. Since the potential of the signal RIN becomes a high potential, the transistor 33 is brought into an on state, and since the potential of the clock signal $CLK_{j4}$ becomes a high potential, the transistor 174 is brought into an on state. Since the clock signal $CLK_{j3}$ is at a high potential continuously from Time T204 to Time T205, the transistor 173 is in an on state. Furthermore, since the potential of the clock signal $CLK_{j2}$ becomes a low potential, the transistor 171 is brought into an off state.

Accordingly, the potential of the wiring Wb becomes a high potential. As a result, the transistor 22 and the transistor 32 are brought into an on state. Since the transistor 32 is brought into an on state, the potential of the wiring Wa becomes a low potential; as a result, the transistor 21 is brought into an off state. When the transistor 21 is brought into an off state and the transistor 22 is brought into an on state, the potential of the signal OUT becomes a low potential regardless of the potential of the clock signal $CLK_{j1}$.

Figure 17B:
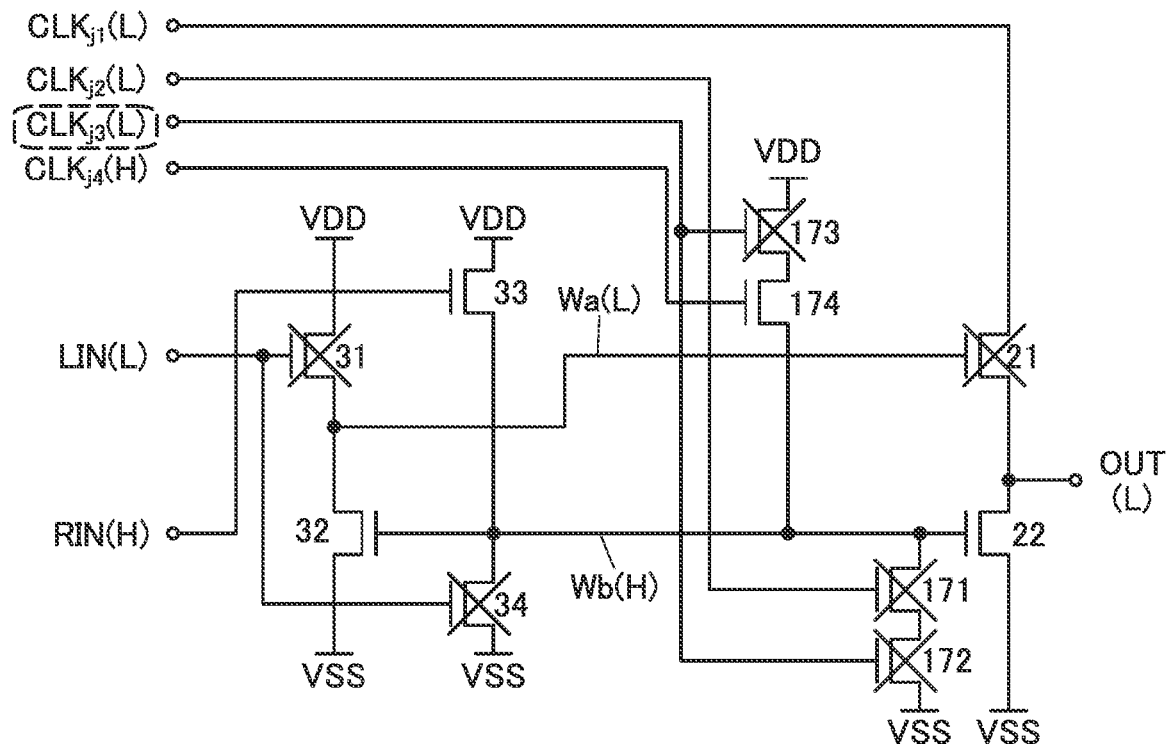

FIG. 17B is a circuit diagram illustrating the state of the sequential circuit 110a from Time T206 to Time T207. In FIG. 17B, a signal whose potential is changed from that from Time T205 to Time T206 is surrounded by a dashed line.

At Time T206, the clock signal $CLK_{j3}$ is at a low potential and the clock signal $CLK_{j5}$ is at a high potential. Since the clock signal $CLK_{j3}$ is at a low potential, the transistor 172 and the transistor 173 are brought into an off state. When the transistor 173 is brought into an off state, the wiring Wb is brought into a floating state.

Figure 18A:
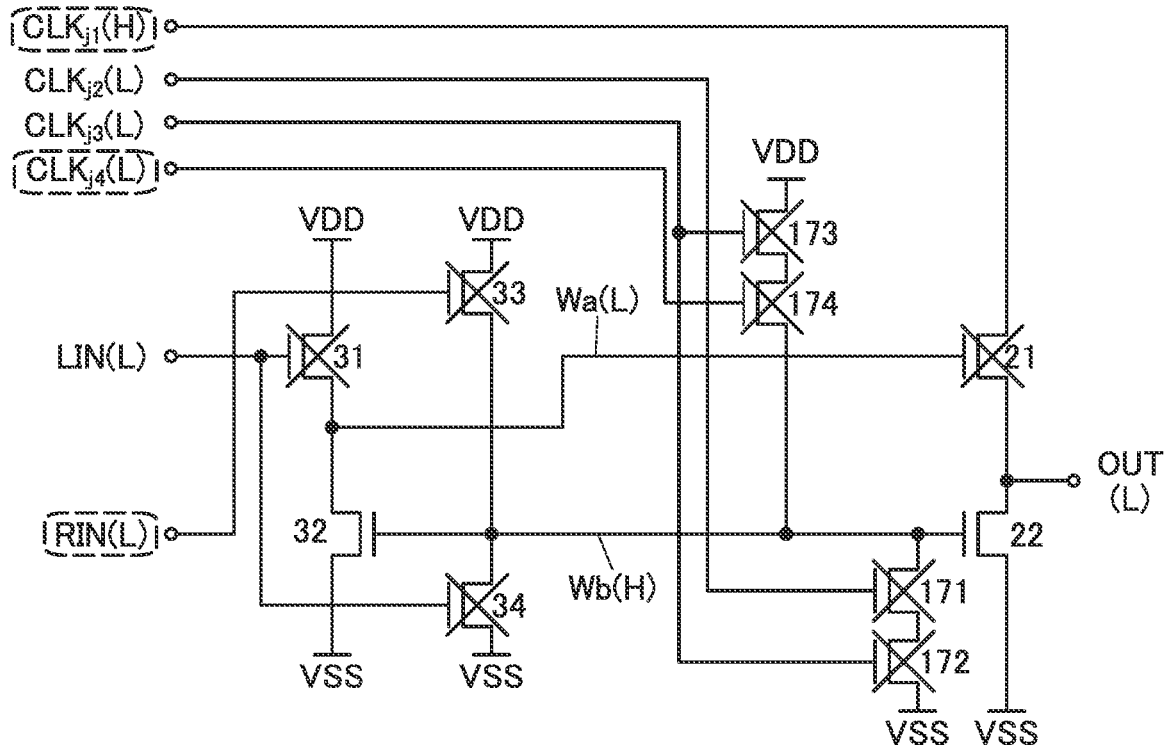
FIG. 18A and FIG. 18B are diagrams illustrating an example of a driving method of a sequential circuit.

FIG. 18A is a circuit diagram illustrating the state of the sequential circuit 110a from Time T207 to Time T208. In FIG. 18A, a signal whose potential is changed from that from Time T206 to Time T207 is surrounded by a dashed line.

At Time T207, the potential of the signal RIN becomes a low potential. Furthermore, the potential of the clock signal $CLK_{j1}$ becomes a high potential and the potential of the clock signal $CLK_{j4}$ becomes a low potential. Since the potential of the signal RIN becomes a low potential, the transistor 33 is brought into an off state, and since the potential of the clock signal $CLK_{j4}$ becomes a low potential, the potential of the transistor 174 is brought into an off state.

Figure 18B:
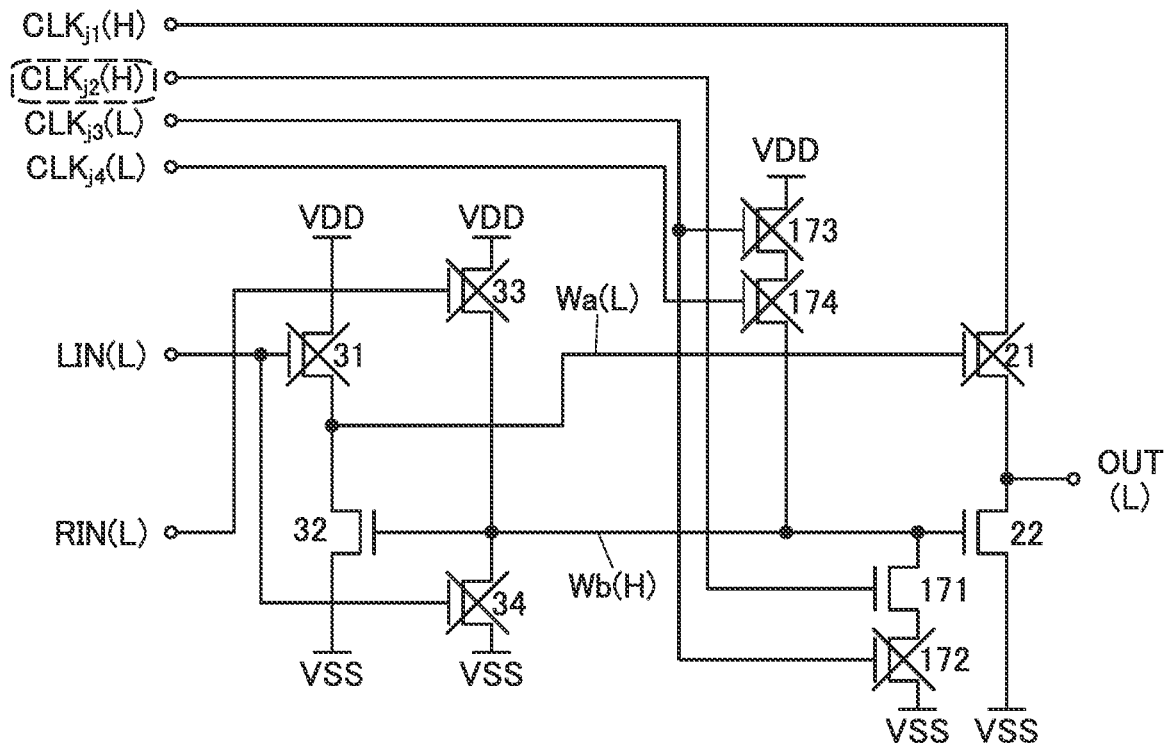

FIG. 18B is a circuit diagram illustrating the state of the sequential circuit 110a from Time T208 to Time T209. In FIG. 18B, a signal whose potential is changed from that from Time T207 to Time T208 is surrounded by a dashed line.

At Time T208, the potential of the clock signal $CLK_{j2}$ becomes a high potential and the potential of the clock signal $CLK_{j5}$ becomes a low potential. Since the potential of the clock signal $CLK_{j2}$ becomes a high potential, the transistor 171 is brought into an on state.

Figure 19A:
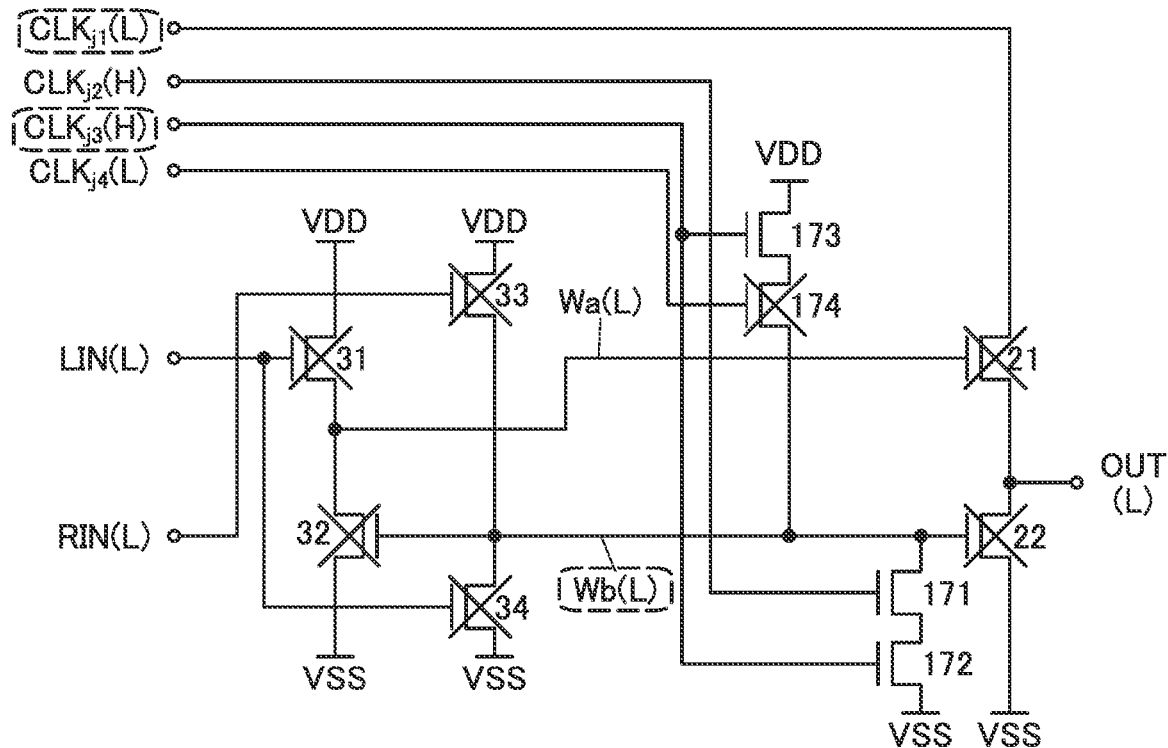
FIG. 19A and FIG. 19B are diagrams illustrating an example of a driving method of a sequential circuit.

FIG. 19A is a circuit diagram illustrating the state of the sequential circuit 110a from Time T209 to Time T210. In FIG. 19A, a signal whose potential is changed from that from Time T208 to Time T209 is surrounded by a dashed line.

At Time T209, the potential of the clock signal $CLK_{j1}$ becomes a low potential and the potential of the clock signal $CLK_{j3}$ becomes a high potential. Since the potential of the clock signal $CLK_{j3}$ becomes a high potential, the transistor 172 and the transistor 173 are brought into an on state. Since the clock signal $CLK_{j2}$ is at a high potential continuously from Time T208 to Time T209, the transistor 171 is in an on state. When the transistor 171 and the transistor 172 are brought into an on state, the potential of the wiring Wb becomes a low potential. Accordingly, the transistor 22 and the transistor 32 are brought into an off state.

Figure 19B:
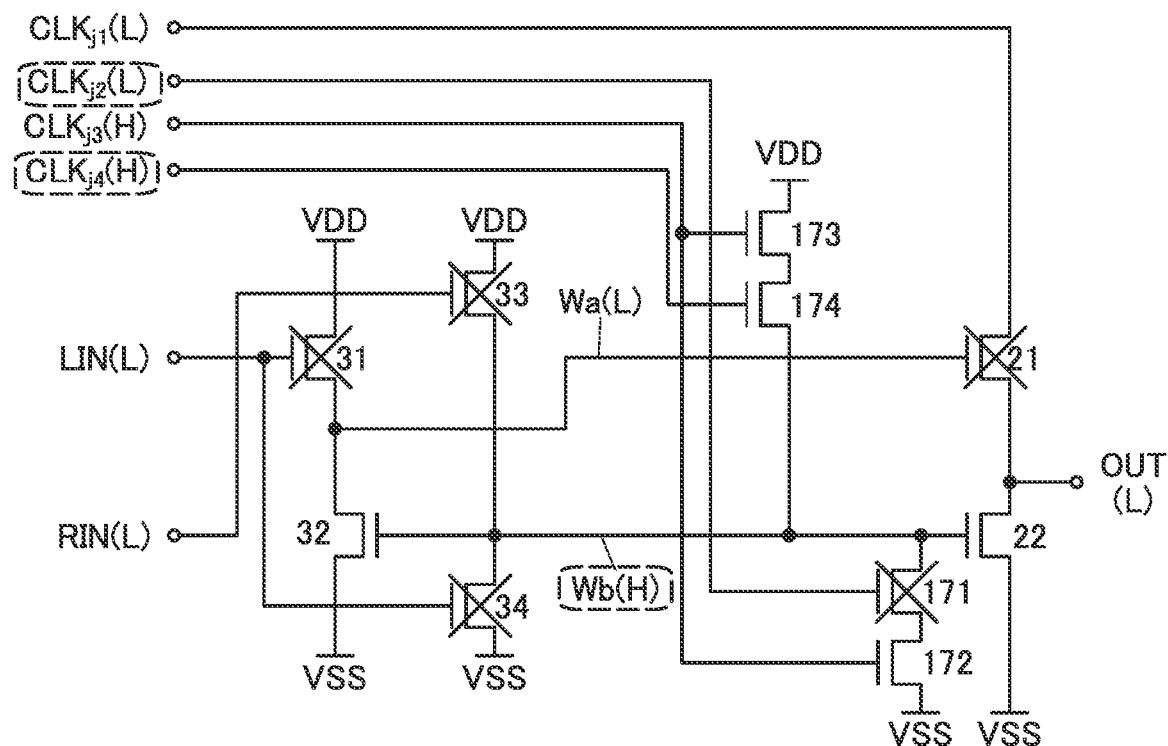

FIG. 19B is a circuit diagram illustrating the state of the sequential circuit 110a from Time T210 to Time T211. In FIG. 19B, a signal whose potential is changed from that from Time T209 to Time T210 is surrounded by a dashed line.

At Time T210, the potential of the clock signal $CLK_{j2}$ becomes a low potential and the potential of the clock signal $CLK_{j4}$ becomes a high potential. Since the potential of the clock signal $CLK_{j2}$ becomes a low potential, the transistor 171 is brought into an off state, and since the potential of the clock signal $CLK_{j4}$ becomes a high potential, the transistor 174 is brought into an on state. Since the clock signal $CLK_{j3}$ is at a high potential continuously from Time T209 to Time T210, the transistor 172 and the transistor 173 are in an on state. When the transistor 171 is brought into an on state and the transistor 173 and the transistor 174 are in an on state, the potential of the wiring Wb becomes a high potential. Accordingly, the transistor 22 and the transistor 32 are brought into an off state.

At Time T211, the potential of the clock signal $CLK_{j3}$ becomes a low potential and the potential of the clock signal $CLK_{j5}$ becomes a high potential. Since the potential of the clock signal $CLK_{j3}$ becomes a low potential, the transistor 172 and the transistor 173 are brought into an off state. When the transistor 173 is brought into an off state, the wiring Wb is brought into a floating state.

From Time T212 to Time T217, the sequential circuit 110a performs operations similar to those from Time T207 to Time T212. The operations similar to those from Time T207 to Time T212 are repeated until the sequential circuit 110a in the last stage outputs the signal OUT at a high potential, for example. Note that the operations similar to those from Time T207 to Time T212 are also performed before Time T201.

When the transistor 173 and the transistor 174 are provided in the circuit 111a, the potential of the wiring Wb can be a high potential in a period during which the clock signal $CLK_{j1}$ is at a high potential in a period during which the potential of the wiring Wa is a low potential. Accordingly, an increase in the potential of the wiring Wa by the bootstrap effect due to the change of the clock signal $CLK_{j1}$ from a low potential to a high potential can be inhibited. This can inhibit an increase in the potential of the signal OUT, which is caused when the transistor 21 is unintentionally brought into an on state. Thus, a malfunction of the shift register circuit 40 can be prevented. Accordingly, the shift register circuit 40 can be a highly reliable semiconductor device.

The above is an example of the driving method of the sequential circuit 110a.

The sequential circuit 110 which is the semiconductor device of one embodiment of the present invention includes the transistor 171 and the transistor 172, and the transistor 171 and the transistor 172 are connected to each other in series. Furthermore, clock signals whose parts of periods during which the signals are at high potentials overlap with each other are input to the gate of the transistor 171 and the gate of the transistor 172. Accordingly, the potential of the wiring Wb becomes a low potential in a certain cycle after Time T205 as shown in FIG. 14B. Furthermore, although not shown in FIG. 14B, the potential of the wiring Wb becomes a low potential in a certain cycle before Time T201. In FIG. 14B, a period during which the potential of the wiring Wb becomes a low potential after Time T205 is surrounded by a dashed line.

When the potential of the wiring Wb becomes a low potential in a certain cycle as described above, a period during which voltage stress is applied between the gate and the source of the transistor 22 and between a gate and a source of the transistor 32 can be short as compared to the case where the potential of the wiring Wb is a high potential for a long time. Accordingly, changes in electrical characteristics of the transistor 22 and the transistor 32, for example, changes in threshold voltages, can be inhibited. Thus, the sequential circuit 110 can be a highly reliable semiconductor device.

Note that the signal input to the gate of the transistor 171 and the signal input to the gate of the transistor 172 are not necessarily clock signals. For example, a signal whose potential is controlled independently of other signals may be input to each of the gate of the transistor 171 and the gate of the transistor 172. In that case, the period during which the potential of the wiring Wb is a low potential can be long, for example, and accordingly, the period during which voltage stress is applied between the gate and the source of the transistor 22 and between the gate and the source of the transistor 32 can be shortened. Thus, the reliability of the sequential circuit 110 can be further increased.

As described above, a plurality of clock signals input to the sequential circuit 110 can be signals whose parts of periods during which the signals are at high potentials overlap with one another. In that case, the wiring Wa can be prevented from being in a floating state at the time when the potential of the signal OUT changes from a low potential to a high potential. The potential of the wiring Wb can be controlled by an AND circuit. For example, the potential of the wiring Wb can be controlled by an AND circuit including the transistor 171 and the transistor 172 and an AND circuit including the transistor 173 and the transistor 174 on the basis of the clock signal $CLK_{j2}$ to the clock signal $CLK_{j4}$. In the above manner, a malfunction of the semiconductor device of one embodiment of the present invention can be prevented and the reliability of the semiconductor device of one embodiment of the present invention can be increased.

Configuration Example_7 of Sequential Circuit

Figure 20:
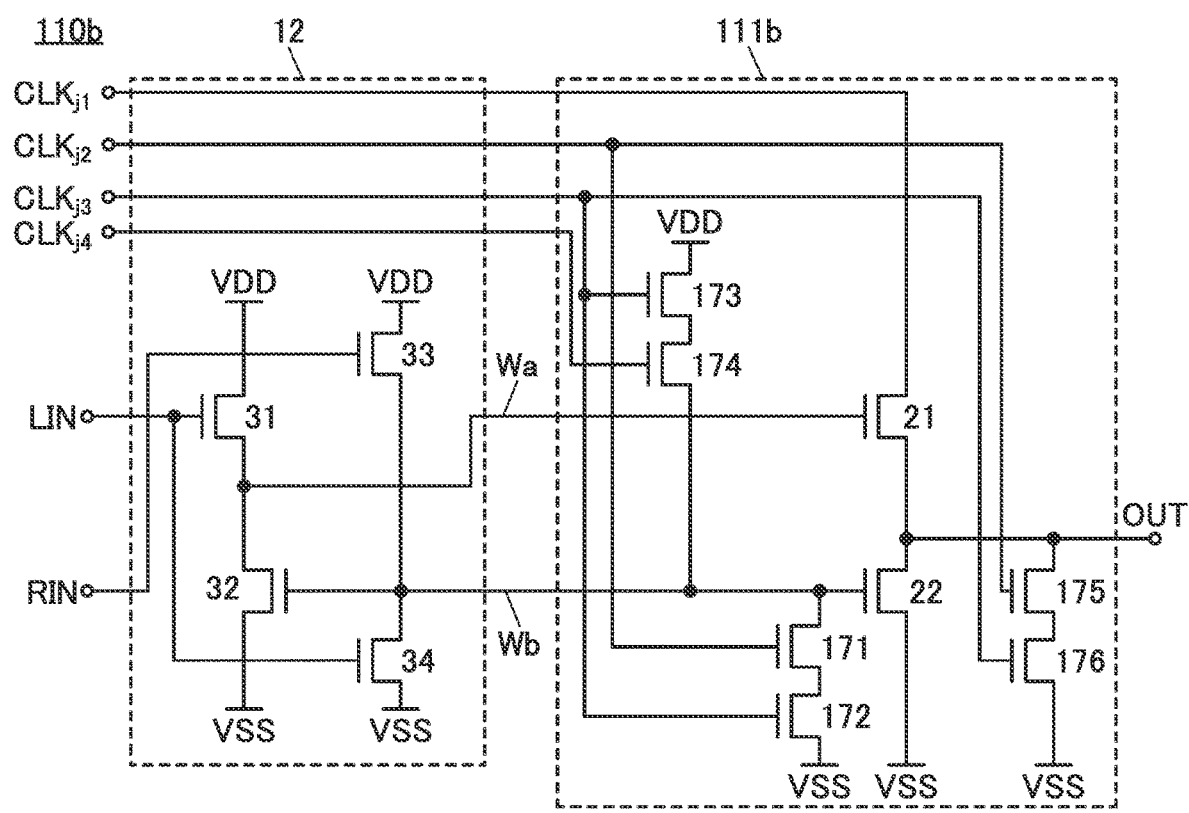
FIG. 20 is a diagram illustrating a configuration example of a sequential circuit.

FIG. 20 is a circuit diagram illustrating a configuration example of a sequential circuit 110b applicable to the sequential circuits 110. The sequential circuit 110b includes a circuit 111b and the circuit 12. The circuit 111b is a modification example of the circuit 111a and is different from the circuit 111a in that a transistor 175 and a transistor 176 are included.

One of a source and a drain of the transistor 175 is electrically connected to one of a source and a drain of the transistor 21 and one of a source and a drain of the transistor 22. The other of the source and the drain of the transistor 175 is electrically connected to one of a source and a drain of the transistor 176. The clock signal $CLK_{j2}$ is input to a gate of the transistor 175. The clock signal $CLK_{j3}$ is input to a gate of the transistor 176.

A low potential is supplied to the other of the source and the drain of the transistor 176. Thus, when the potential supplied to the other of the source and the drain of the transistor 176 is referred to as an eighth potential, the difference between the first potential and the eighth potential and the difference between the second potential and the eighth potential in the sequential circuit 110b are smaller than the difference between the third potential and the eighth potential in the sequential circuit 110b. The eighth potential in the sequential circuit 110b can be an inversion potential of the third potential in the sequential circuit 110b.

The sequential circuit 110b can be driven by a method similar to the method shown in FIG. 14B, for example. In that case, as in the sequential circuit 10b, a malfunction of the shift register circuit 140 caused when the potential of the signal OUT becomes an unintended potential can be prevented. Hence, the shift register circuit 140 can be a highly reliable semiconductor device.

Configuration Example_8 of Sequential Circuit

FIG. 21 is a circuit diagram illustrating a configuration example of a sequential circuit 110c applicable to the sequential circuits 110. The sequential circuit 110c includes a circuit 111c and the circuit 12. The circuit 111c is a modification example of the circuit 111a and is different from the circuit 111a in that the transistor 26 and the capacitor 27 are included.

As in the circuit 11c, one of a source and a drain of the transistor 21 is electrically connected to one of a source and a drain of the transistor 22 and one electrode of the capacitor 27. One of a source and a drain of the transistor 26 is electrically connected to the circuit 12 through the wiring Wa. The other of the source and the drain of the transistor 26 is electrically connected to a gate of the transistor 21. The gate of the transistor 21 is electrically connected to the other electrode of the capacitor 27. As described above, a node to which the gate of the transistor 21, the other of the source and the drain of the transistor 26, and the other electrode of the capacitor 27 are electrically connected is referred to as the node N. A high potential can be supplied to the gate of the transistor 26.

Driving Method Example_4 of Sequential Circuit

Figure 21A:
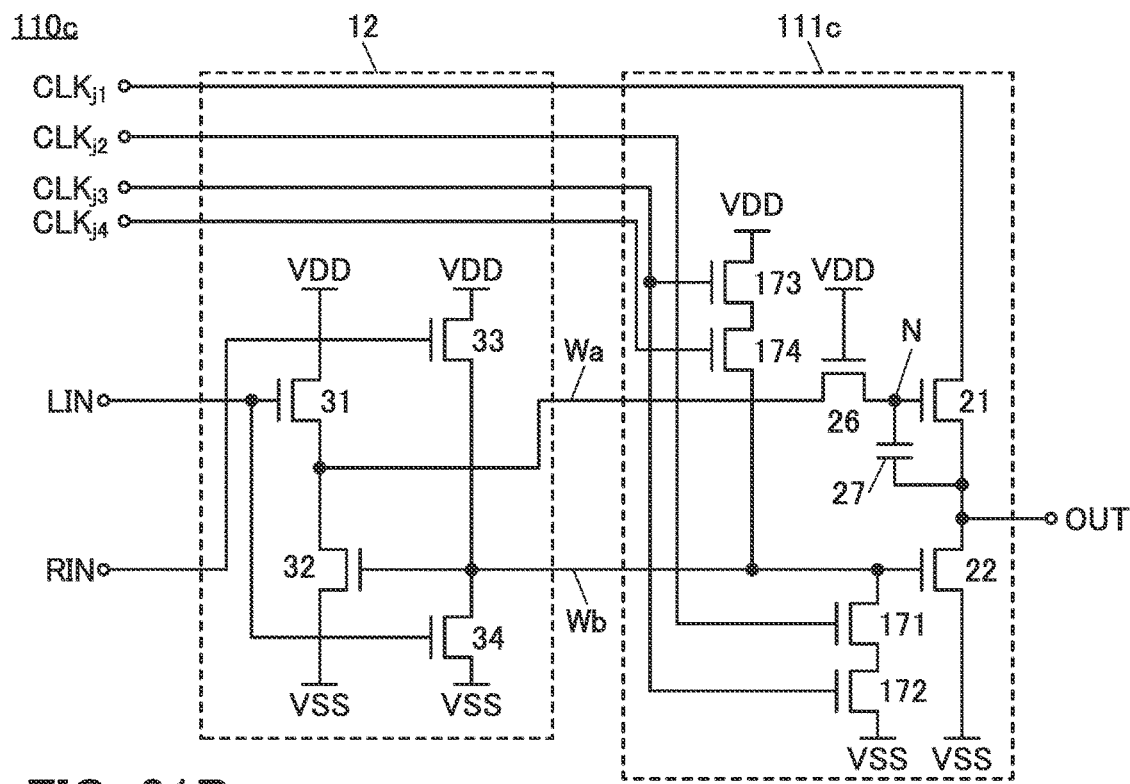
FIG. 21A is a diagram illustrating a configuration example of a sequential circuit.
Figure 21B:
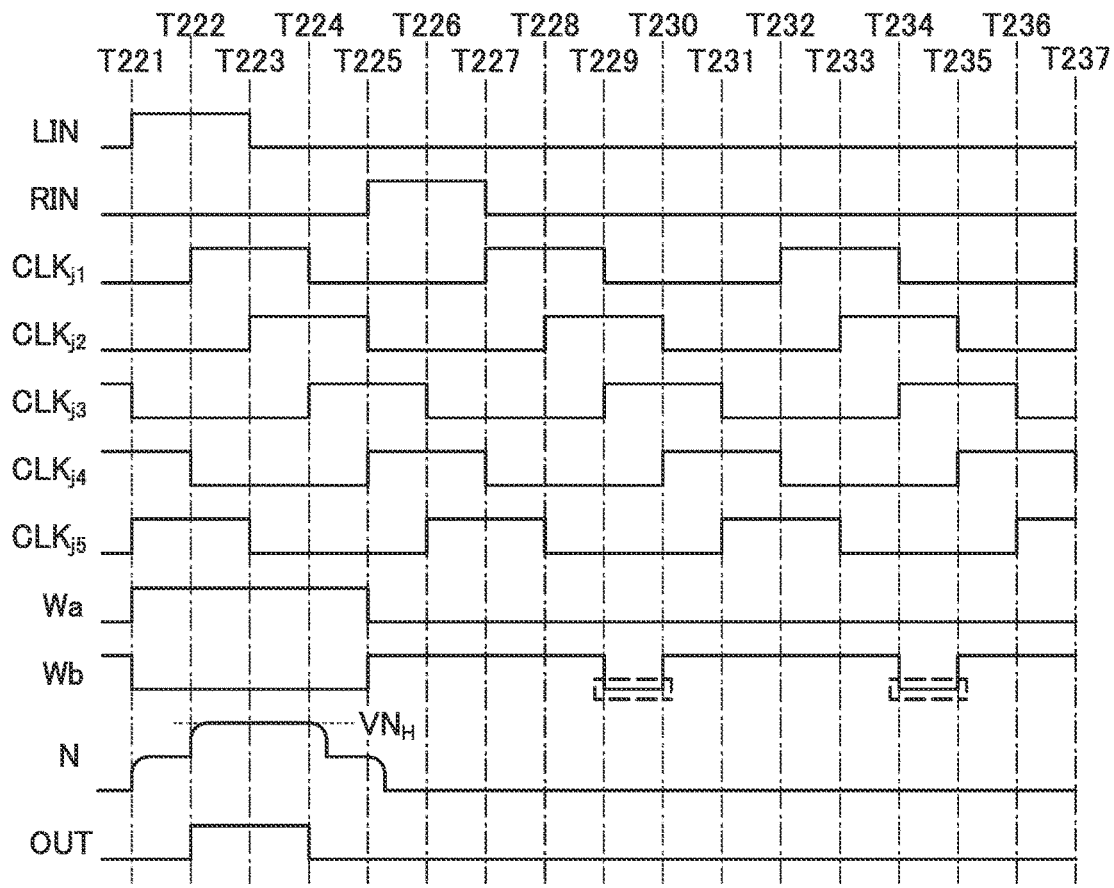
FIG. 21B is a timing chart showing an example of a driving method of the sequential circuit.

FIG. 21B is a timing chart showing an example of a driving method of the sequential circuit 110c illustrated in FIG. 21A. FIG. 21B shows a change in potential of the node N in addition to the potential changes of the signals and the wirings shown in FIG. 14B.

Changes in potentials of the signal LIN, the signal RIN, the clock signal $CLK_{j1}$ to the clock signal $CLK_{j5}$, the wiring Wa, the wiring Wb, and the signal OUT from Time T221 to Time T237 are similar to the changes in potentials from Time T201 to Time T217 shown in FIG. 14B. The potential of the node N before Time T221 is a low potential.

At Time T221, the signal LIN becomes a high potential and the transistor 31 is brought into an on state, whereby the potential of the wiring Wa becomes a high potential. Accordingly, the potential of the node N increases to a potential that is lower than the potential of the wiring Wa by the threshold voltage of the transistor 26 from Time T221 to Time T222.

At Time T222, the potential of the clock signal $CLK_{j1}$ changes from a low potential to a high potential. As a result, the potential of the node N increases by the bootstrap effect. Accordingly, the transistor 26 is brought into an off state and the node N is brought into a floating state. Here, the potential of the node N at Time T223 is referred to as the potential $VN_H$.

In the case where the potential of the node N is the potential $VN_H$, the transistor 26 is in an off state. Thus, an increase in the potential of the wiring Wa from Time T222 to Time T224 can be inhibited. As a result, application of a high voltage to the transistor 31 and the transistor 32 can be inhibited. Accordingly, the sequential circuit 110c can be a highly reliable semiconductor device.

At Time T224, the clock signal $CLK_{j1}$ becomes a low potential. Accordingly, the potential of the node N decreases from Time T224 to Time T225. For example, the potential of the node N decreases to a potential substantially equal to that from Time T221 to Time T222.

At Time T225, the potential of the wiring Wb becomes a high potential and the transistor 32 is brought into an on state, whereby the potential of the wiring Wa becomes a low potential. Accordingly, the potential difference between the gate and the source of the transistor 26 becomes higher than or equal to the threshold voltage of the transistor 26, which brings the transistor 26 into an on state. In this manner, the potential of the node N becomes a low potential from Time T225 to Time T226. The potential of the node N is a low potential also after Time T226. The above is an example of the driving method of the sequential circuit 110c.

Configuration Example_9 of Sequential Circuit

Figure 22A:
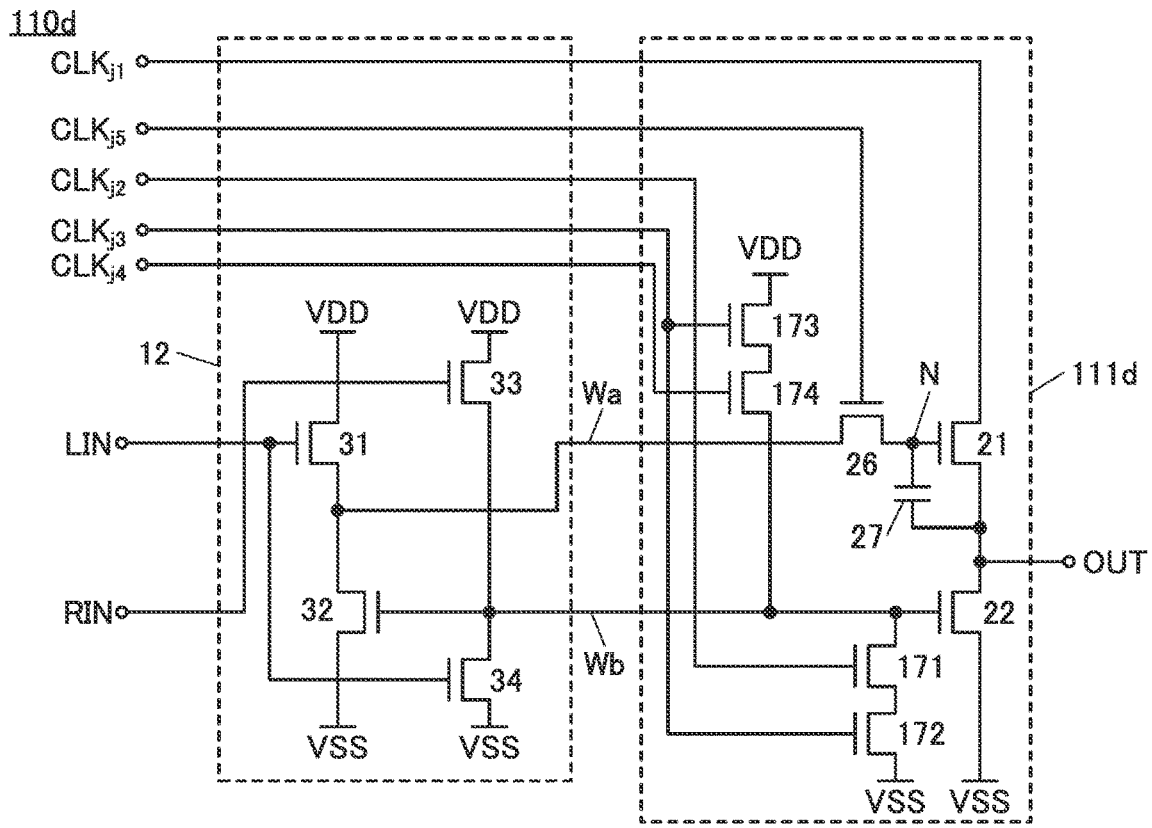
FIG. 22A and FIG. 22B are diagrams illustrating configuration examples of sequential circuits.

FIG. 22A is a circuit diagram illustrating a configuration example of a sequential circuit 110d applicable to the sequential circuits 110. The sequential circuit 110d includes a circuit 111d and the circuit 12. The circuit 111d is a modification example of the circuit 111c and is different from the circuit 111c in that the clock signal $CLK_{j5}$ is input to a gate of the transistor 26.

When the clock signal $CLK_{j5}$ is input to the gate of the transistor 26, a period during which voltage stress is applied between the gate and a source of the transistor 26 can be shortened as in the circuit 11d. Accordingly, a change in electrical characteristics of the transistor 26, for example, a change in threshold voltage, can be inhibited. Thus, the sequential circuit 110d can be a highly reliable semiconductor device.

When a clock signal is input to the gate of the transistor 26 as in the sequential circuit 10d, the control of the driving of the sequential circuit 110 can be facilitated as compared to the case where a signal whose potential is controlled independently of other signals is input to the gate of the transistor 26. Note that the signal whose potential is controlled independently of other signals may be input to the gate of the transistor 26. In that case, a period during which the gate potential of the transistor 26 is a low potential can be long, for example, and accordingly, the period during which voltage stress is applied between the gate and the source of the transistor 26 can be shortened. Thus, the reliability of the sequential circuit 110d can be further increased.

Configuration Example_10 of Sequential Circuit

Figure 22B:
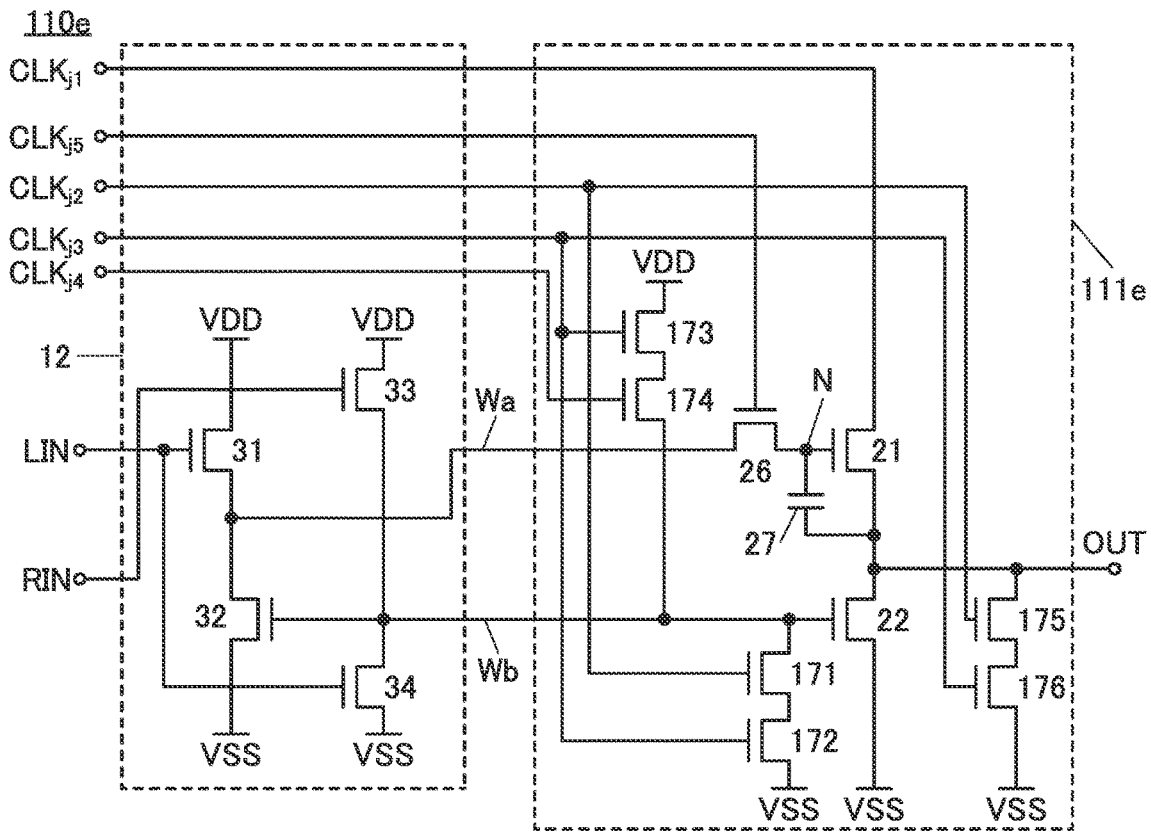

FIG. 22B is a circuit diagram illustrating a configuration example of a sequential circuit 110e applicable to the sequential circuits 110. The sequential circuit 110e includes a circuit 111e and the circuit 12. The circuit 111e is a modification example of the circuit 111d and is different from the circuit 111d in that the transistor 175 and the transistor 176 are included. The circuit 111e has a configuration in which the configuration of the circuit 111b and the configuration of the circuit 111d are combined.

Configuration Example_3 of Shift Register Circuit

Figure 23A:
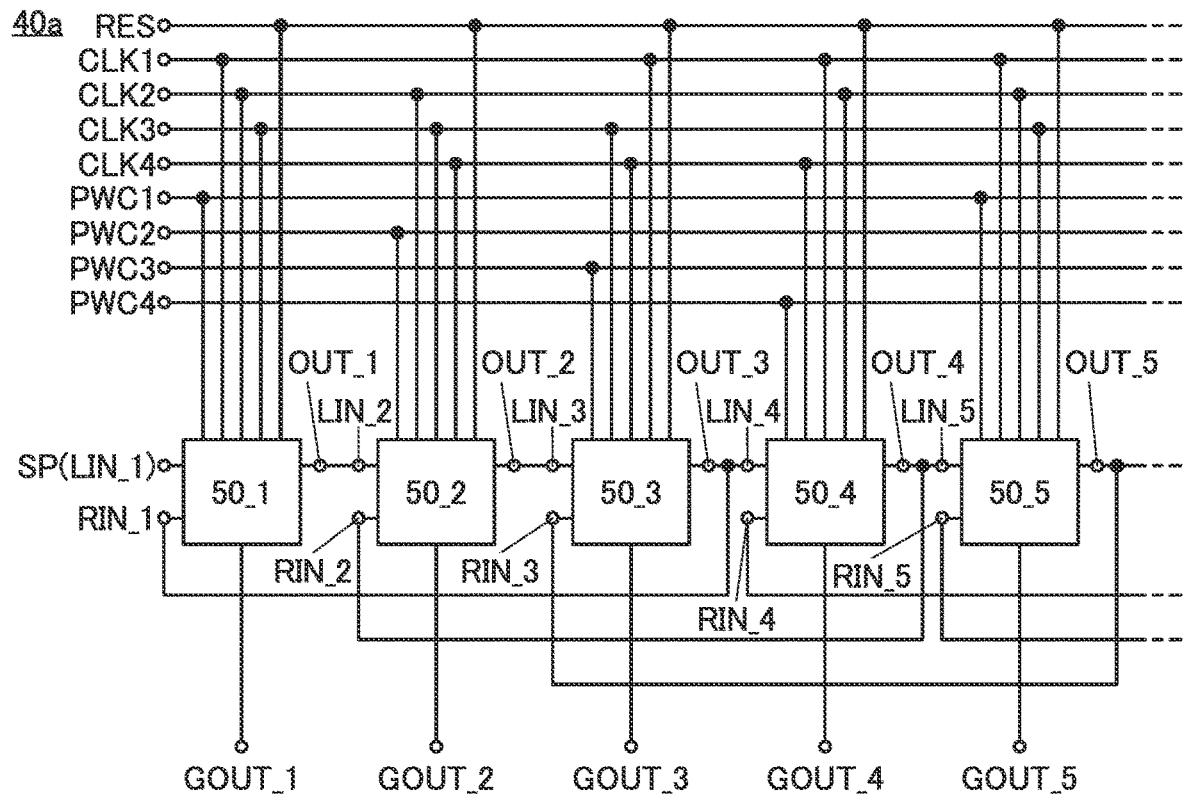
FIG. 23A is a diagram illustrating a configuration example of a shift register circuit.

FIG. 23A is a block diagram illustrating a configuration example of a shift register circuit 40a which is the semiconductor device of one embodiment of the present invention. FIG. 23A illustrates a sequential circuit 50_1 to a sequential circuit 50_5 instead of the sequential circuit 10_1 to the sequential circuit 10_5 illustrated in FIG. 1A.

A signal RES is input to each of the sequential circuits 50. Furthermore, a signal PWC1 to a signal PWC4 are input to each of the sequential circuits 50. For example, one of the signal PWC1, the signal PWC2, the signal PWC3, and the signal PWC4 is input to one sequential circuit 50.

For example, the signal PWC1 is input to the sequential circuit 50_1 and the sequential circuit 505, the signal PWC2 is input to the sequential circuit 502, the signal PWC3 is input to the sequential circuit 503, and the signal PWC4 is input to the sequential circuit 50_4. Furthermore, in the case where the signal PWC1 is input to a sequential circuit 50_n, for example, the signal PWC2 is input to a sequential circuit 50_n+1, the signal PWC3 is input to a sequential circuit 50_n+2, and the signal PWC4 is input to the sequential circuit 50_n+3.

A signal GOUT is output from each of the sequential circuits 50. Note that although the signal OUT and the signal GOUT are different signals in FIG. 23A, the signals may be the same.

Driving Method Example_3 of Shift Register Circuit

Figure 23B:
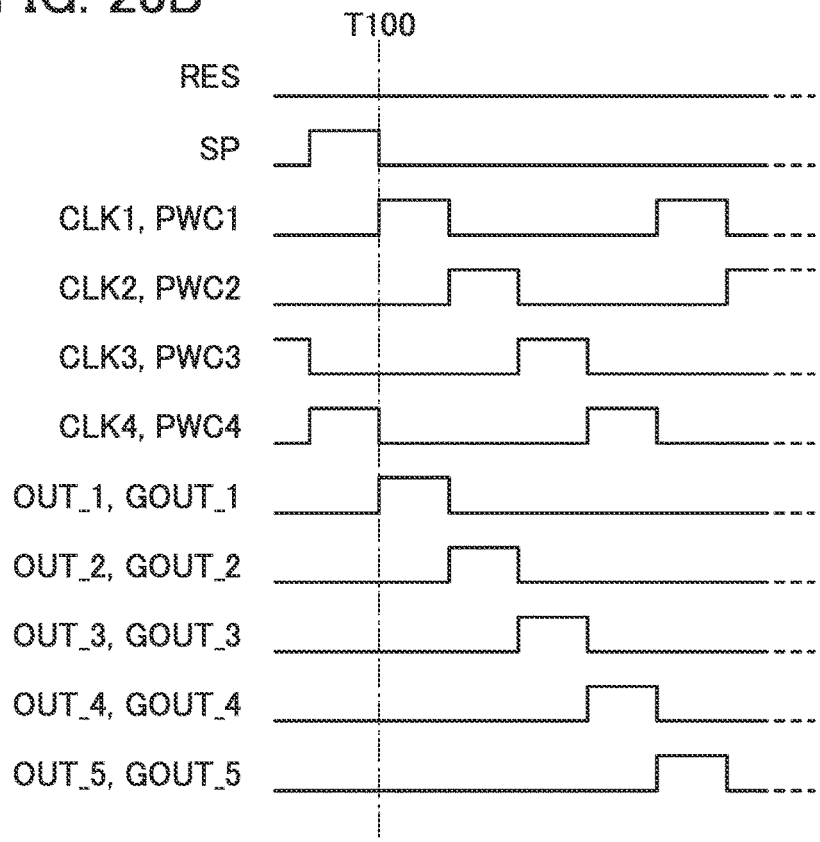
FIG. 23B is a timing chart showing an example of a driving method of the shift register circuit.

FIG. 23B is a timing chart showing an example of a driving method of the shift register circuit 40a. FIG. 23B shows changes in potentials of the signal RES, the start pulse signal SP, the clock signal CLK1 to the clock signal CLK4, and the signal OUT_1 to the signal OUT_5 from the top. Note that the signal PWC1 to the signal PWC4 have the same phases and cycles as those of the signal CLK1 to the signal CLK4, respectively; thus, these signals are collectively shown. Furthermore, the signal GOUT_1 to the signal GOUT_5 have the same phases as those of the signal OUT_1 to the signal OUT_5, respectively; thus, the signals are collectively shown. The amplitudes of the clock signal CLK1 to the clock signal CLK4 may be different from the amplitudes of the signal PWC1 to the signal PWC4. Furthermore, the amplitude of the signal OUT may be different from the amplitude of the signal GOUT.

The changes in potentials of the start pulse signal SP, the clock signal CLK1 to the clock signal CLK4, and the signal OUT_1 to the signal OUT_5 can be similar to the changes in potentials shown in FIG. 1B. The potential of the signal RES can be a low potential.

Configuration Example_4 of Shift Register Circuit

Figure 24A:
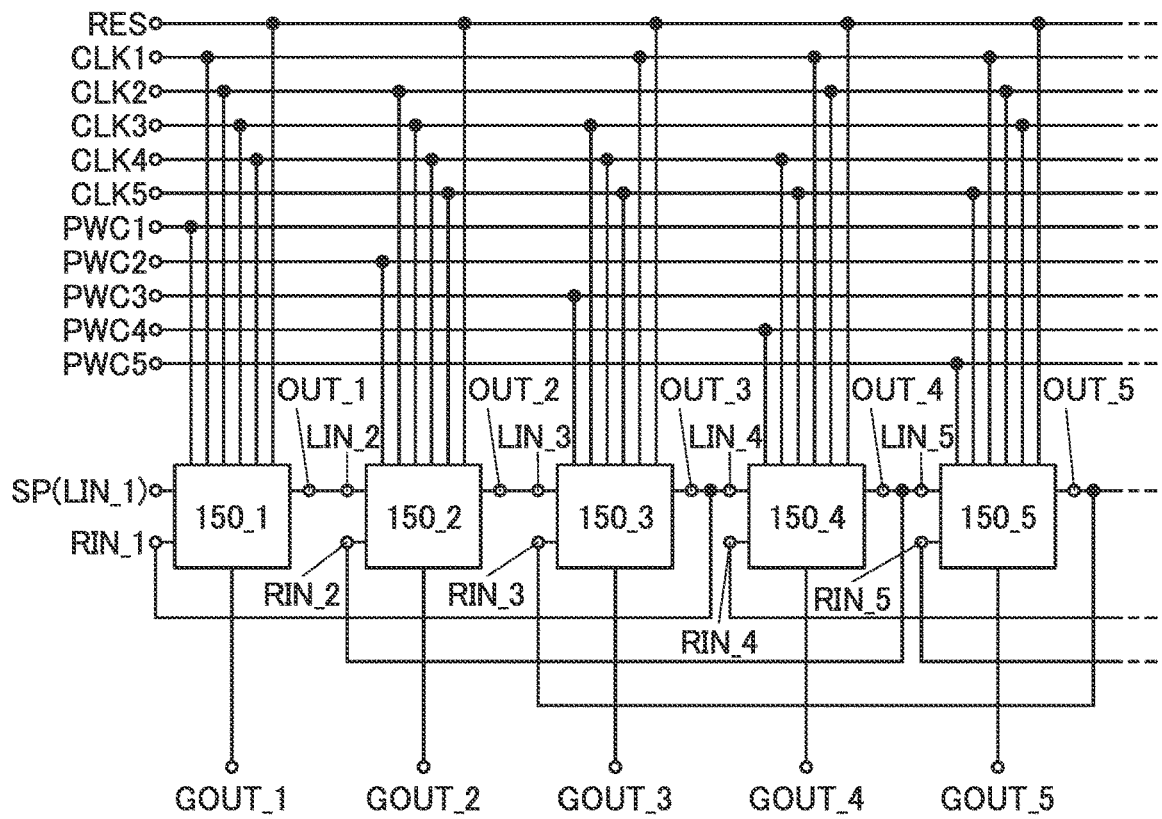
FIG. 24A is a diagram illustrating a configuration example of a shift register circuit.

FIG. 24A is a block diagram illustrating a configuration example of a shift register circuit 140a which is the semiconductor device of one embodiment of the present invention. FIG. 24A illustrates a sequential circuit 150_1 to a sequential circuit 150_5 instead of the sequential circuit 110_1 to the sequential circuit 110_5 illustrated in FIG. 12A.

The signal RES is input to each of the sequential circuits 150, as in the sequential circuits 50 illustrated in FIG. 23A. The signal PWC1 to a signal PWC5 are input to each of the sequential circuits 150. For example, one of the signal PWC1, the signal PWC2, the signal PWC3, the signal PWC4, and the signal PWC5 is input to one sequential circuit 150.

For example, the signal PWC1 is input to the sequential circuit 150_1, the signal PWC2 is input to the sequential circuit 1502, the signal PWC3 is input to the sequential circuit 150_3, the signal PWC4 is input to the sequential circuit 1504, and the signal PWC5 is input to the sequential circuit 150_5. Furthermore, in the case where the signal PWC1 is input to a sequential circuit 150_n, for example, the signal PWC2 is input to a sequential circuit 150_n+1, the signal PWC3 is input to a sequential circuit 150_n+2, the signal PWC4 is input to a sequential circuit 150_n+3, and the signal PWC5 is input to a sequential circuit 150_n+4.

The sequential circuits 150 each output the signal GOUT like the sequential circuits 50. Note that as in the shift register circuit 40a, the signal OUT and the signal GOUT may be the same signals.

Driving Method Example_4 of Shift Register Circuit

Figure 24B:
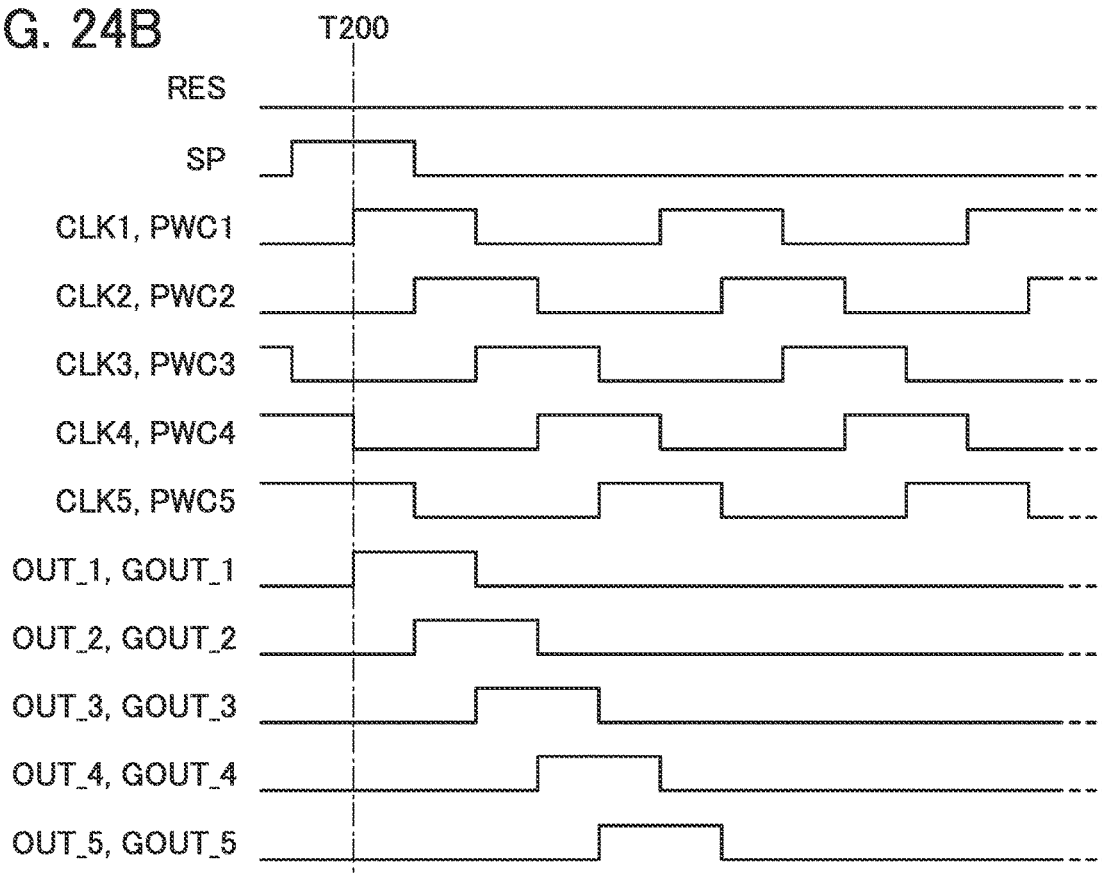
FIG. 24B is a timing chart showing an example of a driving method of the shift register circuit.

FIG. 24B is a timing chart showing an example of a driving method of the shift register circuit 140a. FIG. 24B shows changes in potentials of the signal RES, the start pulse signal SP, the clock signal CLK1 to the clock signal CLK5, and the signal OUT_1 to the signal OUT_5 from the top. Note that the signal PWC1 to the signal PWC5 have the same phases and cycles as those of the signal CLK1 to the signal CLK5, respectively; thus, these signals are collectively shown. Furthermore, as in the shift register circuit 40a, the signal GOUT_1 to the signal GOUT_5 have the same phases as those of the signal OUT_1 to the signal OUT_5, respectively; thus, the signals are collectively shown. The amplitudes of the clock signal CLK1 to the clock signal CLK5 may be different from the amplitudes of the signal PWC1 to the signal PWC5.

The changes in potentials of the start pulse signal SP, the clock signal CLK1 to the clock signal CLK5, and the signal OUT_1 to the signal OUT_5 can be similar to the changes in potentials shown in FIG. 12B. The potential of the signal RES can be a low potential.

<Configuration Example of Display Apparatus>

Figure 25A:
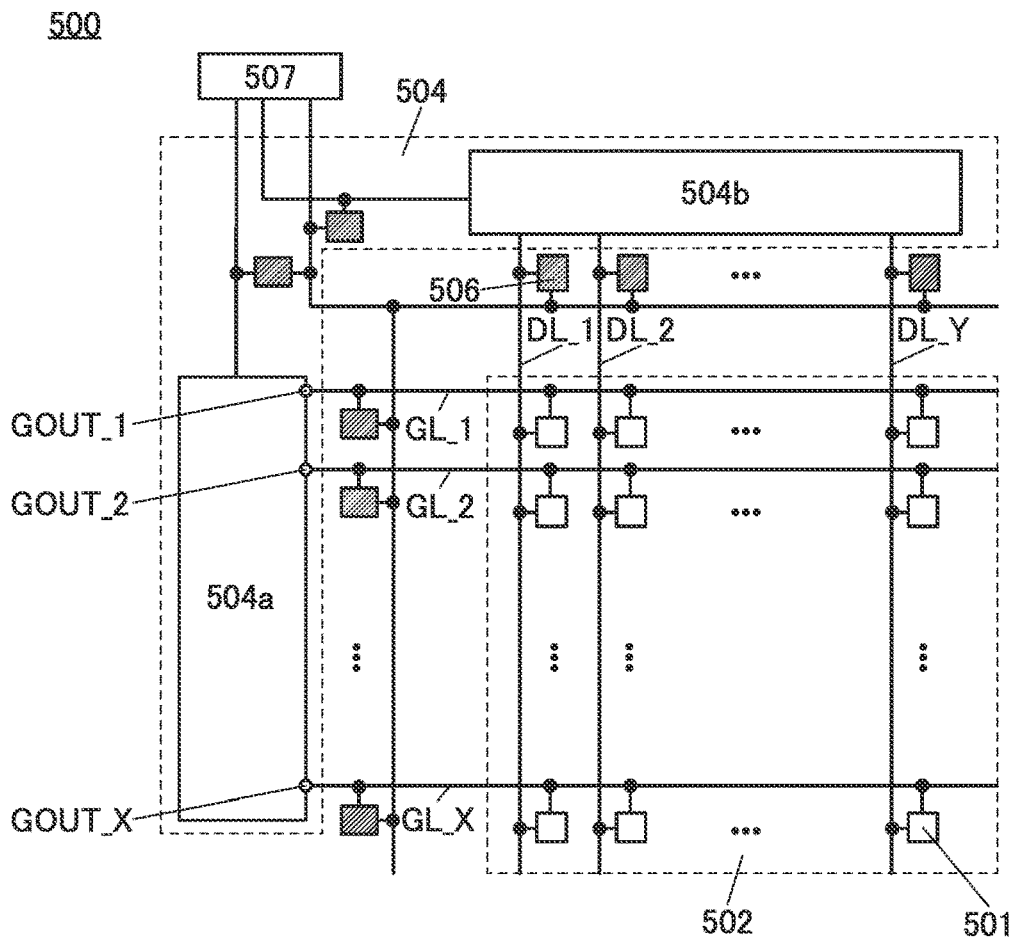
FIG. 25A is a diagram illustrating a configuration example of a display apparatus.

The shift register circuit 40a and the shift register circuit 140a each of which is the semiconductor device of one embodiment of the present invention can be applied to a display apparatus. FIG. 25A is a block diagram illustrating a configuration example of a display apparatus 500 to which the shift register circuit 40a and the shift register circuit 140a can be applied.

The display apparatus 500 includes a display portion 502, a driver circuit portion 504, protection circuits 506, and a terminal portion 507. Note that a configuration in which the protection circuits 506 are not provided may be employed.

The display portion 502 includes pixel circuits 501 arranged in X rows and Y columns (X and Y each independently represent an integer of two or more). The driver circuit portion 504 includes driver circuits such as a scan line driver circuit 504a that outputs scan signals to a scan line GL_1 to a scan line GL_X and a signal line driver circuit 504b that outputs data signals to a signal line DL_1 to a signal line DL_Y.

The scan line driver circuit 504a includes the shift register circuit 40a, the shift register circuit 140a, or the like and has a function of outputting a signal GOUT_1 to a signal GOUT_X as scan signals to the scan line GL_1 to the scan line GL_X, respectively. That is, the semiconductor device of one embodiment of the present invention can be applied to the scan line driver circuit 504a, for example. As described above, the semiconductor device of one embodiment of the present invention has high reliability. Thus, the use of the semiconductor device of one embodiment of the present invention for the display apparatus 500 can provide the display apparatus 500 with high reliability.

The signal line driver circuit 504b is formed using a plurality of analog switches, for example. The signal line driver circuit 504b may include a shift register circuit, for example, the shift register circuit 40 or the shift register circuit 140.

The terminal portion 507 refers to a portion provided with terminals for inputting power, control signals, image signals, and the like to the display apparatus from external circuits.

The protection circuits 506 are each a circuit that, when a potential out of a certain range is supplied to a wiring to which the protection circuit 506 is connected, establishes continuity between the wiring and another wiring. The protection circuits 506 illustrated in FIG. 25A are connected to a variety of wirings such as the scan lines GL that are wirings between the scan line driver circuit 504a and the pixel circuits 501 and the signal lines DL that are wirings between the signal line driver circuit 504b and the pixel circuits 501, for example. Note that the protection circuits 506 are hatched in FIG. 25A to distinguish the protection circuits 506 from the pixel circuits 501.

Each of the scan line driver circuit 504a and the signal line driver circuit 504b may be provided over the same substrate as the display portion 502. Alternatively, a structure may be employed in which a substrate over which the scan line driver circuit 504a or the signal line driver circuit 504b is formed, for example, a driver circuit board formed using a single crystal semiconductor or a polycrystalline semiconductor, is separately prepared, and the substrate is mounted on a substrate over which the display portion 502 is provided by COG or TAB (Tape Automated Bonding).

Figure 25B:
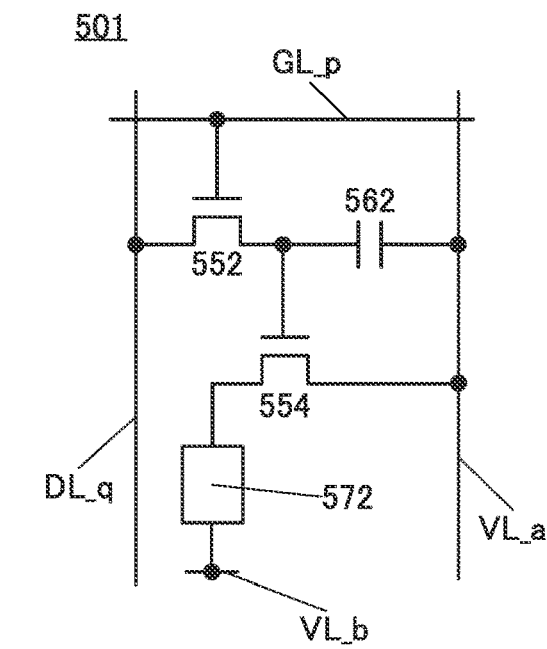
FIG. 25B is a diagram illustrating a configuration example of a pixel circuit.

FIG. 25B illustrates a configuration example of a pixel circuit applicable to the pixel circuits 501. FIG. 25B illustrates a pixel circuit in the p-th row and the q-th column (p is an integer greater than or equal to 1 and less than or equal to X, and q is an integer greater than or equal to 1 and less than or equal to Y).

The pixel circuit 501 includes a transistor 552, a transistor 554, a capacitor 562, and a light-emitting element 572. The scan line GL_p, the signal line DL_q, a potential supply line VL_a, a potential supply line VL_b, and the like are connected to the pixel circuit 501.

As the light-emitting element 572, organic EL, a light-emitting diode (LED), or the like can be used. As the LED, for example, a micro LED can be used.

A high potential is supplied to one of the potential supply line VL_a and the potential supply line VL_b. A low potential is supplied to the other of the potential supply line VL_a and the potential supply line VL_b. Current flowing through the light-emitting element 572 is controlled in accordance with a potential supplied to a gate of the transistor 554, whereby the luminance of light emitted from the light-emitting element 572 is controlled.

Configuration Examples_11 of Sequential Circuit

FIG. 26A, FIG. 26B, FIG. 27A, FIG. 27B, and FIG. 28 are circuit diagrams illustrating configuration examples of the sequential circuits 50 illustrated in FIG. 23A. Here, the sequential circuits 50 illustrated in FIG. 26A to FIG. 28 are a sequential circuit 50a, a sequential circuit 50b, a sequential circuit 50c, a sequential circuit 50d, and a sequential circuit 50e.

The sequential circuit 50a illustrated in FIG. 26A includes the sequential circuit 10a, a circuit 51a, and a transistor 28. The circuit 51a includes a transistor 61 and a transistor 62.

One of a source and a drain of the transistor 28 is electrically connected to the wiring Wb. A high potential is supplied to the other of the source and the drain of the transistor 28. The signal RES is supplied to a gate of the transistor 28.

One of a source and a drain of the transistor 61 is electrically connected to one of a source and a drain of the transistor 62, and the signal GOUT is output. The signal PWC is supplied to the other of the source and the drain of the transistor 61. A gate of the transistor 61 is electrically connected to the wiring Wa. A low potential is supplied to the other of the source and the drain of the transistor 62. A gate of the transistor 62 is electrically connected to the wiring Wb. Here, the signal PWC can be any of the signal PWC1 to the signal PWC4 illustrated in FIG. 23A, for example. Note that in the case where the signal GOUT is the same signal as the signal OUT, the sequential circuit 50a does not need to include the circuit 51a.

When the potential of the signal RES is a high potential, the transistor 28 is brought into an on state and thus the potential of the wiring Wb becomes a high potential. As a result, the transistor 22 and the transistor 62 are brought into an on state and the potential of the signal OUT and the potential of the signal GOUT become low potentials. When the potential of the signal RES is a high potential, the potentials of all of the signals OUT and the potentials of all of the signals GOUT in the shift register circuit 40a become low potentials. Thus, the operation of the shift register circuit 40a is reset. For this reason, the signal RES is a reset signal. Here, the potential of the signal RES is controlled so that the potential of the clock signal $CLK_{i2}$ becomes a low potential in a period during which the potential of the signal RES is a high potential.

The sequential circuit 50a can be driven by the method shown in FIG. 3B, for example. In that case, a period during which voltage stress is applied between the gate and the source of the transistor 62 can be shortened, as in the case of the transistor 22. Accordingly, a change in electrical characteristics of the transistor 62, for example, a change in threshold voltage, can be inhibited. Thus, a display apparatus including the sequential circuit 50a can be a highly reliable display apparatus.

The sequential circuit 50b illustrated in FIG. 26B includes the sequential circuit 10b, a circuit 51b, and the transistor 28. The circuit 51b is a modification example of the circuit 51a and is different from the circuit 51a in that a transistor 65 is included.

One of a source and a drain of the transistor 65 is electrically connected to one of a source and a drain of the transistor 61 and one of a source and a drain of the transistor 62. A low potential is supplied to the other of the source and the drain of the transistor 65. The clock signal $CLK_{i2}$ is input to a gate of the transistor 65.

When the sequential circuit 50b is used as the sequential circuit 50, a malfunction of the shift register circuit 40a caused when the potential of the signal OUT and the potential of the signal GOUT become unintended potentials can be prevented. Hence, a display apparatus including the shift register circuit 40a can be a highly reliable display apparatus.

Figure 27A:
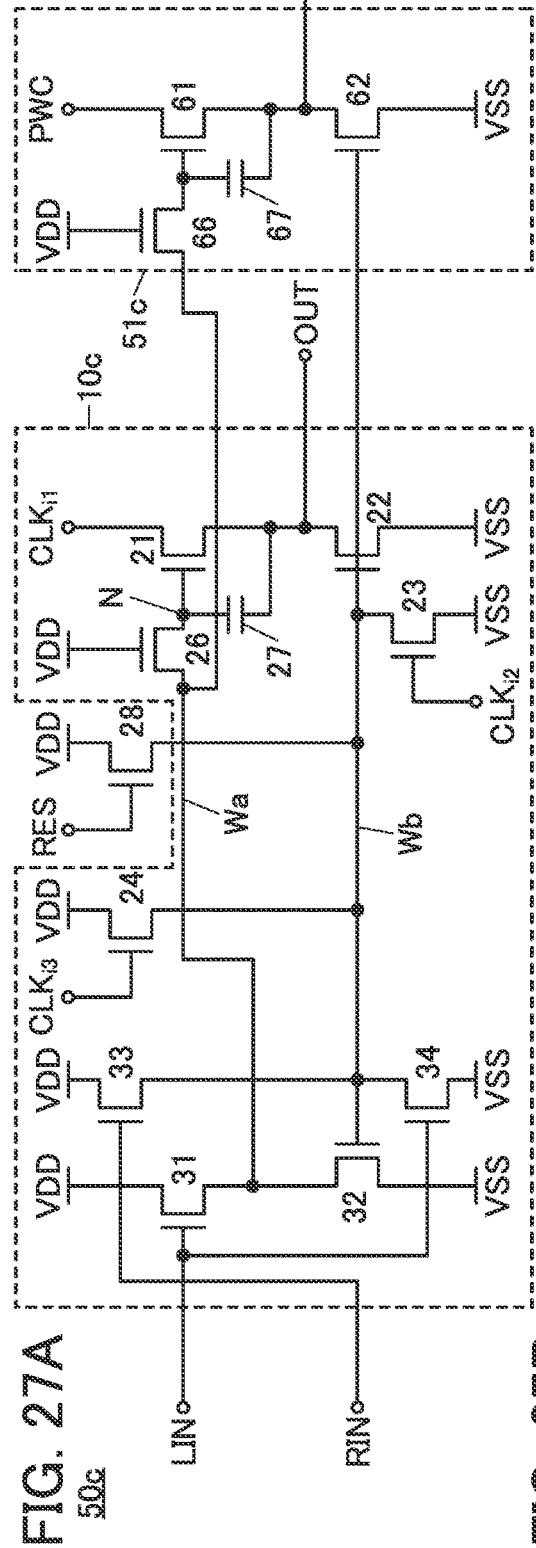
FIG. 27A and FIG. 27B are diagrams illustrating configuration examples of sequential circuits.

The sequential circuit 50c illustrated in FIG. 27A includes the sequential circuit 10c, a circuit 51c, and the transistor 28. The circuit 51c is a modification example of the circuit 51a and is different from the circuit 51a in that a transistor 66 and a capacitor 67 are included.

One of a source and a drain of the transistor 61 is electrically connected to one of a source and a drain of the transistor 62 and one electrode of the capacitor 67. One of a source and a drain of the transistor 66 is electrically connected to the wiring Wa. The other of the source and the drain of the transistor 66 is electrically connected to a gate of the transistor 61. The gate of the transistor 61 is electrically connected to the other electrode of the capacitor 67. A high potential can be supplied to a gate of the transistor 66.

The sequential circuit 50c can be driven by the method shown in FIG. 9B, for example. Accordingly, a high potential of the clock signal $CLK_{i1}$ can be output as the signal OUT without being affected by the threshold voltage of the transistor 21. Furthermore, a high potential of the signal PWC can be output as the signal GOUT without being affected by the threshold voltage of the transistor 61. Thus, the sequential circuit 50 with high output performance can be obtained without an increase in the kinds of power supply potentials.

Figure 27B:
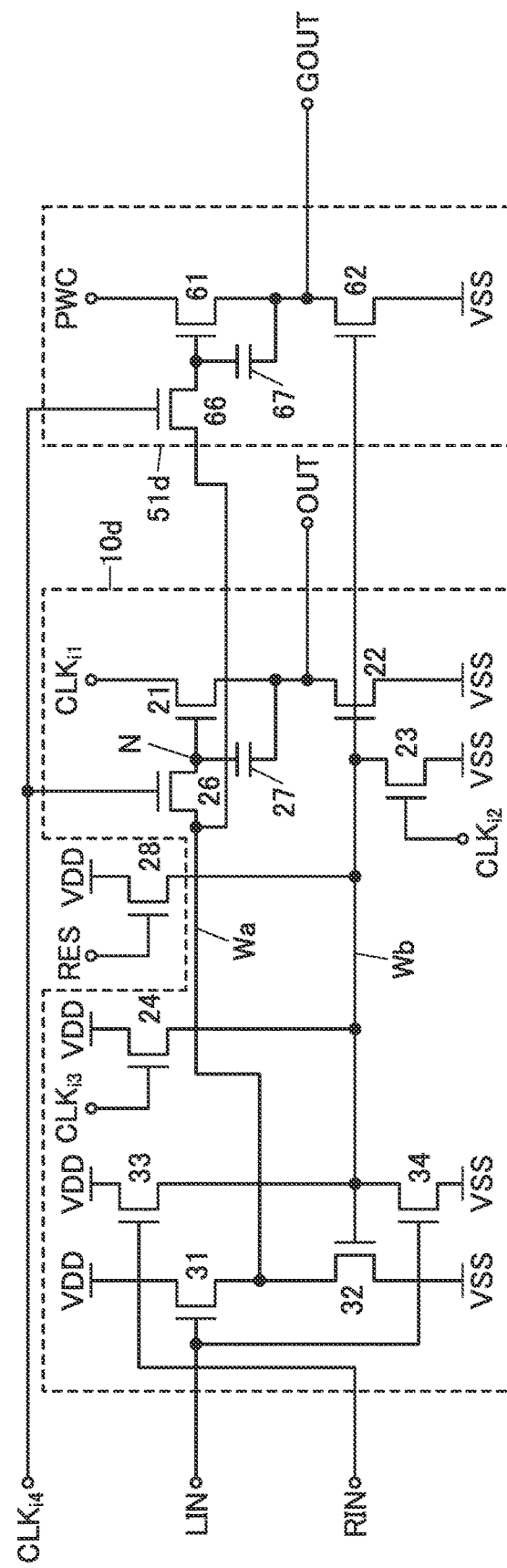

The sequential circuit 50d illustrated in FIG. 27B includes the sequential circuit 10d, a circuit 51d, and the transistor 28. The circuit 51d is a modification example of the circuit 51c and is different from the circuit 51c in that the clock signal $CLK_{i4}$ is input to a gate of the transistor 66.

When the clock signal $CLK_{i4}$ is input to the gate of the transistor 66, a period during which voltage stress is applied between the gate and a source of the transistor 66 can be shortened. Accordingly, a change in electrical characteristics of the transistor 66, for example, a change in threshold voltage, can be inhibited. Thus, a display apparatus including the sequential circuit 50d can be a highly reliable display apparatus.

When a clock signal is input to the gate of the transistor 66, the control of the driving of the sequential circuit 50 can be facilitated as compared to the case where a signal whose potential is controlled independently of other signals is input to the gate of the transistor 66. Note that the signal whose potential is controlled independently of other signals may be input to the gate of the transistor 66. In that case, a period during which the gate potential of the transistor 66 is a low potential can be long, for example, and accordingly, the period during which voltage stress is applied between the gate and the source of the transistor 66 can be shortened. Thus, the reliability of the display apparatus including the sequential circuit 50d can be further increased.

Figure 28:
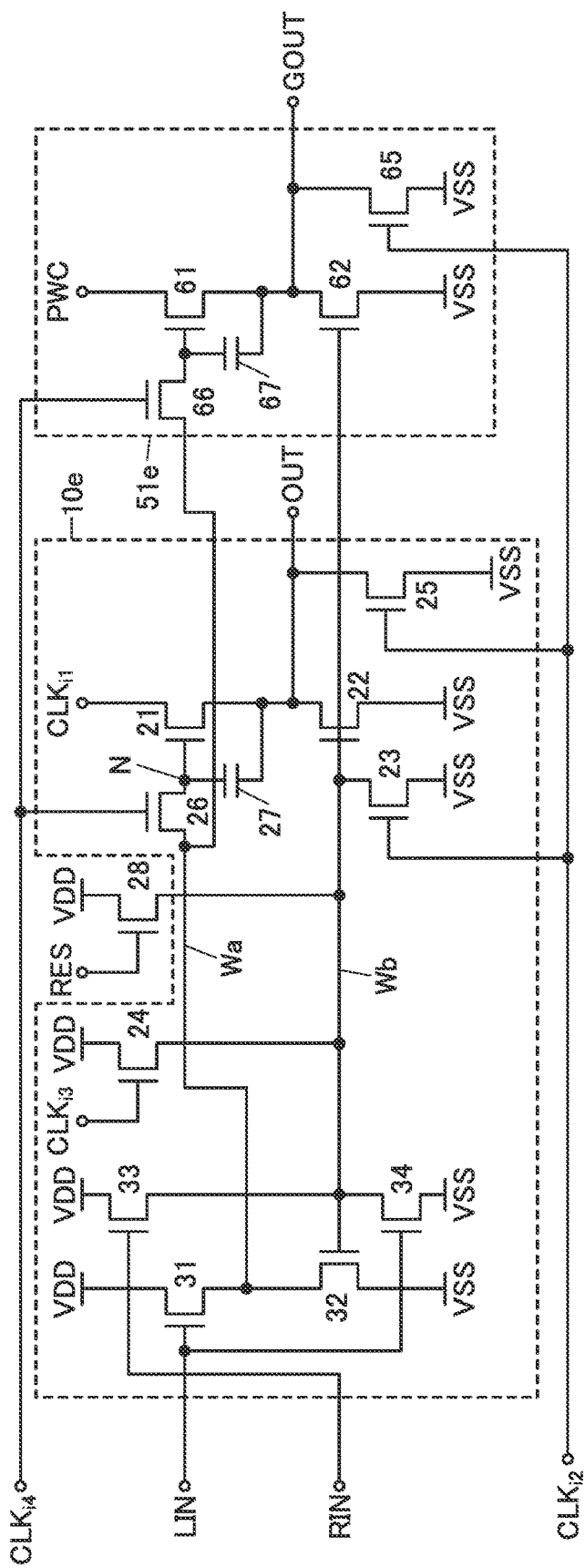
FIG. 28 is a diagram illustrating a configuration example of a sequential circuit.

The sequential circuit 50e illustrated in FIG. 28 includes the sequential circuit 10e, a circuit 51e, and the transistor 28. The circuit 51e is a modification example of the circuit 51d and is different from the circuit 51d in that the transistor 65 is included. The circuit 51e has a configuration in which the configuration of the circuit 51b and the configuration of the circuit 51d are combined.

Configuration Examples_12 of Sequential Circuit

FIG. 29 to FIG. 33 are circuit diagrams illustrating configuration examples of the sequential circuit 150 illustrated in FIG. 24A. Here, the sequential circuits 150 illustrated in FIG. 29 to FIG. 33 are a sequential circuit 150a, a sequential circuit 150b, a sequential circuit 150c, a sequential circuit 150d, and a sequential circuit 150e. Here, the signal PWC in the sequential circuits 150 can be any of the signal PWC1 to the signal PWC5 illustrated in FIG. 24A, for example.

Figure 29:
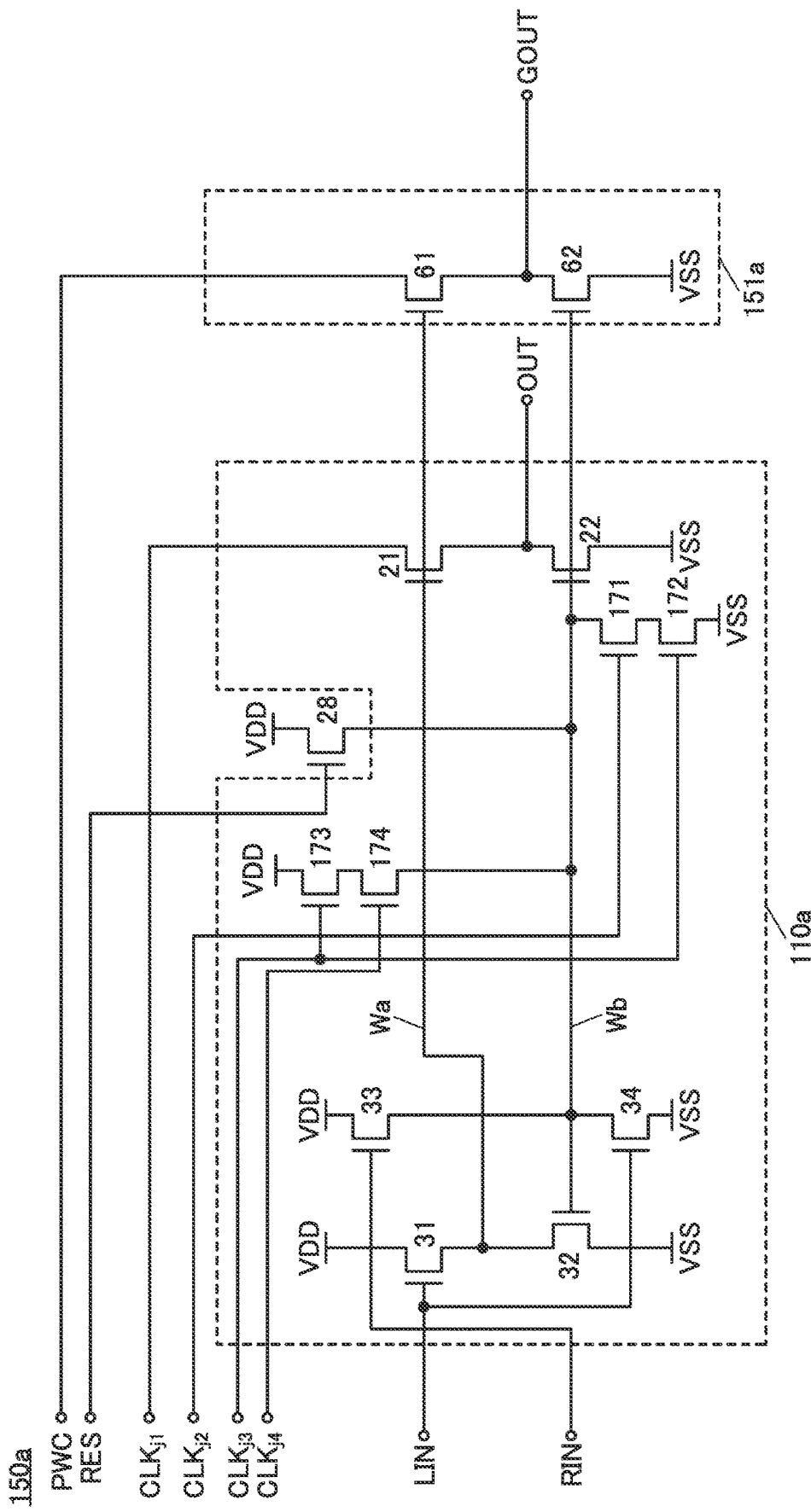
FIG. 29 is a diagram illustrating a configuration example of a sequential circuit.

The sequential circuit 150a illustrated in FIG. 29 includes the sequential circuit 110a, a circuit 151a, and the transistor 28. The circuit 151a can have a configuration similar to that of the circuit 51a.

As in the sequential circuit 50a, one of a source and a drain of the transistor 28 is electrically connected to the wiring Wb. A high potential is supplied to the other of the source and the drain of the transistor 28. The signal RES is supplied to a gate of the transistor 28. As described above, the signal RES is a reset signal, and when the potential of the signal RES is a high potential, the potentials of all of the signals OUT and the potentials of all of the signals GOUT in the shift register circuit 140a become low potentials. Here, the potential of the signal RES is controlled so that at least one of the potential of the clock signal $CLK_{j2}$ and the potential of the clock signal $CLK_{j3}$ becomes a low potential in a period during which the potential of the signal RES is a high potential.

The sequential circuit 150a can be driven by the method shown in FIG. 14B, for example. In that case, a period during which voltage stress is applied between a gate and a source of the transistor 62 can be shortened, as in the case of the transistor 22. Accordingly, a change in electrical characteristics of the transistor 62, for example, a change in threshold voltage, can be inhibited. Thus, a display apparatus including the sequential circuit 150a can be a highly reliable display apparatus.

Figure 30:
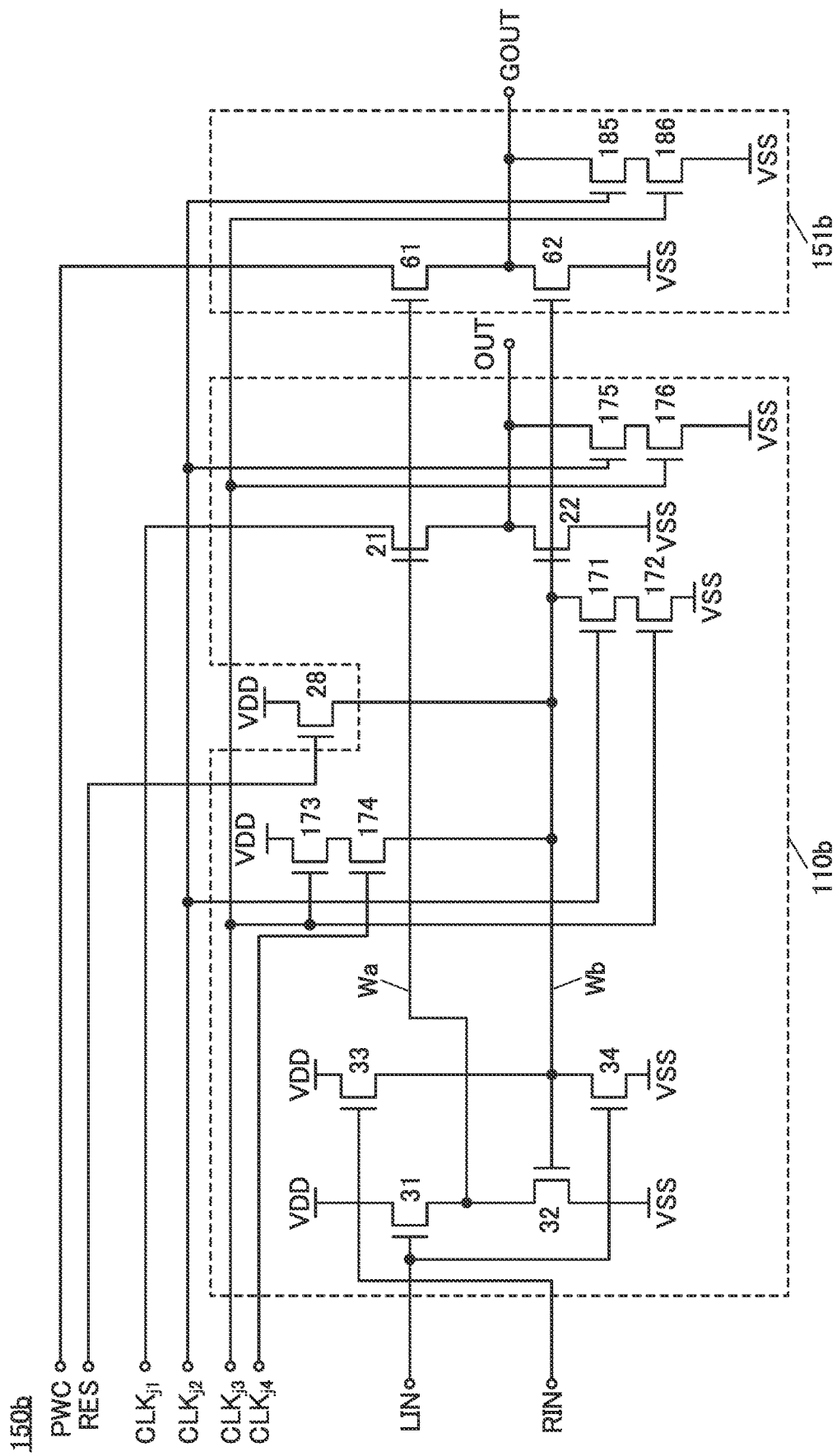
FIG. 30 is a diagram illustrating a configuration example of a sequential circuit.

The sequential circuit 150b illustrated in FIG. 30 includes the sequential circuit 110b, a circuit 151b, and the transistor 28. The circuit 151b is a modification example of the circuit 151a and is different from the circuit 151a in that a transistor 185 and a transistor 186 are included.

One of a source and a drain of the transistor 185 is electrically connected to one of a source and a drain of the transistor 61 and one of the source and a drain of the transistor 62. The other of the source and the drain of the transistor 185 is electrically connected to one of a source and a drain of the transistor 186. A low potential is supplied to the other of the source and the drain of the transistor 186. The clock signal $CLK_{j2}$ is input to a gate of the transistor 185. The clock signal $CLK_{j3}$ is input to a gate of the transistor 186.

When the sequential circuit 150b is used as the sequential circuit 150, a malfunction of the shift register circuit 140a caused when the potential of the signal OUT and the potential of the signal GOUT become unintended potentials can be prevented. Hence, a display apparatus including the shift register circuit 140a can be a highly reliable display apparatus.

Figure 31:
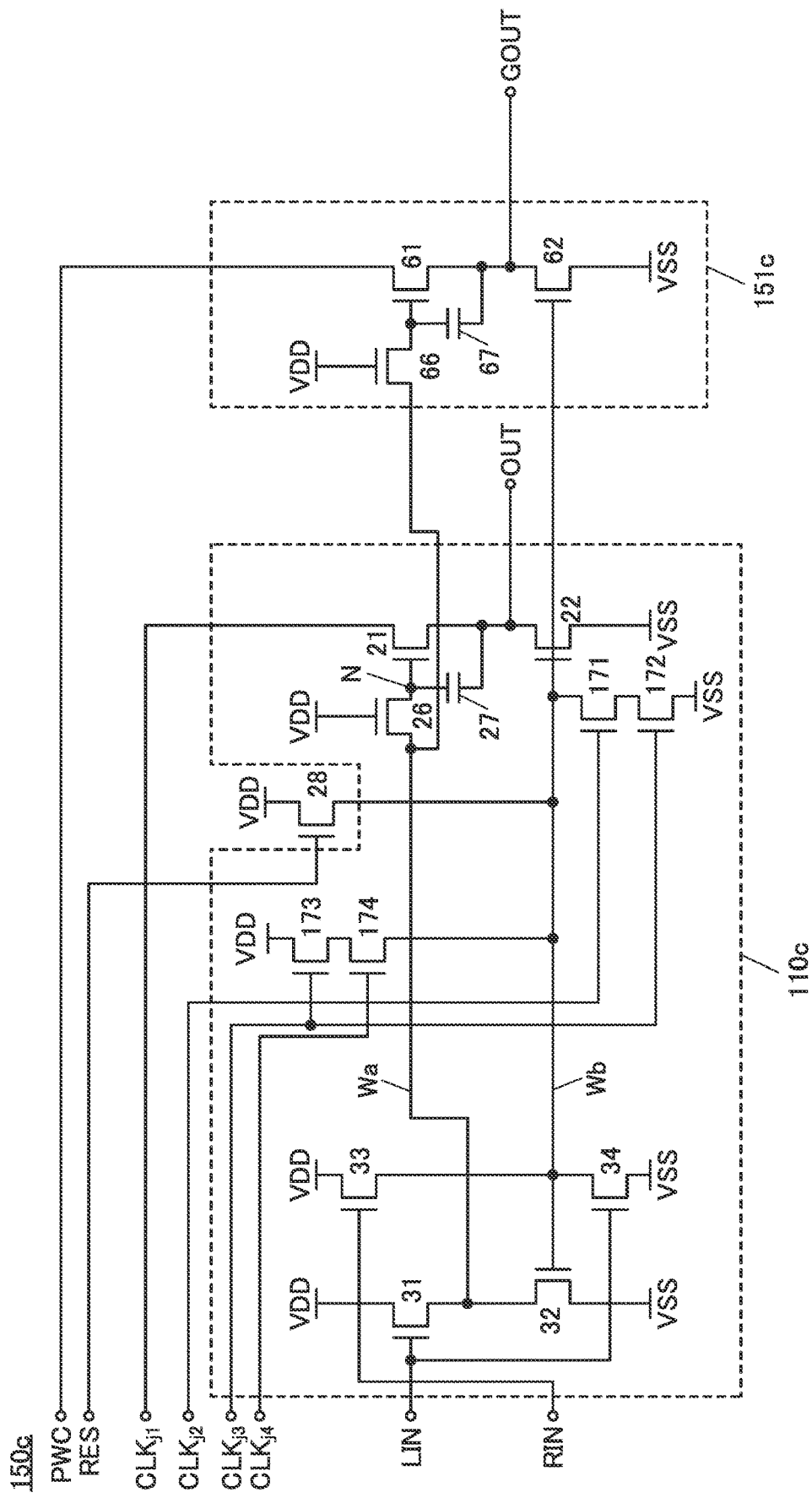
FIG. 31 is a diagram illustrating a configuration example of a sequential circuit.

The sequential circuit 150c illustrated in FIG. 31 includes the sequential circuit 110c, a circuit 151c, and the transistor 28. The circuit 151c can have a configuration similar to that of the circuit 51c.

The sequential circuit 150c can be driven by the method shown in FIG. 21B, for example. Accordingly, a high potential of the clock signal $CLK_{j1}$ can be output as the signal OUT without being affected by the threshold voltage of the transistor 21. Furthermore, a high potential of the signal PWC can be output as the signal GOUT without being affected by the threshold voltage of the transistor 61. Thus, the sequential circuit 150 with high output performance can be obtained without an increase in the kinds of power supply potentials.

Figure 32:
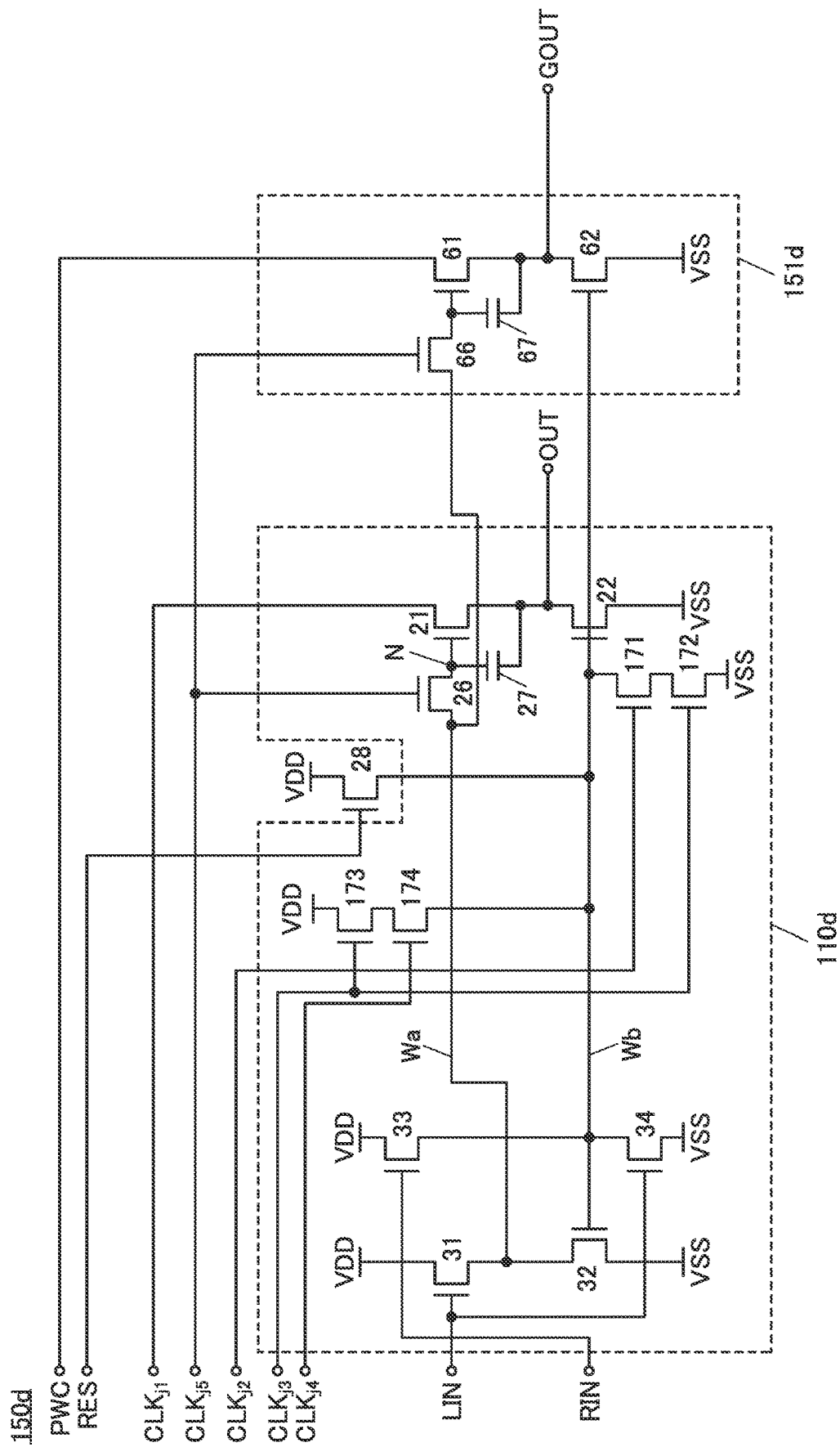
FIG. 32 is a diagram illustrating a configuration example of a sequential circuit.

The sequential circuit 150d illustrated in FIG. 32 includes the sequential circuit 110d, a circuit 151d, and the transistor 28. The circuit 151d is a modification example of the circuit 151c and is different from the circuit 151c in that the clock signal $CLK_{j5}$ is input to a gate of the transistor 66.

When the clock signal $CLK_{j5}$ is input to the gate of the transistor 66, a period during which voltage stress is applied between the gate and a source of the transistor 66 can be shortened. Accordingly, a change in electrical characteristics of the transistor 66, for example, a change in threshold voltage, can be inhibited as in the sequential circuit 50d. Thus, a display apparatus including the sequential circuit 150d can be a highly reliable display apparatus.

When a clock signal is input to the gate of the transistor 66 as in the sequential circuit 50d, the control of the driving of the sequential circuit 150 can be facilitated as compared to the case where a signal whose potential is controlled independently of other signals is input to the gate of the transistor 66. Note that the signal whose potential is controlled independently of other signals may be input to the gate of the transistor 66. In that case, a period during which the gate potential of the transistor 66 is a low potential can be long, for example, and accordingly, the period during which voltage stress is applied between the gate and the source of the transistor 66 can be shortened. Thus, the reliability of the display apparatus including the sequential circuit 150d can be further increased.

Figure 33:
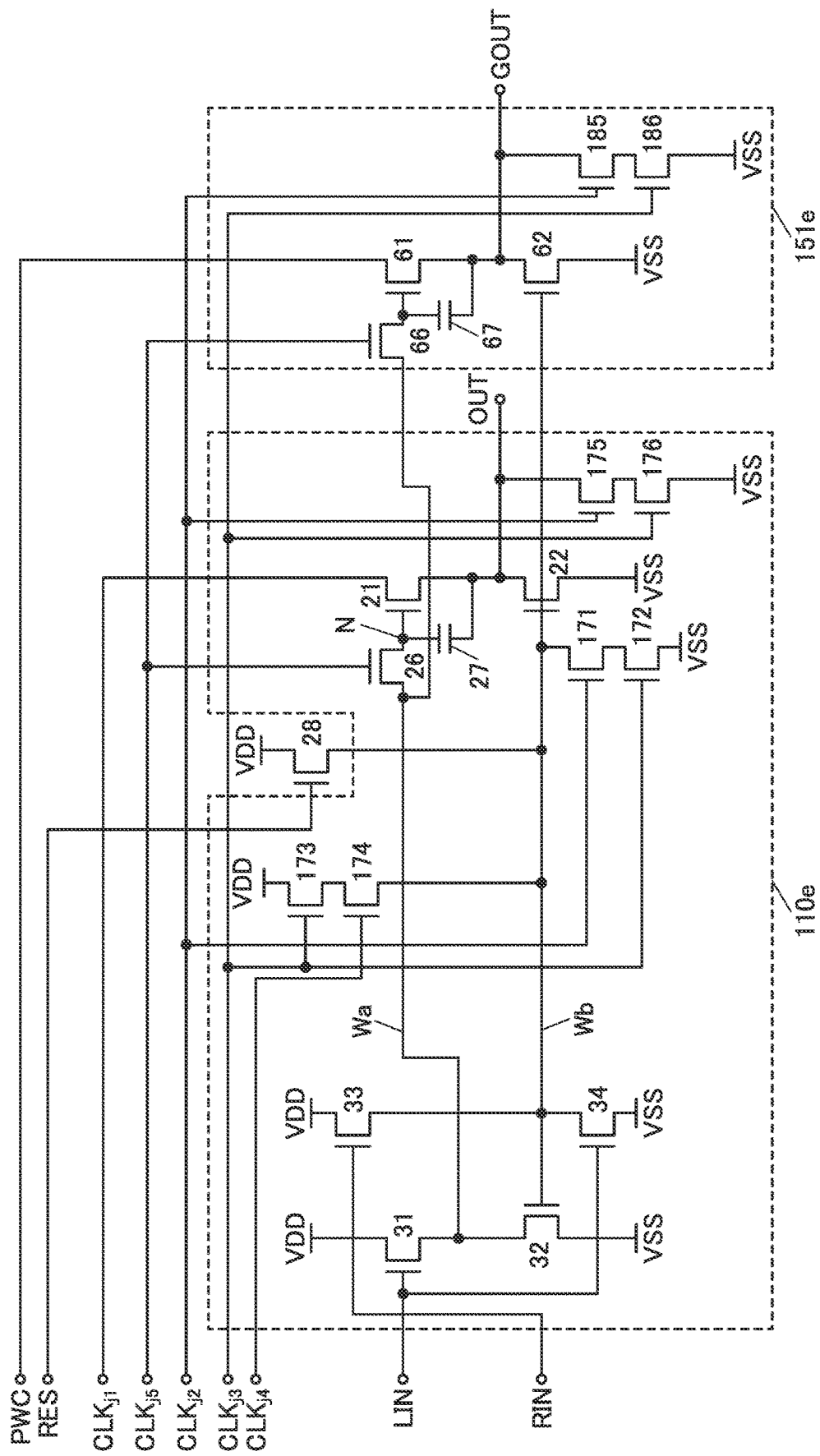
FIG. 33 is a diagram illustrating a configuration example of a sequential circuit.

The sequential circuit 150e illustrated in FIG. 33 includes the sequential circuit 110e, a circuit 151e, and the transistor 28. The circuit 151e is a modification example of the circuit 151d and is different from the circuit 151d in that the transistor 185 and the transistor 186 are included. The circuit 151e has a configuration in which the configuration of the circuit 151b and the configuration of the circuit 151d are combined.

<Light-Emitting Element>

Hereinafter, structure examples of the light-emitting element 572 illustrated in FIG. 25B and examples of fabrication methods will be described.

Figure 34A:
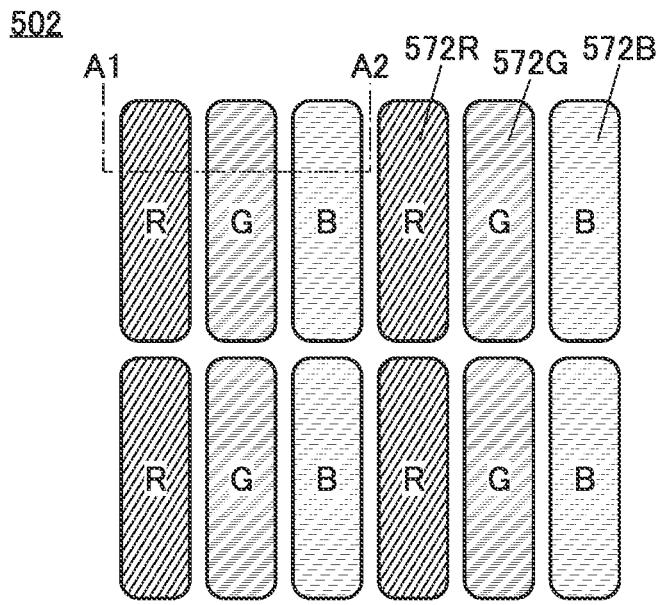
FIG. 34A to FIG. 34C are diagrams illustrating structure examples of a display apparatus.

FIG. 34A is a schematic top view illustrating a structure example of the display portion 502 illustrated in FIG. 25A. The display portion 502 includes a plurality of light-emitting elements 572R exhibiting red, a plurality of light-emitting elements 572G exhibiting green, and a plurality of light-emitting elements 572B exhibiting blue. In FIG. 34A, light-emitting regions of the light-emitting elements are denoted by R, G, and B to easily differentiate the light-emitting elements. Although the structure illustrated in FIG. 34A as an example has three colors of red (R), green (G), and blue (B), one embodiment of the present invention is not limited thereto. For example, the structure may have four or more colors. All of the light-emitting elements 572 provided in the display portion 502 may emit light of the same color, for example. All of the light-emitting elements 572 provided in the display portion 502 may emit white light, for example.

In this specification and the like, a structure in which light-emitting layers in light-emitting elements of respective colors (blue (B), green (G), and red (R) here) are separately formed or the light-emitting layers are separately patterned is sometimes referred to as an SBS (Side By Side) structure. In this specification and the like, a light-emitting element capable of emitting white light is sometimes referred to as a white light-emitting element (also referred to as a white light-emitting device). Note that a combination of a white light-emitting element with a coloring layer (e.g., a color filter) enables a full-color display apparatus.

The light-emitting elements 572R, the light-emitting elements 572G, and the light-emitting elements 572B are arranged in a matrix. FIG. 34A illustrates what is called stripe arrangement, in which light-emitting elements of the same color are arranged in one direction. Note that the arrangement method of the light-emitting elements is not limited thereto; another arrangement method such as delta arrangement or zigzag arrangement may be used, or PenTile arrangement can be used.

As the light-emitting elements 572R, the light-emitting elements 572G, and the light-emitting element 572B, organic EL elements such as OLEDs (Organic Light Emitting Diodes) or QLEDs (Quantum-dot Light Emitting Diodes) are preferably used. As a light-emitting substance contained in an EL element, a substance that emits fluorescence (a fluorescent material), a substance that emits phosphorescence (a phosphorescent material), an inorganic compound (e.g., a quantum dot material), a substance that exhibits thermally activated delayed fluorescence (a thermally activated delayed fluorescent (TADF) material), and the like can be given. Note that as a TADF material, a material in which a singlet excited state and a triplet excited state are in a thermal equilibrium state may be used. Since such a TADF material enables a short emission lifetime (excitation lifetime), an efficiency decrease of a light-emitting element in a high-luminance region can be inhibited.

LEDs such as micro LEDs can be used as the light-emitting elements 572R, the light-emitting elements 572G, and the light-emitting elements 572B.

Figure 34B:
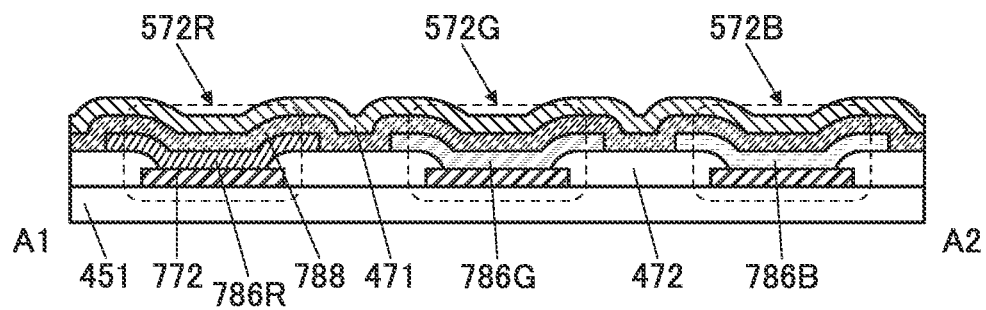

FIG. 34B is a schematic cross-sectional view taken along dashed-dotted line A1-A2 in FIG. 34A.

FIG. 34B illustrates cross sections of the light-emitting element 572R, the light-emitting element 572G, and the light-emitting element 572B. Each of the light-emitting element 572R, the light-emitting element 572G, and the light-emitting element 572B is provided over a substrate 451 and includes a conductive layer 772 functioning as a pixel electrode and a conductive layer 788 functioning as a common electrode.

In this specification and the like, a conductive layer functioning as a pixel electrode is referred to as a lower electrode and a conductive layer functioning as a common electrode is referred to as an upper electrode, in some cases. For example, the conductive layer 772 can be referred to as a lower electrode and the conductive layer 788 can be referred to as an upper electrode. Note that a conductive layer functioning as a pixel electrode is referred to as an upper electrode and a conductive layer functioning as a common electrode is referred to as a lower electrode, in some cases.

The light-emitting elements 572R includes an EL layer 786R between the conductive layer 772 functioning as a pixel electrode and the conductive layer 788 functioning as a common electrode. The light-emitting element 572G includes an EL layer 786G between the conductive layer 772 and the conductive layer 788, and the light-emitting element 572B includes an EL layer 786B between the conductive layer 772 and the conductive layer 788.

The EL layer 786R contains at least a light-emitting organic compound that emits light with an intensity in a red wavelength range. The EL layer 786G contains at least a light-emitting organic compound that emits light with an intensity in a green wavelength range. The EL layer 786B contains at least a light-emitting organic compound that emits light with an intensity in a blue wavelength range.

The EL layer 786R, the EL layer 786G, and the EL layer 786B may each include one or more of a layer containing a substance having a high electron-injection property (electron-injection layer), a layer containing a substance having a high electron-transport property (electron-transport layer), a layer containing a substance having a high hole-injection property (hole-injection layer), and a layer containing a substance having a high hole-transport property (hole-transport layer) in addition to the layer containing a light-emitting organic compound (light-emitting layer).

The conductive layer 772 functioning as a pixel electrode is provided in each of the light-emitting elements. The conductive layer 788 functioning as a common electrode is provided as a continuous layer shared by the light-emitting elements. A conductive film that has a property of transmitting visible light is used for either the conductive layer 772 functioning as a pixel electrode or the conductive layer 788 functioning as a common electrode, and conductive film that has a reflective property is used for the other. When the conductive layer 772 functioning as a pixel electrode has a light-transmitting property and the conductive layer 788 functioning as a common electrode has a reflective property, a bottom-emission display apparatus can be obtained, whereas when the conductive layer 772 functioning as a pixel electrode has a reflective property and the conductive layer 788 functioning as a common electrode has a light-transmitting property, a top-emission display apparatus can be obtained. Note that when both the conductive layer 772 functioning as a pixel electrode and the conductive layer 788 functioning as a common electrode have a light-transmitting property, a dual-emission display apparatus can be obtained.

An insulating layer 472 is provided to cover an end portion of the conductive layer 772 functioning as a pixel electrode. The end portion of the insulating layer 472 is preferably tapered.

The EL layer 786R, the EL layer 786G, and the EL layer 786B each include a region in contact with the top surface of the conductive layer 772 functioning as a pixel electrode and a region in contact with a surface of the insulating layer 472. End portions of the EL layer 786R, the EL layer 786G, and the EL layer 786B are positioned over the insulating layer 472.

As illustrated in FIG. 34B, there is a gap between two EL layers of the light-emitting elements of different colors. In this manner, the EL layer 786R, the EL layer 786G, and the EL layer 786B are preferably provided so as not to be in contact with one another. This suitably prevents unintentional light emission (also referred to as crosstalk) from being caused by current flowing through two adjacent EL layers. As a result, the contrast can be increased to achieve a display apparatus with high display quality.

The EL layer 786R, the EL layer 786G, and the EL layer 786B can be separately formed by a photolithography method or the like. In that case, the EL layers can be separately formed without using a shadow mask such as a metal mask. Accordingly, a high-definition display apparatus can be obtained. Note that the EL layer 786R, the EL layer 786G, and the EL layer 786G may be separately formed using a metal mask or the like.

Since the high-definition display apparatus 500 has high pixel density as described above, the number of pixel circuits 501 electrically connected to the scan line GL per unit length illustrated in FIG. 25A, for example, becomes large. Accordingly, the gate capacitance of the transistor 552 illustrated in FIG. 25B, for example, results in an increase in wiring capacitance of the scan line GL, for example. Furthermore, when a large number of pixel circuits 501 are provided in the display apparatus 500, the number of the scan lines GL increases (X becomes large). Thus, it is necessary to shorten one horizontal period, which is a period from supply of a signal from the scan line driver circuit 504a to the scan line GL to supply of a signal to the scan line GL in the subsequent row, in order to ensure the frame frequency of the display apparatus 500, for example. Such an increase in wiring capacitance of the scan line GL and a shortened horizontal period make it necessary to increase current flowing in the scan line GL in the case of charging the scan line GL.

To increase current flowing in the scan line GL, the potential of the signal GOUT needs to be increased. In that case, high voltage stress is applied to the transistor 62 electrically connected to the scan line GL when the potential of the signal GOUT is a high potential, for example. Thus, in the case where the display apparatus 500 is a high-definition display apparatus or a display apparatus includes a large number of pixels, the reliability of the display apparatus 500 is decreased in some cases.

The semiconductor device that can be used for the scan line driver circuit 504a included in the display apparatus 500 can shorten a period during which voltage stress is applied to the transistor 62 or the like electrically connected to the scan line GL as described above, for example. Thus, a change in electrical characteristics of the transistor 62, for example, a change in threshold voltage, can be inhibited. Hence, the use of the semiconductor device of one embodiment of the present invention can increase the reliability of the display apparatus. Accordingly, the display apparatus 500 can be a high-definition display apparatus with a large number of pixels and high reliability.

A protective layer 471 is provided over the conductive layer 788 functioning as a common electrode so as to cover the light-emitting element 572R, the light-emitting element 572G, and the light-emitting element 572B. The protective layer 471 has a function of preventing diffusion of impurities such as water into the light-emitting elements from above.

The protective layer 471 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as an indium gallium oxide or an indium gallium zinc oxide may be used for the protective layer 471. Note that the protective layer 471 may be formed by an atomic layer deposition (ALD) method, a chemical vapor deposition (CVD) method, or a sputtering method. Although a structure in which the protective layer 471 includes an inorganic insulating film is described as an example, one embodiment of the present invention is not limited thereto. For example, the protective layer 471 may have a stacked-layer structure of an inorganic insulating film and an organic insulating film.

In this specification and the like, an oxynitride refers to a material that contains more oxygen than nitrogen, and a nitride oxide refers to a material that contains more nitrogen than oxygen. For example, silicon oxynitride refers to a material that contains oxygen at a higher proportion than nitrogen, and silicon nitride oxide refers to a material that contains nitrogen at a higher proportion than oxygen.

Figure 34C:
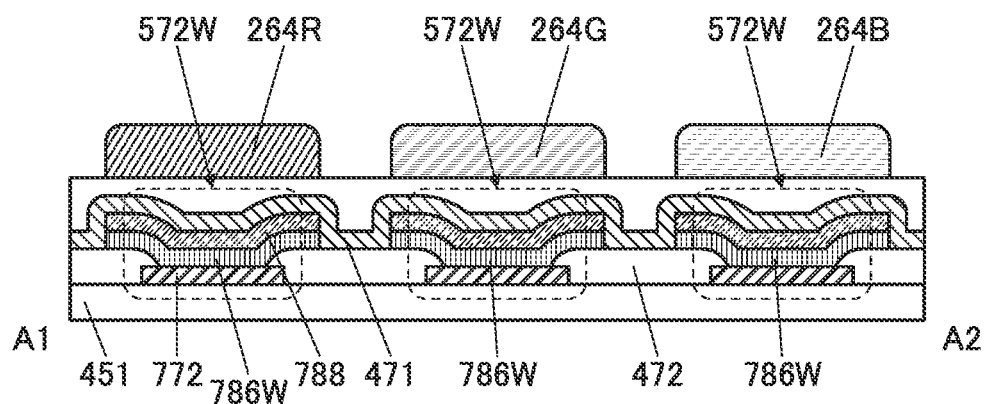

FIG. 34C illustrates an example different from the above.

In the example illustrated in FIG. 34C, a light-emitting element 572W emitting white light is included. The light-emitting element 572W includes an EL layer 786W that emits white light between the conductive layer 772 functioning as a pixel electrode and the conductive layer 788 functioning as a common electrode.

The EL layer 786W can have, for example, a structure in which two or more light-emitting layers that are selected so as to emit light of complementary colors are stacked. It is also possible to use a stacked EL layer in which a charge-generation layer is provided between light-emitting layers.

FIG. 34C illustrates three light-emitting elements 572W arranged side by side. A coloring layer 264R is provided above the light-emitting element 572W on the left. The coloring layer 264R functions as a band path filter that transmits red light. Similarly, a coloring layer 264G that transmits green light is provided above the light-emitting element 572W in the middle, and a coloring layer 264B that transmits blue light is provided above the light-emitting element 572W on the right. Thus, the display apparatus can display an image with colors.

Here, the EL layer 786W and the conductive layer 788 functioning as a common electrode are each separated between adjacent two light-emitting elements 572W. This can suitably prevent unintentional light emission from being caused by current flowing through the EL layers 786W of the two adjacent light-emitting elements 572W. In particular, when the EL layer 786W is a stacked EL element in which a charge-generation layer is provided between two light-emitting layers, the effect of crosstalk is more significant as the resolution increases, i.e., as the distance between adjacent pixels decreases, leading to lower contrast. Thus, the above structure can achieve a display apparatus having both high resolution and high contrast.

In the case where the conductive layer 788 is separated, the protective layer 471 is provided to cover the top surface and an end portion of the conductive layer 788. Note that the protective layer 471 may be provided to cover an end portion of a side surface of the EL layer 786R, an end portion of a side surface of the EL layer 786G, and an end portion of a side surface of the EL layer 786B.

The EL layer 786W and the conductive layer 788 functioning as a common electrode are preferably isolated by a photolithography method. This can decrease the distance between light-emitting elements, achieving a display apparatus with a higher aperture ratio than that formed using, for example, a shadow mask such as a metal mask.

In this specification and the like, a device fabricated using a metal mask or an FMM (fine metal mask) is sometimes referred to as a device having an MM (metal mask) structure. In this specification and the like, a device fabricated without using a metal mask or an FMM is sometimes referred to as a device having an MML (metal maskless) structure.

Note that in the case of a bottom-emission light-emitting element, a coloring layer may be provided between the conductive layer 772 functioning as a pixel electrode and the substrate 451.

Figure 35A:
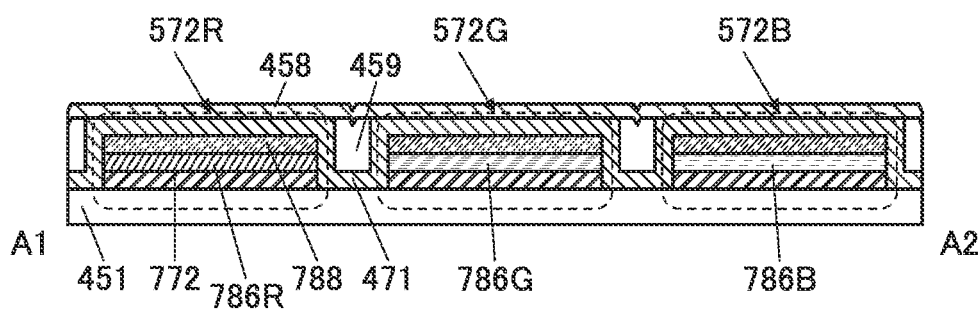
FIG. 35A to FIG. 35C are diagrams illustrating structure examples of a display apparatus.

FIG. 35A illustrates an example different from the above. Specifically, FIG. 35A illustrates a structure in which the insulating layers 472 are not provided between the light-emitting element 572R, the light-emitting element 572G, and the light-emitting element 572B. With such a structure, the display apparatus can have a high aperture ratio. Furthermore, the protective layer 471 covers side surfaces of the light-emitting element 572R, the light-emitting element 572G, and the light-emitting element 572B. With such a structure, impurities (typically, water) can be inhibited from entering the light-emitting element 572R, the light-emitting element 572G, and the light-emitting element 572B through their side surfaces. In the structure illustrated in FIG. 35A, the top surface shapes of the conductive layer 772, the EL layer 786R, and the conductive layer 788 are substantially the same. This structure can be formed by formation of the conductive layer 772, the EL layer 786R, and the conductive layer 788 and subsequent collective processing using a resist mask or the like. In this process, the EL layer 786R and the conductive layer 772 are processed using the conductive layer 788 as a mask, and thus this process can be referred to as self-alignment patterning. Note that although the light-emitting element 572R is described here, the light-emitting element 572G and the light-emitting element 572B can have the same structure.

In FIG. 35A, a protective layer 458 is further provided over the protective layer 471. For example, the protective layer 471 is formed with an apparatus that can deposit a film with excellent coverage (typically, an ALD apparatus), and the protective layer 458 is formed with an apparatus that can deposit a film with coverage inferior to that of the protective layer 471 (typically, a sputtering apparatus), whereby a region 459 can be provided between the protective layer 471 and the protective layer 458. In other words, the region 459 is positioned between the light-emitting element 572R and the light-emitting element 572G, and between the light-emitting element 572G and the light-emitting element 572B.

Note that the region 459 contains, for example, one or more selected from air, nitrogen, oxygen, carbon dioxide, and Group 18 elements (typically, helium, neon, argon, xenon, and krypton). Furthermore, for example, a gas used during the deposition of the protective layer 458 is sometimes contained in the region 459. For example, in the case where the protective layer 458 is deposited using a sputtering method, any one or more of the above-described Group 18 elements is sometimes contained in the region 459. In the case where a gas is contained in the region 459, a gas can be identified with, for example, a gas chromatography method. Alternatively, in the case where the protective layer 458 is deposited by a sputtering method, a gas used in the sputtering is sometimes contained in the protective layer 458. In that case, an element such as argon is sometimes detected when the protective layer 458 is analyzed by an energy dispersive X-ray analysis (EDX analysis) or the like, for example.

In the case where the refractive index of the region 459 is lower than the refractive index of the protective layer 471, light emitted from the light-emitting element 572R, the light-emitting element 572G, or the light-emitting element 572B is reflected at an interface between the protective layer 471 and the region 459. Hence, light emitted from the light-emitting element 572R, the light-emitting element 572G, or the light-emitting element 572B can be inhibited from entering an adjacent pixel. With the structure, mixture of light of different colors can be inhibited, so that the image quality of the display apparatus can be improved.

In the case of the structure illustrated in FIG. 35A, a region between the light-emitting element 572R and the light-emitting element 572G or a region between the light-emitting element 572G and the light-emitting element 572B (hereinafter simply referred to as a distance between the light-emitting elements) can be small. Specifically, the distance between the light-emitting elements can be less than or equal to 1 µm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, a region is included in which the distance between the side surface of the light-emitting element 572R and the side surface of the light-emitting element 572G or the distance between the side surface of the light-emitting element 572G and the side surface of the light-emitting element 572B is less than or equal to 1 µm, preferably less than or equal to 0.5 µm (500 nm), further preferably less than or equal to 100 nm.

In the case where the region 459 contains air, for example, light-emitting elements can be isolated from each other and color mixture of light from the light-emitting elements, crosstalk, or the like can be inhibited.

The region 459 may include an insulating layer containing an organic material, for example. The region 459 may be filled with, for example, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The region 459 may be filled with a photosensitive resin. A photoresist may be used for the photosensitive resin. As the photosensitive resin, a positive photosensitive material or a negative photosensitive material can be used.

The region 459 may include an insulating layer containing an inorganic material, for example. As the inorganic material, for example, an inorganic insulating film such as an oxide insulating film, a nitride insulating film, an oxynitride insulating film, or a nitride oxide insulating film can be used. The above inorganic insulating film can have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The region 459 preferably contains both of the above inorganic material and organic material. Examples of the structure of the region 459 include a stacked-layer structure of an aluminum oxide film and a photoresist on the aluminum oxide film.

Figure 35B:
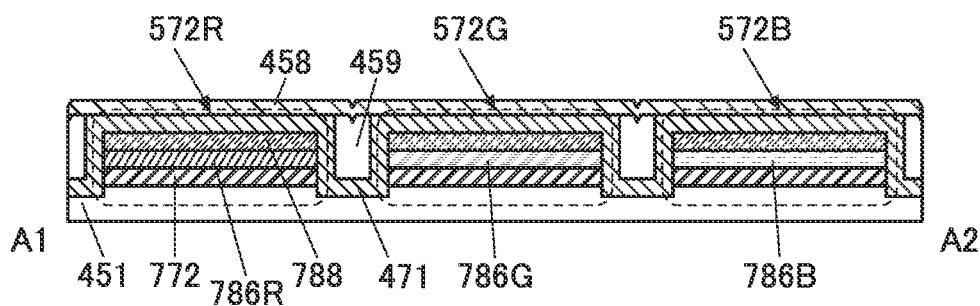

FIG. 35B illustrates an example different from the above. Specifically, the structure illustrated in FIG. 35B is different from the structure illustrated in FIG. 35A in the structure of the substrate 451. The substrate 451 has a recessed portion in its top surface that is formed by being partially etched when the light-emitting element 572R, the light-emitting element 572G, and the light-emitting element 572B are processed. The protective layer 471 is formed in the recessed portion. In other words, in the cross-sectional view, a region is provided, in which the bottom surface of the protective layer 471 is positioned below the bottom surface of the conductive layer 772. With the region, impurities (typically, water) can be suitably inhibited from entering the light-emitting element 572R, the light-emitting element 572G, and the light-emitting element 572B from the bottom. It is likely that the recessed portion can be formed when impurities (also referred to as residue) that could be attached to the side surfaces of the light-emitting element 572R, the light-emitting element 572G, and the light-emitting element 572B in processing of the light-emitting elements are removed by wet etching or the like. After the residue is removed, the side surfaces of the light-emitting elements are covered with the protective layer 471, whereby a highly reliable display apparatus can be obtained.

Figure 35C:
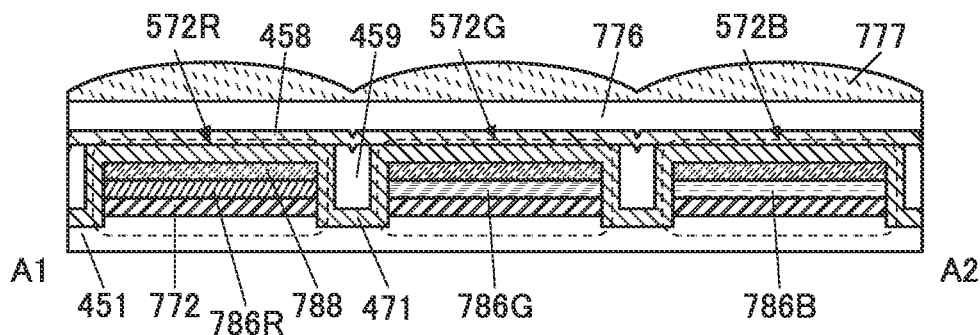

FIG. 35C illustrates an example different from the above. Specifically, the structure illustrated in FIG. 35C includes an insulating layer 776 and a microlens array 777 in addition to the components illustrated in FIG. 35B. The insulating layer 776 functions as an adhesive layer. When the refractive index of the insulating layer 776 is lower than the refractive index of the microlens array 777, the microlens array 777 can condense light emitted from the light-emitting element 572R, the light-emitting element 572G, and the light-emitting element 572B in some cases. It is suitable to condense light emitted from the light-emitting element 572R, the light-emitting element 572G, and the light-emitting element 572B because a user can see bright images particularly when the user sees the display surface from the front of the display apparatus. As the insulating layer 776, any of a variety of curable adhesives, e.g., a photocurable adhesive such as an ultraviolet curable adhesive, a reactive curable adhesive, a thermosetting adhesive, and an anaerobic adhesive, can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet may be used.

Figure 36A:
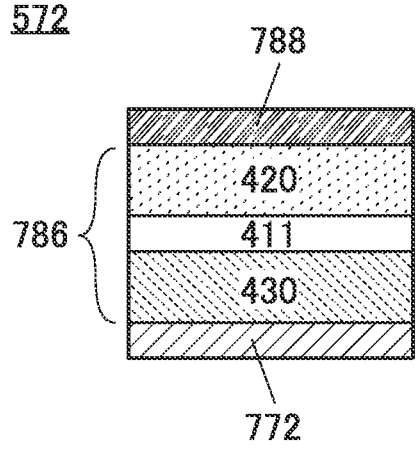
FIG. 36A to FIG. 36C are diagrams illustrating structure examples of a light-emitting element.
Figure 36B:
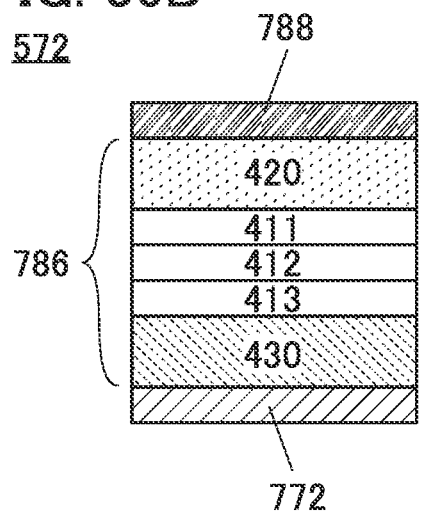
Figure 36C:
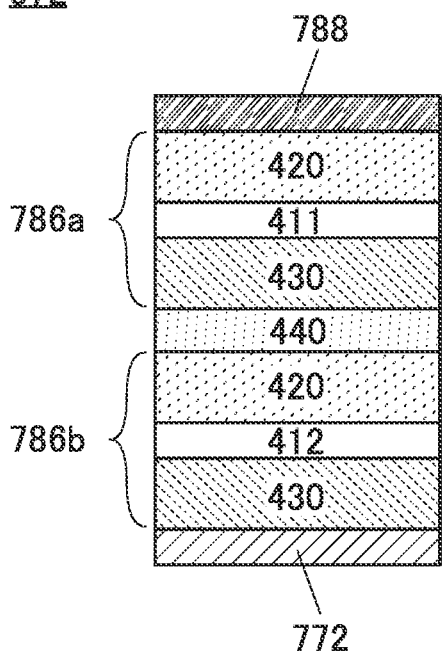

FIG. 36A to FIG. 36C are cross-sectional views illustrating structure examples of the light-emitting element 572, each of which illustrates a more detailed structure example of the EL layer 786. The EL layer 786 included in the light-emitting element 572 can be formed of a plurality of layers such as a layer 420, a light-emitting layer 411, and a layer 430, as illustrated in FIG. 36A. The layer 420 can include, for example, an electron-injection layer, an electron-transport layer, and the like. The light-emitting layer 411 contains a light-emitting compound, for example. The layer 430 can include, for example, a hole-injection layer, a hole-transport layer, and the like.

A structure including the layer 420, the light-emitting layer 411, and the layer 430, which are provided between a pair of electrodes, can function as a single light-emitting unit, and the structure in FIG. 36A is referred to as a single structure in this specification.

Note that a structure in which a plurality of light-emitting layers (the light-emitting layer 411, a light-emitting layer 412, and a light-emitting layer 413) are provided between the layer 420 and the layer 430 as illustrated in FIG. 36B is a variation of the single structure.

A structure in which a plurality of light-emitting units (an EL layer 786a and an EL layer 786b) are connected in series with an intermediate layer (charge-generation layer) 440 therebetween as illustrated in FIG. 36C is referred to as a tandem structure in this specification. In this specification and the like, the structure illustrated in FIG. 36C is referred to as a tandem structure; however, without being limited to this, a tandem structure may be referred to as a stack structure, for example. The tandem structure enables a light-emitting element capable of high luminance light emission.

The emission color of the light-emitting element 572 can be red, green, blue, cyan, magenta, yellow, white, or the like depending on materials that constitute the EL layer 786. Furthermore, the color purity can be further increased when the light-emitting element 572 has a microcavity structure.

The light-emitting element that emits white light preferably contains two or more kinds of light-emitting substances in the light-emitting layer. To obtain white light emission, two or more kinds of light-emitting substances are selected such that their emission colors are complementary.

The light-emitting layer preferably contains two or more kinds selected from light-emitting substances that emit light of R (red), G (green), B (blue), Y (yellow), O (orange), and the like.

Furthermore, when the above white light-emitting element (the single structure or the tandem structure) and a light-emitting element having an SBS structure are compared, the light-emitting element having the SBS structure can have lower power consumption than the white light-emitting element. To reduce power consumption, the light-emitting element having an SBS structure is suitably used. By contrast, the white light-emitting element is suitable in terms of lower manufacturing cost or higher manufacturing yield because the manufacturing process of the white light-emitting element is simpler than that of the light-emitting element having an SBS structure.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments or an example described in this specification as appropriate.

Embodiment 2

In this embodiment, a display apparatus of one embodiment of the present invention will be described.

The display apparatus in this embodiment can be a high-resolution display apparatus or large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 500A]

Figure 37:
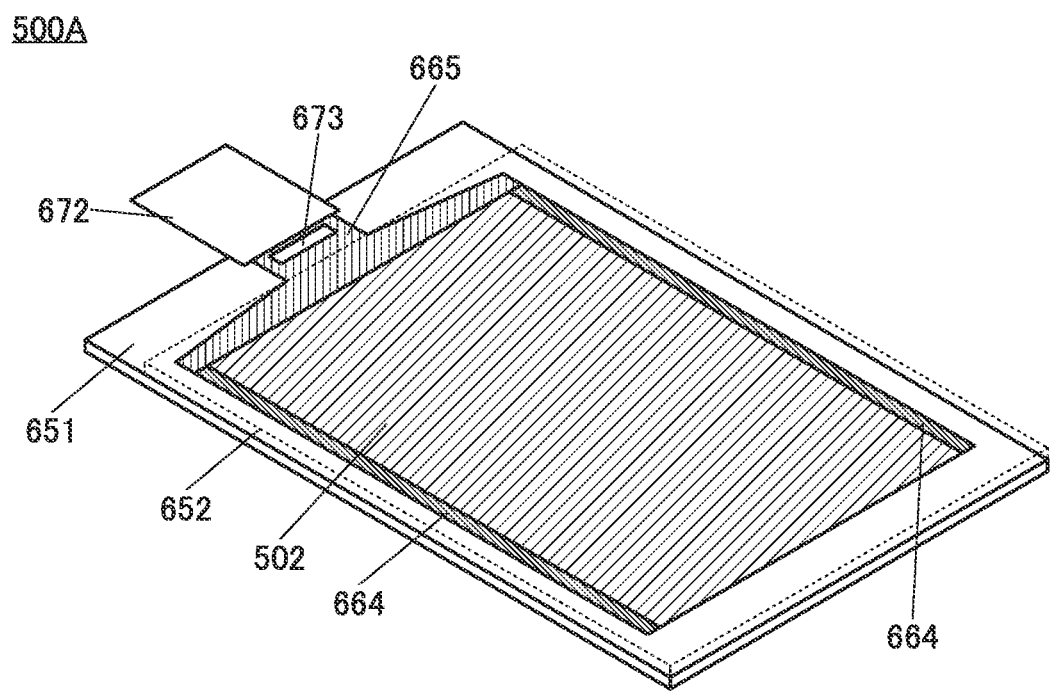
FIG. 37 is a diagram illustrating a structure example of a display apparatus.

FIG. 37 is a perspective view illustrating a structure example of a display apparatus 500A applicable to the display apparatus 500 illustrated in FIG. 25A. FIG. 38A is a cross-sectional view illustrating the structure example of the display apparatus 500A.

The display apparatus 500A has a structure where a substrate 652 and a substrate 651 are bonded to each other. In FIG. 37, the substrate 652 is denoted by a dashed line.

The display apparatus 500A includes the display portion 502, a circuit 664, a wiring 665, and the like. FIG. 37 illustrates an example in which an IC 673 and an FPC 672 are mounted on the display apparatus 500A. Thus, the structure illustrated in FIG. 37 can be regarded as a display module including the display apparatus 500A, the IC (integrated circuit), and the FPC.

As the circuit 664, a scan line driver circuit can be used, for example.

The wiring 665 has a function of supplying a signal and power to the display portion 502 and the circuit 664. The signal and power are input to the wiring 665 from the outside through the FPC 672. Alternatively, the signal and power are input to the wiring 665 from the IC 673.

FIG. 37 illustrates an example in which the IC 673 is provided on the substrate 651 by a COG method, a COF (Chip On Film) method, or the like. An IC including a scan line driver circuit, a signal line driver circuit, or the like can be used as the IC 673, for example. Note that the display apparatus 500A and the display module are not necessarily provided with an IC. The IC may be mounted on the FPC by a COF method, for example.

FIG. 38A illustrates an example of cross sections of part of a region including the FPC 672, part of the circuit 664, part of the display portion 502, and part of a region including an end portion of the display apparatus 500A.

The display apparatus 500A illustrated in FIG. 38A includes, between the substrate 651 and the substrate 652, a transistor 201, a transistor 205, the light-emitting element 572R, the light-emitting element 572G, the light-emitting element 572B, and the like. Here, FIG. 38A illustrates the structures of the light-emitting element 572R, the light-emitting element 572G, and the light-emitting element 572B in FIG. 35A.

The protective layer 458 and the substrate 652 are bonded to each other with an adhesive layer 642. A solid sealing structure, a hollow sealing structure, or the like can be employed to seal the light-emitting elements. In FIG. 38A, a solid sealing structure is employed in which a space between the substrate 652 and the substrate 651 is filled with the adhesive layer 642. Alternatively, a hollow sealing structure in which the space is filled with an inert gas (e.g., nitrogen or argon) may be employed. The adhesive layer 642 may be provided not to overlap with the light-emitting element. The space may be filled with a resin different from that of the frame-like adhesive layer 642.

The conductive layer 772 is electrically connected to a conductive layer 222b included in the transistor 205 through an opening provided in an insulating layer 214.

The display apparatus 500A has atop emission structure. Light from the light-emitting element is emitted toward the substrate 652 side. For the substrate 652, a material having a high visible-light-transmitting property is preferably used.

The transistor 201 and the transistor 205 are formed over the substrate 651. These transistors can be fabricated using the same material in the same step.

An insulating layer 211, an insulating layer 213, an insulating layer 215, and the insulating layer 214 are provided in this order over the substrate 651. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 500A. This can inhibit entry of impurities from the end portion of the display apparatus 500A through the organic insulating film. Alternatively, the organic insulating film may be formed so that its end portion is positioned on the inner side compared to the end portion of the display apparatus 500A, to prevent the organic insulating film from being exposed at the end portion of the display apparatus 500A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, a stacked film of an organic insulating film and an inorganic insulating film may be used as the insulating layer 214.

In a region 228 illustrated in FIG. 38A, an opening is formed in the insulating layer 214. This can inhibit entry of impurities into the display portion 502 from the outside through the insulating layer 214 even when an organic insulating film is used as the insulating layer 214. Consequently, the reliability of the display apparatus 500A can be increased.

Each of the transistor 201 and the transistor 205 includes a conductive layer 221 functioning as a gate electrode, the insulating layer 211 functioning as a gate insulating layer, a conductive layer 222a and the conductive layer 222b functioning as a source electrode and a drain electrode, a semiconductor layer 231, the insulating layer 213 functioning as a gate insulating layer, and a conductive layer 223 functioning as a gate electrode. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor and a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide. That is, a transistor including a metal oxide in its channel formation region (hereinafter, also referred to as an OS transistor) is preferably used for the display apparatus of this embodiment. Alternatively, a semiconductor layer of a transistor may contain silicon. Examples of silicon include amorphous silicon and crystalline silicon (e.g., low-temperature polysilicon and single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 664 and the transistor included in the display portion 502 may have the same structure or different structures. One structure or two or more kinds of structures may be employed for a plurality of transistors included in the circuit 664. Similarly, one structure or two or more kinds of structures may be employed for a plurality of transistors included in the display portion 502.

FIG. 38B and FIG. 38C illustrate other structure examples of transistors.

The transistor 209 and the transistor 210 each include the conductive layer 221 functioning as a gate electrode, the insulating layer 211 functioning as a gate insulating layer, the semiconductor layer 231 including a channel formation region 231i and a pair of low-resistance regions 231n, the conductive layer 222a connected to one of the low-resistance regions 231n, the conductive layer 222b connected to the other low-resistance region 231n, the insulating layer 225 functioning as a gate insulating layer, the conductive layer 223 functioning as a gate electrode, and the insulating layer 215 covering the conductive layer 223. The insulating layer 211 is positioned at least between the conductive layer 221 and the channel formation region 231i. The insulating layer 225 is positioned at least between the conductive layer 223 and the channel formation region 231i. Furthermore, an insulating layer 218 covering the transistor may be provided.

FIG. 38B illustrates an example of the transistor 209 in which the insulating layer 225 covers the top surface and a side surface of the semiconductor layer 231. The conductive layer 222a and the conductive layer 222b are connected to the corresponding low-resistance regions 231n through openings provided in the insulating layer 225 and the insulating layer 215. One of the conductive layer 222a and the conductive layer 222b functions as a source electrode, and the other functions as a drain electrode.

In the transistor 210 illustrated in FIG. 38C, the insulating layer 225 overlaps with the channel formation region 231i of the semiconductor layer 231 and does not overlap with the low-resistance regions 231n. The structure illustrated in FIG. 38C is obtained by processing the insulating layer 225 with the conductive layer 223 as a mask, for example. In FIG. 38C, the insulating layer 215 is provided to cover the insulating layer 225 and the conductive layer 223, and the conductive layer 222a and the conductive layer 222b are connected to the low-resistance regions 231n through the openings in the insulating layer 215.

The terminal portion 507 is provided in a region of the substrate 651 where the substrate 652 does not overlap. In the terminal portion 507, the wiring 665 is electrically connected to the FPC 672 through a conductive layer 666 and a connection layer 242. The conductive layer 666 can be a conductive film obtained by processing the same conductive film as the conductive layer 772. On the top surface of the terminal portion 507, the conductive layer 666 is exposed. Thus, the wiring 665 and the FPC 672 can be electrically connected to each other through the connection layer 242.

A light-blocking layer 617 is preferably provided on the surface of the substrate 652 on the substrate 651 side. A variety of optical members can be arranged on the outer surface of the substrate 652. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 652.

The protective layer 471 and the protective layer 458 covering the light-emitting element can inhibit an impurity such as water from entering the light-emitting element, and increase the reliability of the light-emitting element.

In the region 228 in the vicinity of the end portion of the display apparatus 500A, the insulating layer 215 and the protective layer 471 or the protective layer 458 are preferably in contact with each other through an opening in the insulating layer 214. In particular, the inorganic insulating films are preferably in contact with each other. This can inhibit entry of impurities into the display portion 502 from the outside through the organic insulating film. Consequently, the reliability of the display apparatus 500A can be increased.

For each of the substrate 651 and the substrate 652, glass, quartz, ceramics, sapphire, a resin, a metal, an alloy, a semiconductor, or the like can be used. The substrate on the side from which light from the light-emitting element is extracted is formed using a material that transmits the light. When the substrate 651 and the substrate 652 are formed using a flexible material, the flexibility of the display apparatus can be increased. Furthermore, a polarizing plate may be used as the substrate 651 or the substrate 652.

For each of the substrate 651 and the substrate 652, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 651 and the substrate 652.

In the case where a circularly polarizing plate overlaps with the display apparatus, a highly optically isotropic substrate is preferably used as the substrate included in the display apparatus. It can be said that a highly optically isotropic substrate has a low birefringence (a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

For the adhesive layer 642, a material similar to the material that can be used for the insulating layer 776 can be used.

As the connection layer 242, an anisotropic conductive film (ACF), an anisotropic conductive paste (ACP), or the like can be used.

As materials for the gate electrodes, the source electrode, and the drain electrode of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting element.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

[Display Apparatus 500B]

Figure 39:
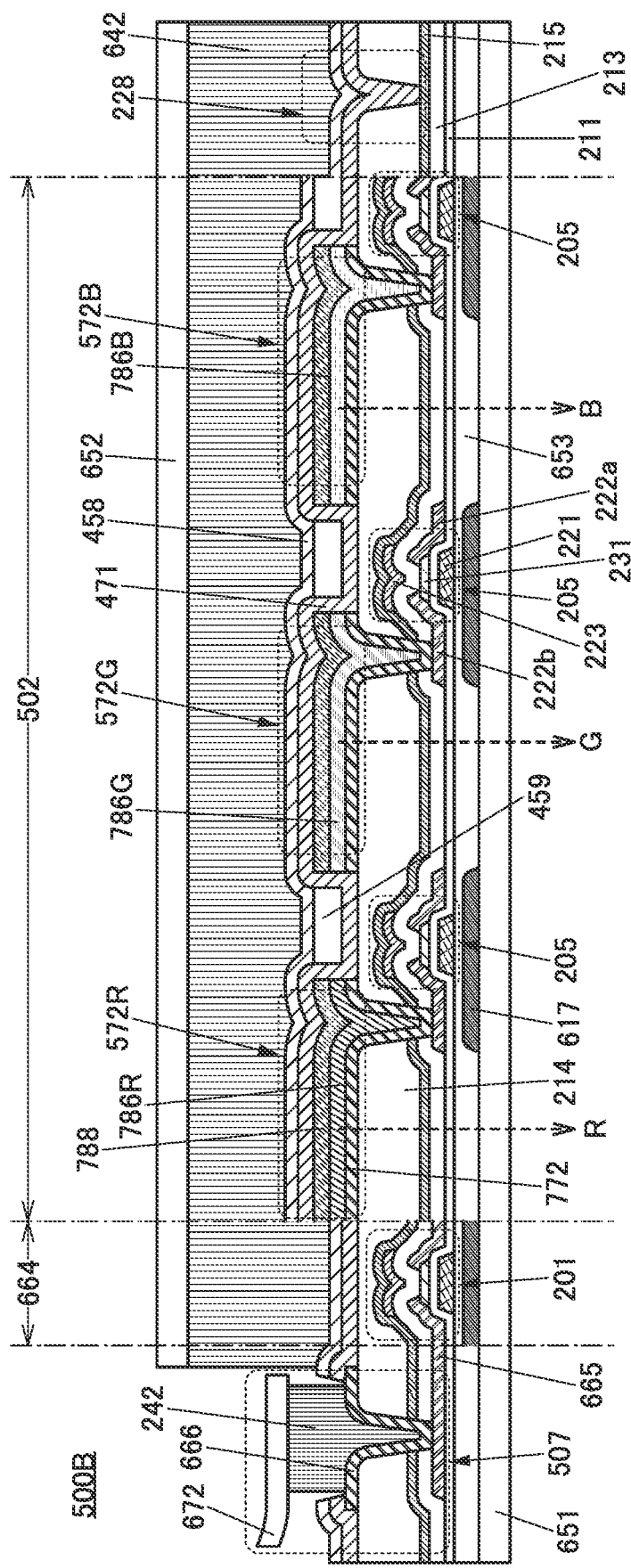
FIG. 39 is a diagram illustrating a structure example of a display apparatus.

A display apparatus 500B illustrated in FIG. 39 differs from the display apparatus 500A mainly in having a bottom-emission structure. Note that portions similar to those in the display apparatus 500A are not described.

Light from the light-emitting element is emitted toward the substrate 651 side. For the substrate 651, a material having a high visible-light-transmitting property is preferably used. By contrast, there is no limitation on the light-transmitting property of a material used for the substrate 652.

The light-blocking layer 617 is preferably formed between the substrate 651 and the transistor 201 and between the substrate 651 and the transistor 205. FIG. 39 illustrates an example in which the light-blocking layer 617 is provided over the substrate 651, an insulating layer 653 is provided over the light-blocking layer 617, and the transistor 201, the transistor 205, and the like are provided over the insulating layer 653.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments or an example described in this specification as appropriate.

Embodiment 3

In this embodiment, a display apparatus of one embodiment of the present invention will be described.

The display apparatus in this embodiment can be a high-definition display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 40A:
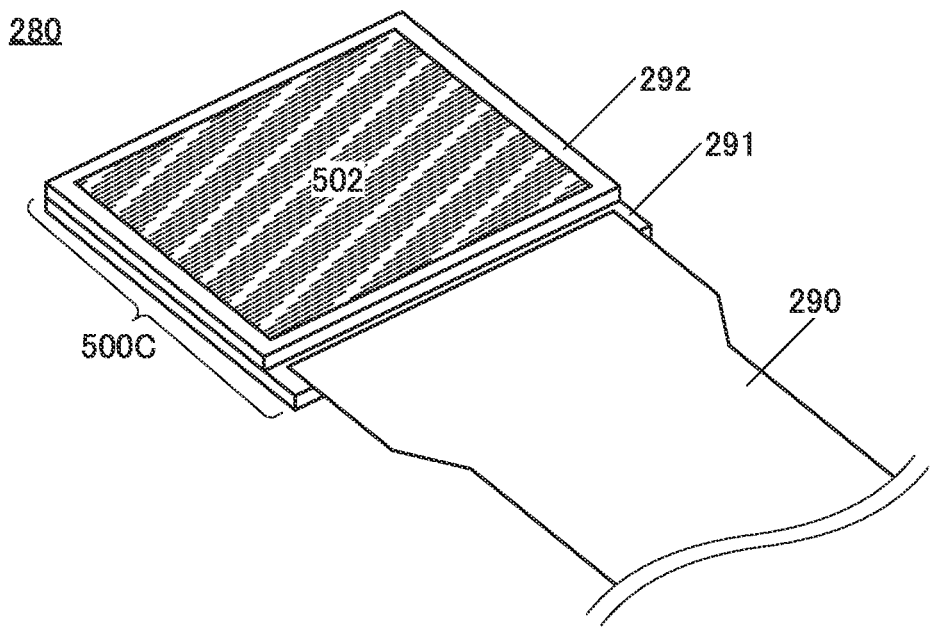
FIG. 40A and FIG. 40B are diagrams illustrating a structure example of a display module.

FIG. 40A is a perspective view of a display module 280. The display module 280 includes a display apparatus 500C and an FPC 290. Note that the display apparatus included in the display module 280 is not limited to the display apparatus 500C and may be any of a display apparatus 500D or a display apparatus 500E described later.

The display module 280 includes a substrate 291 and a substrate 292. The display module 280 includes a display portion 502. The display portion 502 is a region of the display module 280 where an image is displayed, and is a region where light emitted from pixels provided in a pixel portion 284 described later can be seen.

Figure 40B:
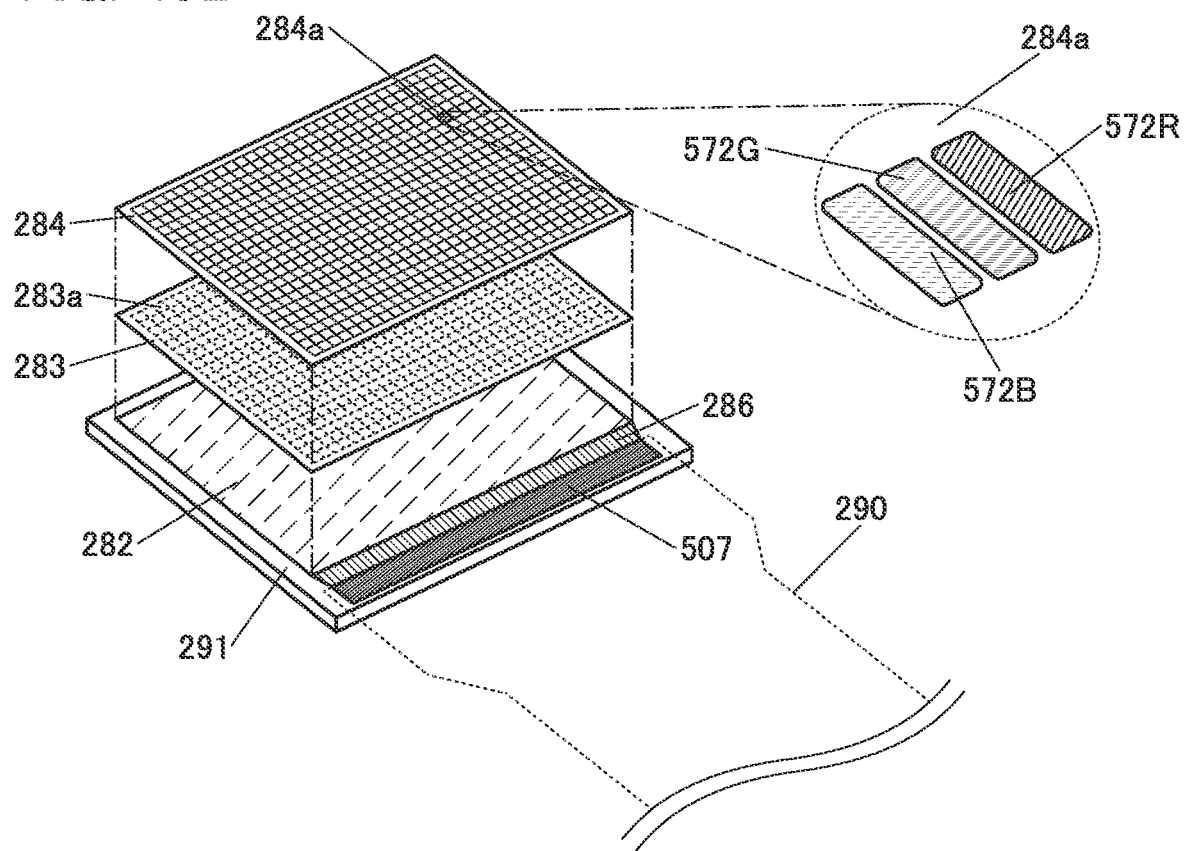

FIG. 40B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 507 to be connected to the FPC 290 is provided in a portion over the substrate 291 that does not overlap with the pixel portion 284. The terminal portion 507 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 40B. The pixel 284a includes the light-emitting element 572R, the light-emitting element 572G, and the light-emitting element 572B that emit light of different colors from each other. The plurality of light-emitting elements can be arranged in a stripe pattern as illustrated in FIG. 40B. Alternatively, a variety of arrangement methods of light-emitting elements, such as a delta pattern or a PenTile pattern can be employed.

The pixel circuit portion 283 includes a plurality of pixel circuits 283a arranged periodically.

One pixel circuit 283a is a circuit that controls light emission of three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. A gate signal is input to a gate of the selection transistor, and a video signal is input to one of a source and a drain of the selection transistor. With such a structure, an active-matrix display apparatus is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 502 can be significantly high. For example, the aperture ratio of the display portion 502 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 502 can have extremely high definition. For example, the pixels 284a are preferably arranged in the display portion 502 with a definition greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high definition, and thus can be suitably used for a VR device such as a head-mounted display or a glasses-type AR device. For example, even with a structure in which the display portion of the display module 280 is seen through a lens, pixels of the extremely-high-definition display portion 502 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 500C]

Figure 41:
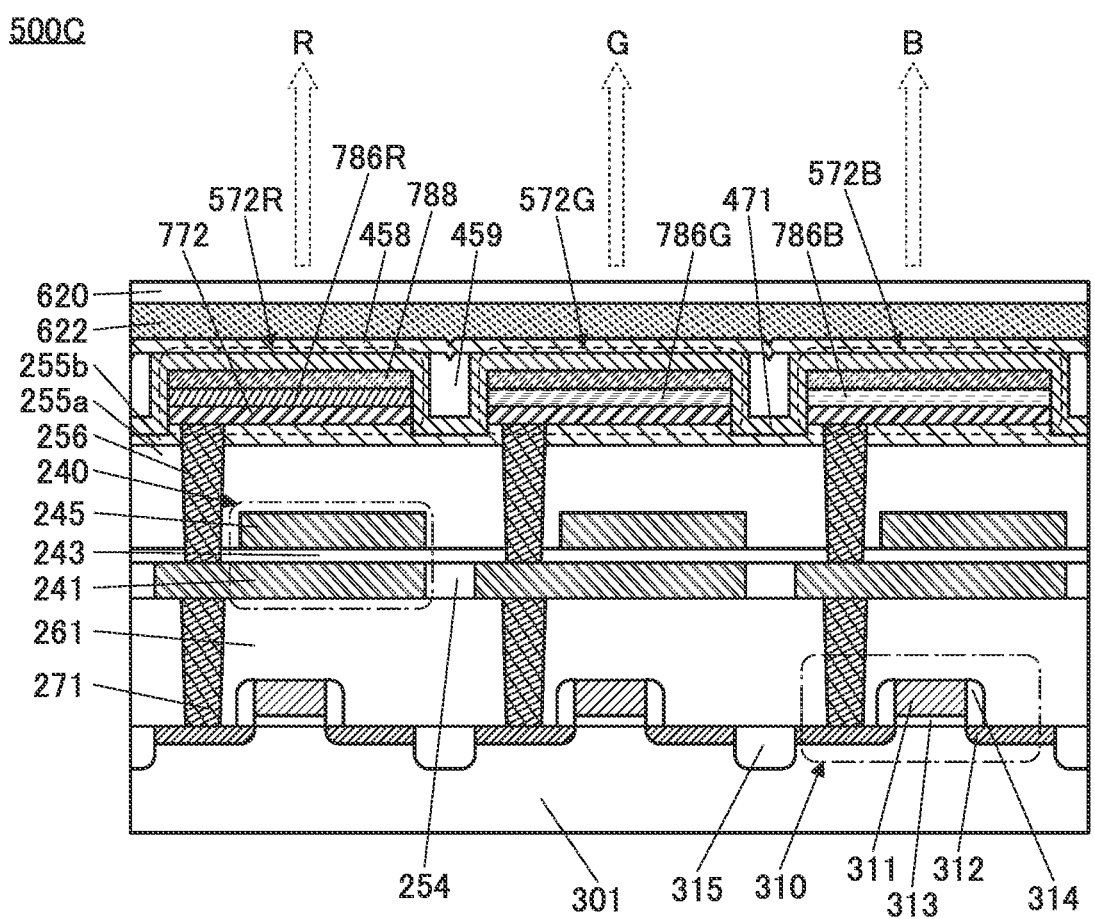
FIG. 41 is a diagram illustrating a structure example of a display apparatus.

The display apparatus 500C illustrated in FIG. 41 includes the substrate 301, the light-emitting element 572R, the light-emitting element 572G, the light-emitting element 572B, a capacitor 240, and the transistor 310. The substrate 301 corresponds to the substrate 291 in FIG. 40A and FIG. 40B.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source or a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255a is provided to cover the capacitor 240, an insulating layer 255b is provided over the insulating layer 255a, and the light-emitting element 572R, the light-emitting element 572G, the light-emitting element 572B, and the like are provided over the insulating layer 255b. This embodiment shows an example in which each of the light-emitting element 572R, the light-emitting element 572G, and the light-emitting element 572B has the stacked-layer structure illustrated in FIG. 35B. Side surfaces of the conductive layer 772, the EL layer 786R, the EL layer 786G, the EL layer 786B, and the conductive layer 788 are each covered with the protective layer 471. The protective layer 458 is provided over the protective layer 471, and a substrate 620 is bonded onto the protective layer 458 with a resin layer 622. The substrate 620 corresponds to the substrate 292 illustrated in FIG. 40A.

As each of the insulating layer 255a and the insulating layer 255b, a variety of inorganic insulating films such as an oxide insulating film, a nitride insulating film, an oxynitride insulating film, and a nitride oxide insulating film can be suitably used. As the insulating layer 255a, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferred that a silicon oxide film be used as the insulating layer 255a and a silicon nitride film be used as the insulating layer 255b. The insulating layer 255b preferably functions as an etching protective film. Alternatively, a nitride insulating film or a nitride oxide insulating film may be used as the insulating layer 255a, and an oxide insulating film or an oxynitride insulating film may be used as the insulating layer 255b. Although this embodiment shows an example in which a recessed portion is provided in the insulating layer 255b, a recessed portion is not necessarily provided in the insulating layer 255b.

The pixel electrode of each of the light-emitting elements is electrically connected to one of the source and the drain of the transistor 310 through a plug 256 embedded in the insulating layer 255a, the insulating layer 255b, and the insulating layer 243, the conductive layer 241 embedded in the insulating layer 254, and the plug 271 embedded in the insulating layer 261. The top surface of the insulating layer 255b and the top surface of the plug 256 are level with or substantially level with each other. Any of a variety of conductive materials can be used for the plugs.

[Display Apparatus 500D]

Figure 42:
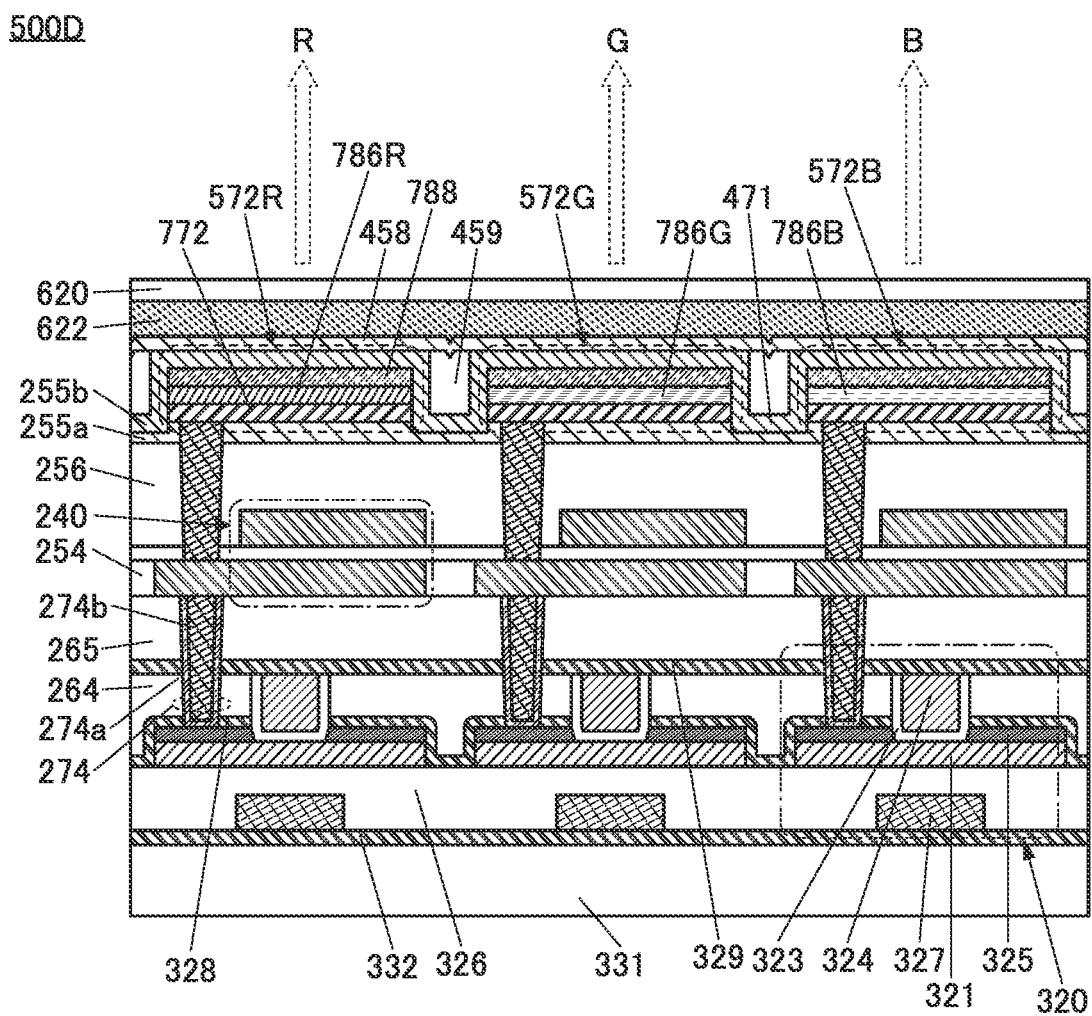
FIG. 42 is a diagram illustrating a structure example of a display apparatus.

The display apparatus 500D illustrated in FIG. 42 differs from the display apparatus 500C mainly in the structure of a transistor. Note that portions similar to those in the display apparatus 500C are not described in some cases.

The transistor 320 is a transistor that contains a metal oxide in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327. A substrate 331 corresponds to the substrate 291 in FIG. 40A and FIG. 40B. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as the first gate electrode of the transistor 320, and part of the insulating layer 326 functions as the first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a film of a metal oxide having semiconductor characteristics.

The pair of conductive layers 325 is provided on and in contact with the semiconductor layer 321, and functions as a source electrode and a drain electrode.

An insulating layer 328 is provided to cover top and side surfaces of the pair of conductive layers 325, the side surface of the semiconductor layer 321, and the like, and the insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321 to the insulating layer 328 side. As the insulating layer 328, an insulating film similar to the insulating layer 332 can be used.

An opening reaching the semiconductor layer 321 is provided in the insulating layer 328 and the insulating layer 264. The insulating layer 323, which is in contact with the side surfaces of the insulating layer 264, the insulating layer 328, and the conductive layer 325 and the top surface of the semiconductor layer 321, and the conductive layer 324 are embedded in the opening. The conductive layer 324 functions as the second gate electrode, and the insulating layer 323 functions as the second gate insulating layer.

The top surface of the conductive layer 324, the top surface of the insulating layer 323, and the top surface of the insulating layer 264 are planarized so that they are level or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layer 328 and the insulating layer 332 can be used.

The plug 274 electrically connected to one of the pair of conductive layers 325 is provided to be embedded in the insulating layer 265, the insulating layer 329, the insulating layer 264, and the insulating layer 328. Here, the plug 274 preferably includes a conductive layer 274a that covers side surfaces of openings formed in the insulating layer 265, the insulating layer 329, the insulating layer 264, and the insulating layer 328 and part of the top surface of the conductive layer 325, and a conductive layer 274b in contact with the top surface of the conductive layer 274a. For the conductive layer 274a, the conductive material in which hydrogen and oxygen are less likely to diffuse is preferably used.

The structure from the insulating layer 254 to the substrate 620 in the display apparatus 500D is similar to that in the display apparatus 500C.

[Display Apparatus 500E]

Figure 43:
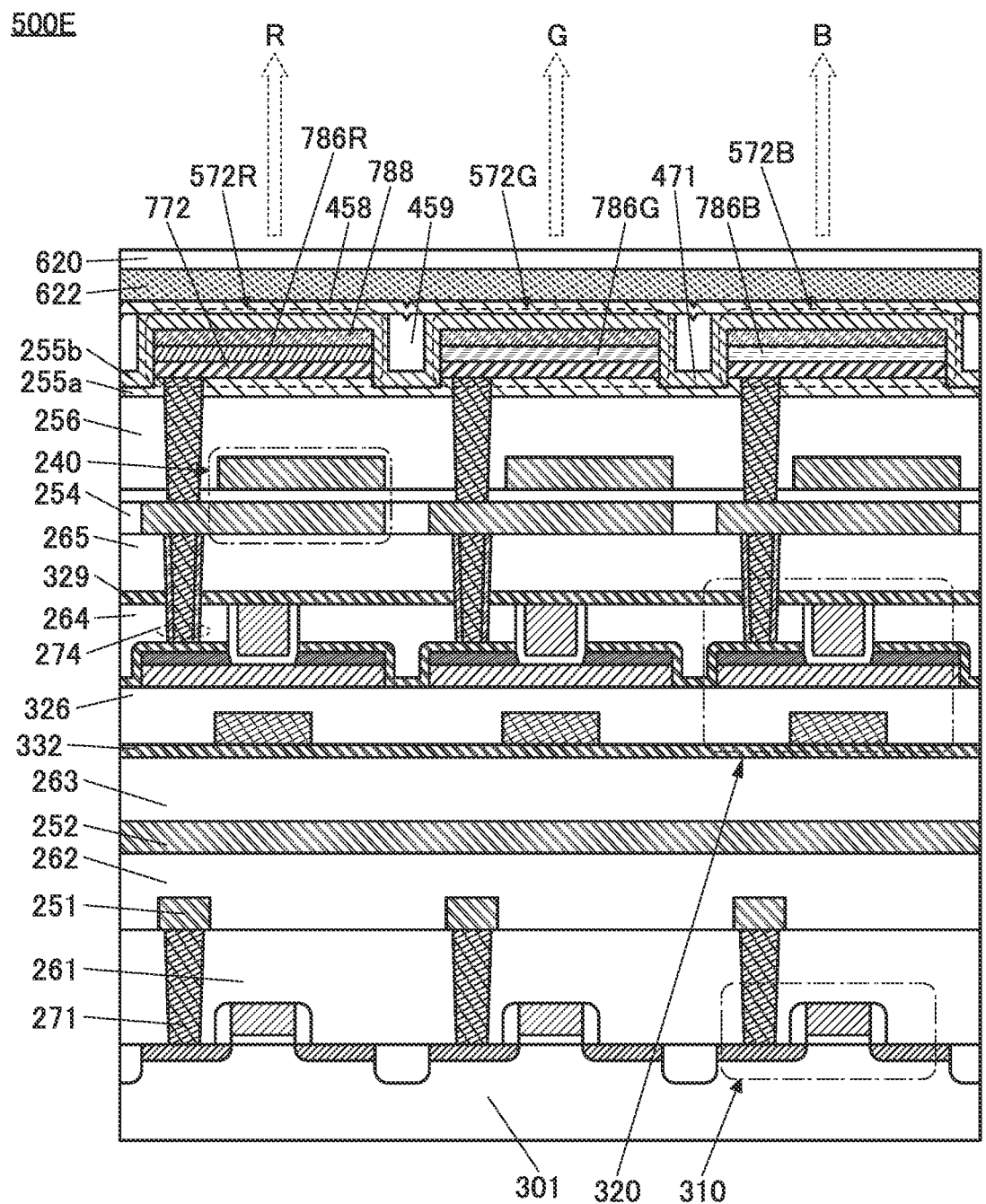
FIG. 43 is a diagram illustrating a structure example of a display apparatus.

The display apparatus 500E illustrated in FIG. 43 has a structure in which the transistor 310 having a channel formed in the substrate 301 and the transistor 320 including a metal oxide in a semiconductor layer where a channel is formed are stacked. Note that portions similar to those in the display apparatus 500C and the display apparatus 500D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a scan line driver circuit, a signal line driver circuit, or the like). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting elements; thus, the display apparatus can be downsized as compared with the case where a driver circuit is provided around a display region.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments or an example described in this specification as appropriate.

Embodiment 4

In this embodiment, a metal oxide that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as a metal organic chemical vapor deposition (MOCVD: Metal Organic CVD) method, an ALD method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). By contrast, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of a CAC-OS film. Moreover, the second region has [Ga] higher than that in the composition of a CAC-OS film. For example, the first region has higher [In] and lower [Ga] than the second region. Moreover, the second region has higher [Ga] and lower [In] than the first region.

Specifically, the first region contains an indium oxide, an indium zinc oxide, or the like as its main component. The second region contains a gallium oxide, a gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (p), and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments or an example described in this specification as appropriate.

Embodiment 5

In this embodiment, electronic devices of one embodiment of the present invention will be described with reference to FIG. 44 to FIG. 48.

The electronic device in this embodiment includes the display apparatus of one embodiment of the present invention, for example. Accordingly, the electronic device can display images with high-resolution and can have high reliability.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or notebook personal computer, a monitor of a computer or the like, digital signage, and a large game machine like a pachinko machine.

In particular, a display apparatus of one embodiment of the present invention can have a high definition, and thus can be favorably used for an electronic device having a relatively small display portion. Examples of such an electronic device include a watch-type or a bracelet-type information terminal device (wearable device), and a wearable device worn on a head, such as a device for VR such as a head mounted display, a glasses-type device for AR, and a device for MR.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the resolution is preferably 4K, 8K, or higher. Furthermore, the pixel density (definition) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display apparatus with one or both of high resolution and high definition, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 44A, FIG. 44B, FIG. 45A, and FIG. 45B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figure 44A:
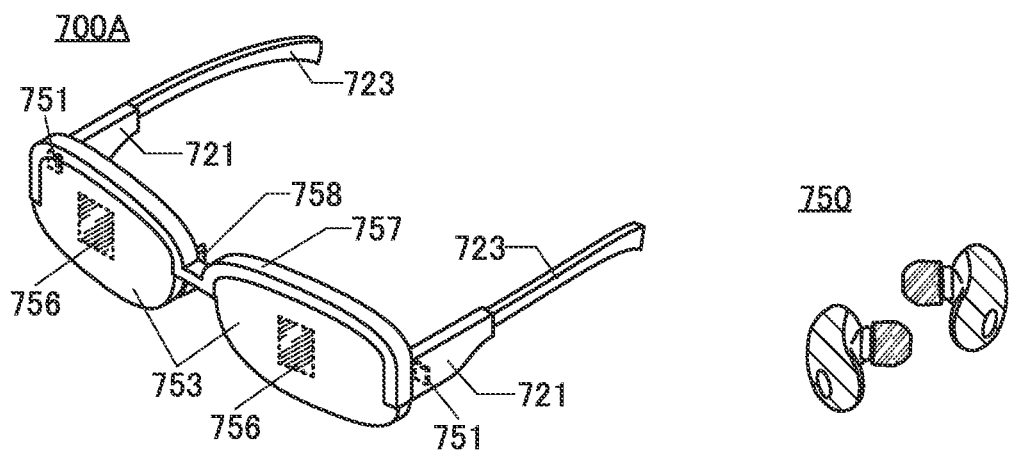
FIG. 44A and FIG. 44B are diagrams illustrating examples of electronic devices.
Figure 44B:
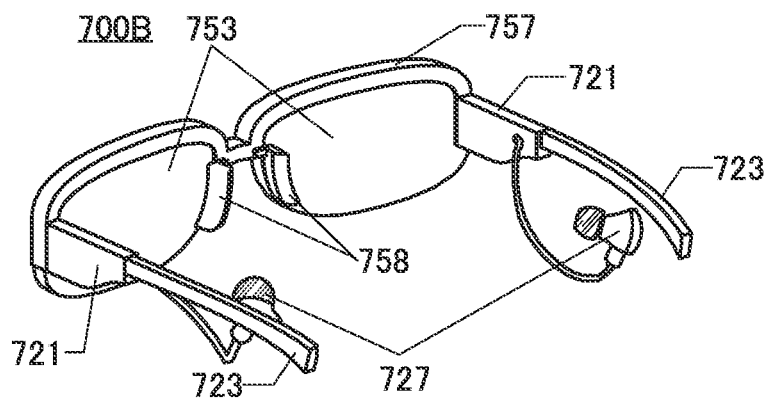

An electronic device 700A illustrated in FIG. 44A and an electronic device 700B illustrated in FIG. 44B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be applied to the electronic device 700A and the electronic device 700B. Thus, the electronic device 700A and the electronic device 700B can be highly reliable electronic devices that can display images with extremely high-resolution.

The electronic device 700A and the electronic device 700B can each project an image displayed on the display panel 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display region 756.

The communication portion includes a wireless communication device, and a picture signal, for example, can be supplied by the wireless communication device. Note that instead of or in addition to the wireless communication device, a connector to which a cable for supplying a picture signal and a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors and near touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion element (also referred to as a photoelectric conversion device) can be used as a light-receiving element (also referred to as a light-receiving device). One or both of an inorganic semiconductor and an organic semiconductor can be used for an active layer of the photoelectric conversion element.

Here, a touch sensor or a near touch sensor can sense an approach or contact of an object (a finger, a hand, a pen, or the like). The touch sensor can sense the object when the display apparatus and the object come in direct contact with each other. Furthermore, even when an object is not in contact with the display apparatus, the near touch sensor can sense the object. For example, the display apparatus is preferably capable of sensing an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of a touch sensor or a near touch sensor may be changed in accordance with the refresh rate. In the case where the refresh rate of the display apparatus is 120 Hz, for example, the driving frequency of a touch sensor or a near touch sensor can be higher than 120 Hz (typically, 240 Hz). This structure can achieve low power consumption and can increase the response speed of a touch sensor or a near touch sensor.

Figure 45A:
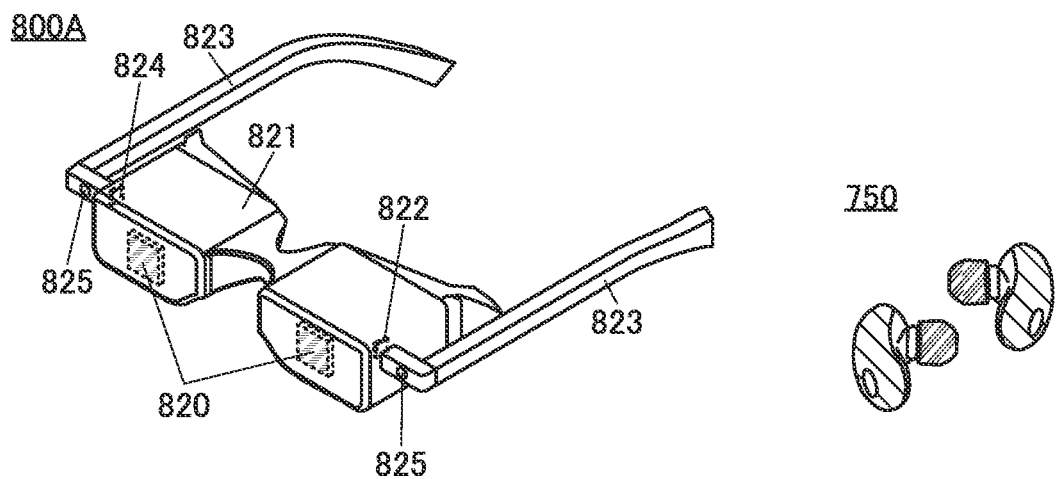
FIG. 45A and FIG. 45B are diagrams illustrating examples of electronic devices.
Figure 45B:
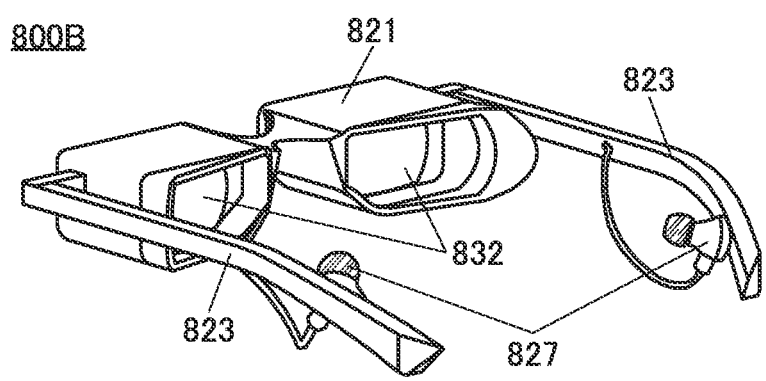

An electronic device 800A illustrated in FIG. 45A and an electronic device 800B illustrated in FIG. 45B each include a pair of display portions 820, a housing 821, a communication portion 822, a pair of wearing portions 823, a control portion 824, a pair of image capturing portions 825, and a pair of lenses 832.

The display apparatus of one embodiment of the present invention can be applied to the electronic device 800A and the electronic device 800B. Thus, the electronic device 800A and the electronic device 800B can be highly reliable electronic devices that can display images with extremely high-resolution. The electronic device 800A and the electronic device 800B can display images with extremely high-resolution and thus can provide a high sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, a mechanism for adjusting focus by changing the distance between the lenses 832 and the display portions 820 is preferably included.

The electronic device 800A or the electronic device 800B can be mounted on the user's head with the wearing portions 823. FIG. 45A illustrates an example in which the wearing portion 823 has a shape like a temple (also referred to as a joint or the like) of glasses, for example; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a picture signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 44A and the electronic device 800A illustrated in FIG. 45A each have a function of transmitting information to the earphones 750 with the wireless communication function.

The electronic device may include an earphone portion. The electronic device 700B illustrated in FIG. 44B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 45B includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 46A:
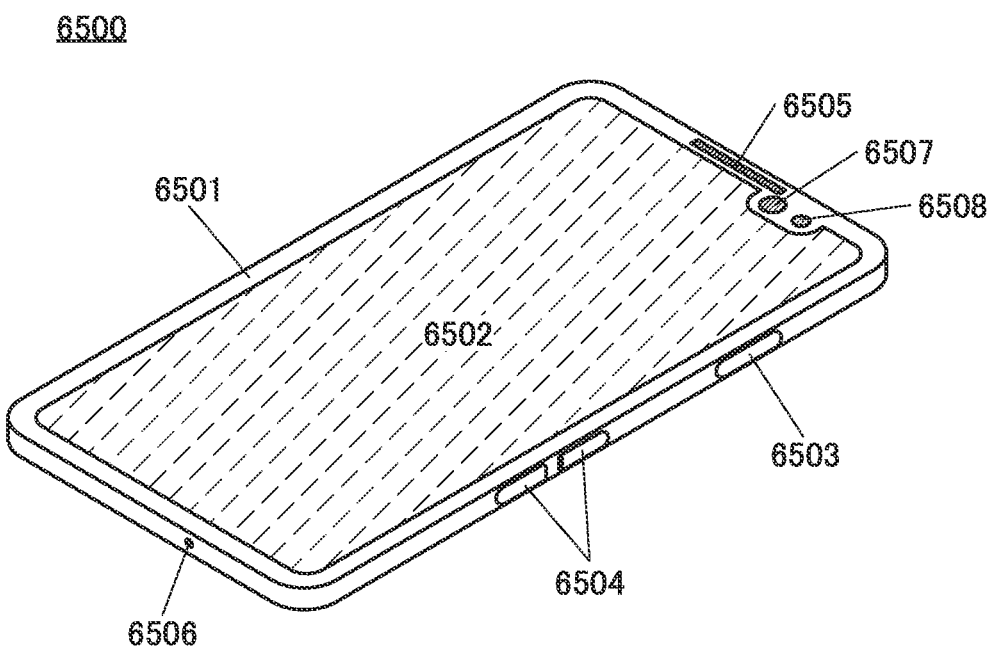
FIG. 46A and FIG. 46B are diagrams illustrating an example of an electronic device.

An electronic device 6500 illustrated in FIG. 46A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be applied to the electronic device 6500. Thus, the electronic device 6500 can be a highly reliable electronic device that can display images with extremely high-resolution.

Figure 46B:
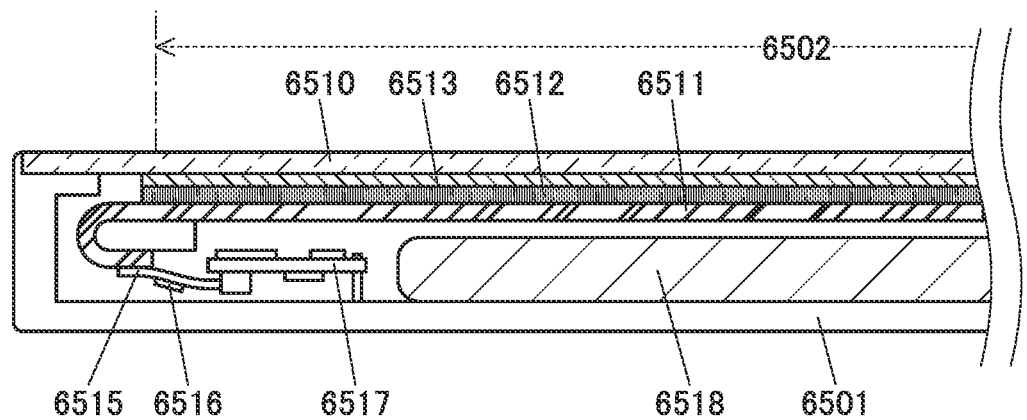

FIG. 46B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

Figure 47A:
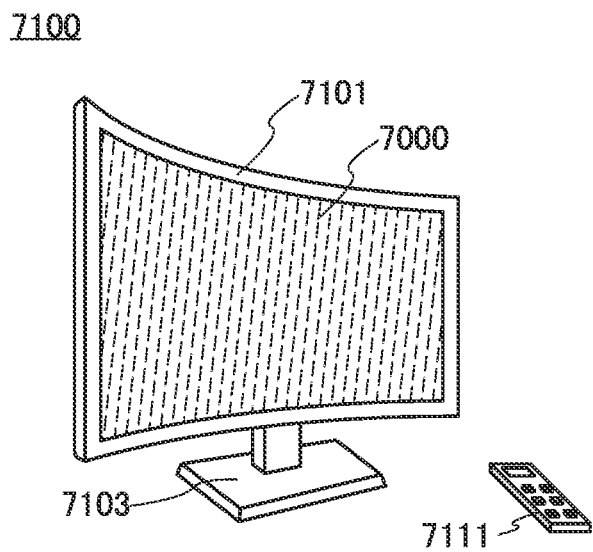
FIG. 47A to FIG. 47D are diagrams illustrating examples of electronic devices.

FIG. 47A illustrates an example of a television device. In a television device 7100, a display portion 7000 is incorporated in a housing 7101. Here, the housing 7101 is supported by a stand 7103.

The display apparatus of one embodiment of the present invention can be applied to the television device 7100. Accordingly, the television device 7100 can be a highly reliable electronic device that can display images with extremely high-resolution.

Operation of the television device 7100 illustrated in FIG. 47A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 47B:
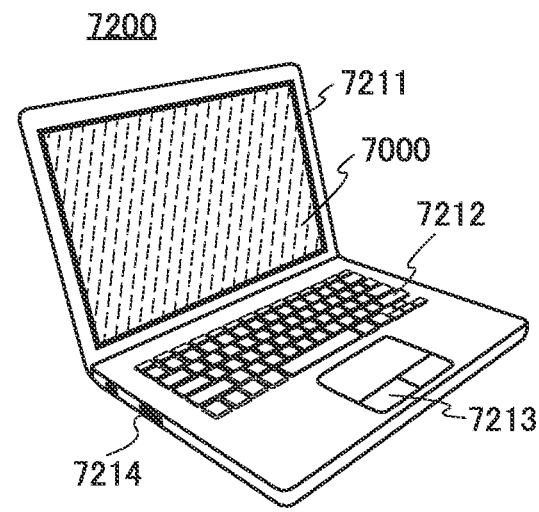

FIG. 47B illustrates an example of a notebook personal computer. The notebook personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be applied to the notebook personal computer 7200. Thus, the television device 7100 can be a highly reliable electronic device that can display images with extremely high-resolution.

Figure 47C:
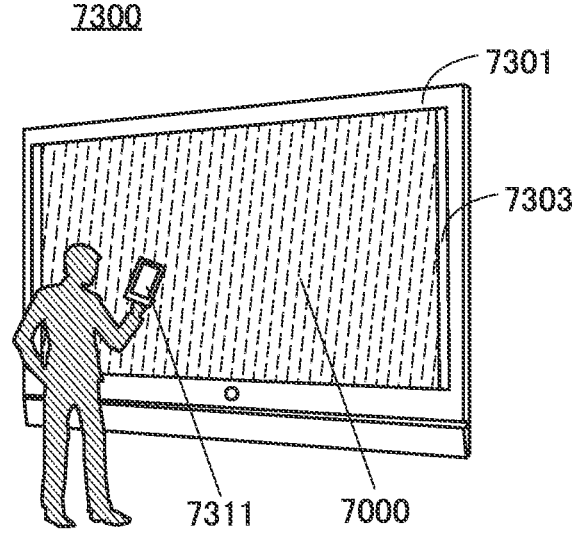
Figure 47D:
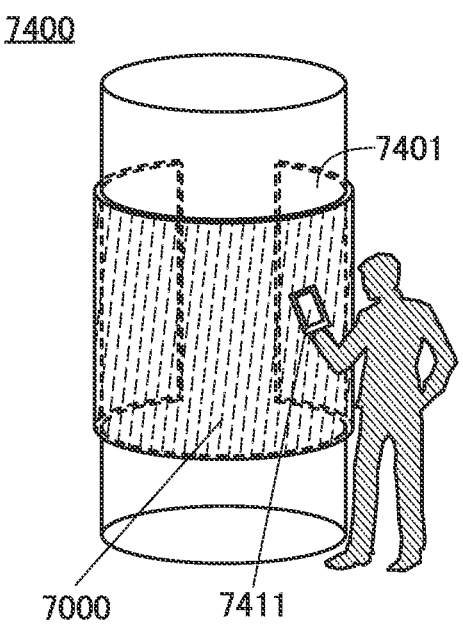

FIG. 47C and FIG. 47D illustrate examples of digital signage.

Digital signage 7300 illustrated in FIG. 47C includes a housing 7301, the display portion 7000, a speaker 7303, and the like. Furthermore, an LED lamp, an operation key (including a power switch or an operation switch), a connection terminal, a variety of sensors, a microphone, and the like can be included.

FIG. 47D is digital signage 7400 attached to a cylindrical pillar 7401. The digital signage 7400 includes the display portion 7000 provided along a curved surface of the pillar 7401.

The display apparatus of one embodiment of the present invention can be applied to the digital signage 7300 and the digital signage 7400. Thus, the digital signage 7300 and the digital signage 7400 can be highly reliable electronic devices that can display images with extremely high-resolution.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 47C and FIG. 47D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 48A to FIG. 48G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 48A to FIG. 48G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 48A to FIG. 48G will be described in detail below.

FIG. 48A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 48A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

The display apparatus of one embodiment of the present invention can be applied to the portable information terminal 9101. Thus, the portable information terminal 9101 can be a highly reliable electronic device that can display images with extremely high-resolution.

FIG. 48B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

The display apparatus of one embodiment of the present invention can be applied to the portable information terminal 9102. Thus, the portable information terminal 9102 can be a highly reliable electronic device that can display images with extremely high-resolution.

FIG. 48C is a perspective view of a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

The display apparatus of one embodiment of the present invention can be applied to the tablet terminal 9103. Thus, the tablet terminal 9103 can be a highly reliable electronic device that can display images with extremely high-resolution.

FIG. 48D is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

The display apparatus of one embodiment of the present invention can be applied to the portable information terminal 9200. Thus, the portable information terminal 9200 can be a highly reliable electronic device that can display images with extremely high-resolution.

FIG. 48E to FIG. 48G are perspective views illustrating a foldable portable information terminal 9201. FIG. 48E is a perspective view of an opened state of the portable information terminal 9201, FIG. 48G is a perspective view of a folded state thereof, and FIG. 48F is a perspective view of a state in the middle of change from one of FIG. 48E and FIG. 48G to the other. The portable information terminal 9201 is highly portable in the folded state and is highly browsable in the opened state because of its seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

The display apparatus of one embodiment of the present invention can be applied to the portable information terminal 9201. Thus, the portable information terminal 9201 can be a highly reliable electronic device that can display images with extremely high-resolution.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments or an example described in this specification as appropriate.

Example

In this example, the results of simulation of a sequential circuit included in the semiconductor device of one embodiment of the present invention will be described.

In this example, simulation was performed on the sequential circuit 50e illustrated in FIG. 28 and the sequential circuit 150e illustrated in FIG. 33. The simulation of the sequential circuit 50e was performed on the assumption of driving by the methods shown in FIG. 9B and FIG. 23B. The simulation of the sequential circuit 150e was performed on the assumption of driving by the methods shown in FIG. 21B and FIG. 24B.

Figure 49A:
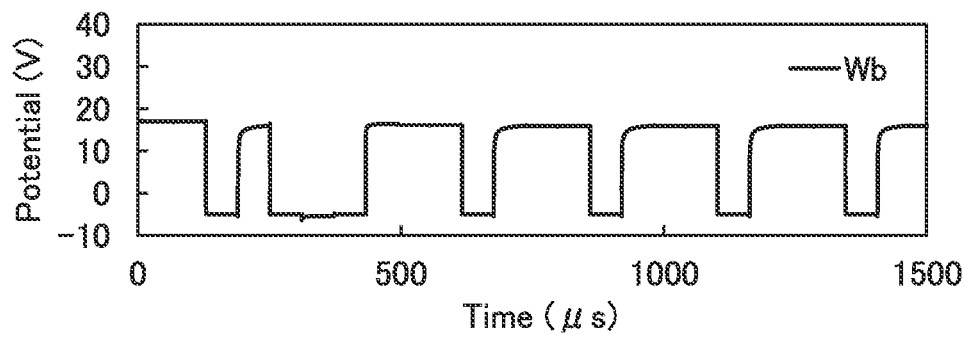
FIG. 49A to FIG. 49C are graphs showing potential changes over time.
Figure 49B:
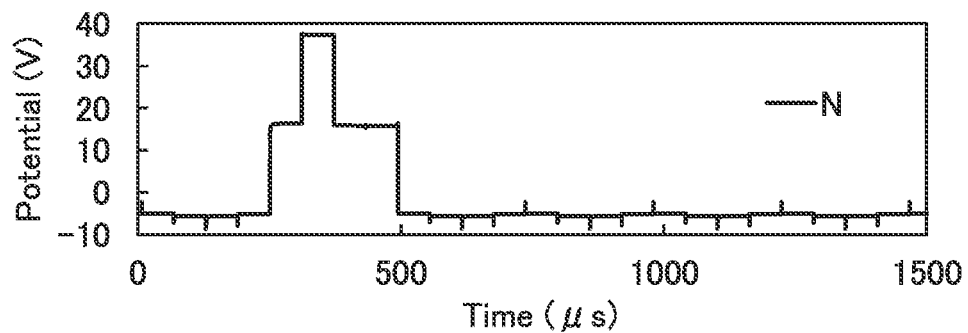
Figure 49C:
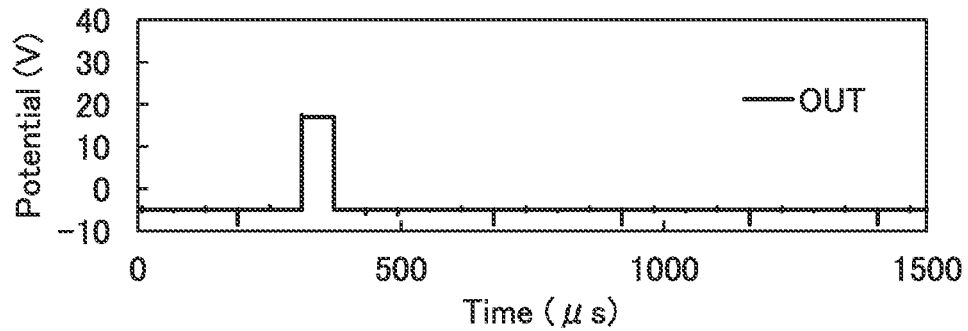
Figure 50A:
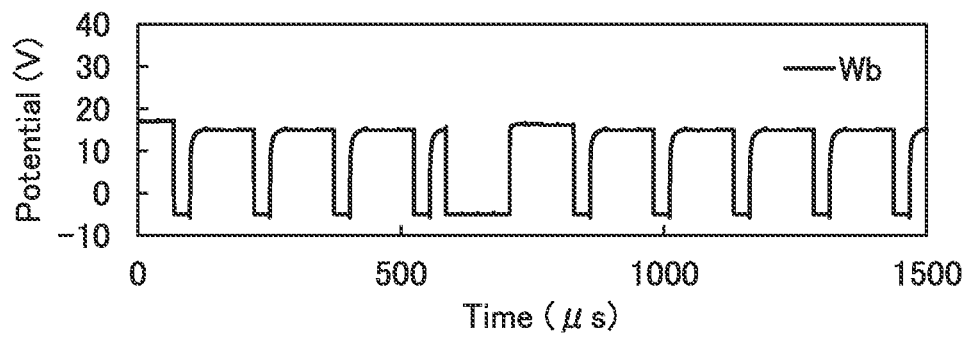
FIG. 50A to FIG. 50C are graphs showing potential changes over time.
Figure 50B:
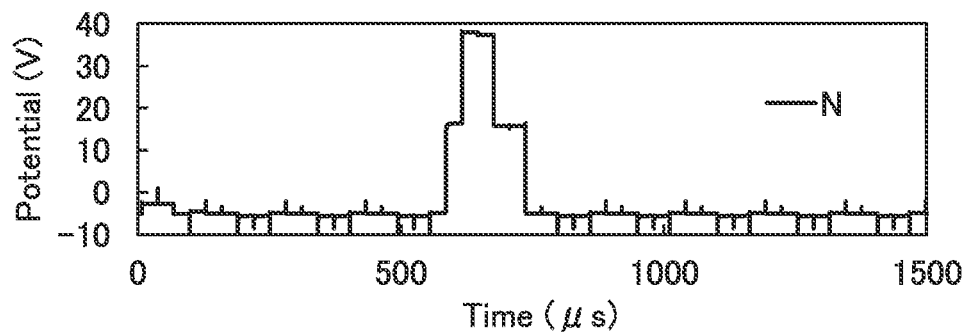
Figure 50C:
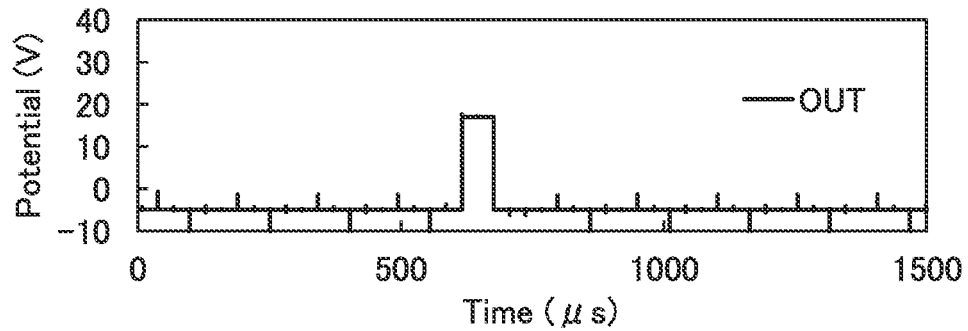

FIG. 49A to FIG. 49C are graphs showing the simulation results of potential changes overtime of the sequential circuit 50e in the fifth stage, i.e., a sequential circuit 50e_5. FIG. 50A to FIG. 50C are graphs showing the simulation results of potential changes over time of the sequential circuit 150e in the fifth stage, i.e., a sequential circuit 150e_5. Specifically, FIG. 49A and FIG. 50A show potential changes over time of the wiring Wb, FIG. 49B and FIG. 50B show potential changes over time of the node N, and FIG. 49C and FIG. 50C show potential changes over time of the signal OUT.

According to FIG. 49A, FIG. 49C, FIG. 50A, and FIG. 50C, it is confirmed in the simulation that the potential of the wiring Wb becomes a low potential periodically before the signal OUT is at a high potential and after the signal OUT is at a high potential. Furthermore, according to FIG. 49A to FIG. 50C, it is confirmed in the simulation that the potential of the wiring Wb, the potential of the node N, and the potential of the signal OUT become desired potentials.

It is confirmed from the above that the sequential circuit 50e and the sequential circuit 150e can perform desired operations in the simulation.

At least part of this example can be implemented in combination with the embodiments described in this specification as appropriate.

REFERENCE NUMERALS

10: sequential circuit, 10a: sequential circuit, 10b: sequential circuit, 10c: sequential circuit, 10d: sequential circuit, 10e: sequential circuit, 11a: circuit, 11b: circuit, 11c: circuit, 11d: circuit, 11e: circuit, 12: circuit, 21: transistor, 22: transistor, 23: transistor, 24: transistor, 25: transistor, 26: transistor, 27: capacitor, 28: transistor, 31: transistor, 32: transistor, 33: transistor, 34: transistor, 40: shift register circuit, 40a: shift register circuit, 50: sequential circuit, 50a: sequential circuit, 50b: sequential circuit, 50c: sequential circuit, 50d: sequential circuit, 50e: sequential circuit, 51a: circuit, 51b: circuit, 51c: circuit, 51d: circuit, 51e: circuit, 61: transistor, 62: transistor, 65: transistor, 66: transistor, 67: capacitor, 110: sequential circuit, 110a: sequential circuit, 110b: sequential circuit, 110c: sequential circuit, 110d: sequential circuit, 110e: sequential circuit, 111a: circuit, 111b: circuit, 111c: circuit, 111d: circuit, 111e: circuit, 140: shift register circuit, 140a: shift register circuit, 150: sequential circuit, 150a: sequential circuit, 150b: sequential circuit, 150c: sequential circuit, 150d: sequential circuit, 150e: sequential circuit, 151a: circuit, 151b: circuit, 151c: circuit, 151d: circuit, 151e: circuit, 171: transistor, 172: transistor, 173: transistor, 174: transistor, 175: transistor, 176: transistor, 185: transistor, 186: transistor, 201: transistor, 205: transistor, 209: transistor, 210: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 240: capacitor, 241: conductive layer, 242: connection layer, 243: insulating layer, 245: conductive layer, 251: conductive layer, 252: conductive layer, 254: insulating layer, 255a: insulating layer, 255b: insulating layer, 256: plug, 261: insulating layer, 262: insulating layer, 263: insulating layer, 264: insulating layer, 264B: coloring layer, 264G: coloring layer, 264R: coloring layer, 265: insulating layer, 271: plug, 274: plug, 274a: conductive layer, 274b: conductive layer, 280: display module, 282: circuit portion, 283: pixel circuit portion, 283a: pixel circuit, 284: pixel portion, 284a: pixel, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 411: light-emitting layer, 412: light-emitting layer, 413: light-emitting layer, 420: layer, 430: layer, 451: substrate, 458: protective layer, 459: region, 471: protective layer, 472: insulating layer, 500: display apparatus, 500A: display apparatus, 500B: display apparatus, 500C: display apparatus, 500D: display apparatus, 500E: display apparatus, 501: pixel circuit, 502: display portion, 504: driver circuit portion, 504a: scan line driver circuit, 504b: signal line driver circuit, 506: protection circuit, 507: terminal portion, 552: transistor, 554: transistor, 562: capacitor, 572: light-emitting element, 572B: light-emitting element, 572G: light-emitting element, 572R: light-emitting element, 572W: light-emitting element, 617: light-blocking layer, 620: substrate, 622: resin layer, 642: adhesive layer, 651: substrate, 652: substrate, 653: insulating layer, 664: circuit, 665: wiring, 666: conductive layer, 672: FPC, 673: IC, 700A: electronic device, 700B: electronic device, 721: housing, 723: wearing portion, 727: earphone portion, 750: earphone, 751: display panel, 753: optical member, 756: display region, 757: frame, 758: nose pad, 772: conductive layer, 776: insulating layer, 777: microlens array, 786: EL layer, 786a: EL layer, 786b: EL layer, 786B: EL layer, 786G: EL layer, 786R: EL layer, 786W: EL layer, 788: conductive layer, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A semiconductor device comprising a first circuit and a second circuit,
   wherein the first circuit comprises a first wiring, a second wiring, a first transistor, a second transistor, a third transistor, a fourth transistor, and a fifth transistor,
   wherein a gate of the first transistor is electrically connected to the second circuit through the first wiring,
   wherein a gate of the second transistor, one of a source and a drain of the third transistor, and one of a source and a drain of the fourth transistor are electrically connected to the second circuit through the second wiring,
   wherein one of a source and a drain of the first transistor is electrically connected to one of a source and a drain of the second transistor and one of a source and a drain of the fifth transistor,
   wherein a first clock signal is input to the other of the source and the drain of the first transistor,
   wherein a first potential is supplied to the other of the source and the drain of the second transistor,
   wherein a second clock signal is input to a gate of the third transistor and a gate of the fifth transistor, wherein a second potential is supplied to the other of the source and the drain of the third transistor, wherein a third clock signal is input to a gate of the fourth transistor, wherein a third potential is supplied to the other of the source and the drain of the fourth transistor, wherein a difference between the third potential and the first potential is larger than a difference between the second potential and the first potential, wherein the second circuit is configured to supply a first control potential to the first wiring based on a first signal and a second signal input to the second circuit, and wherein the second circuit is configured to supply a second control potential to the second wiring based on the first signal and the second signal.

2. The semiconductor device according to claim 1, wherein the second circuit is configured to make the second control potential an inversion potential of the first control potential when a potential of the second signal is an inversion potential of a potential of the first signal.

3. The semiconductor device according to claim 1, wherein the second circuit comprises a sixth transistor, a seventh transistor, an eighth transistor, and a ninth transistor, wherein one of a source and a drain of the sixth transistor and one of a source and a drain of the seventh transistor are electrically connected to the first wiring, wherein a gate of the seventh transistor, one of a source and a drain of the eighth transistor, and one of a source and a drain of the ninth transistor are electrically connected to the second wiring, wherein the first signal is input to a gate of the sixth transistor and a gate of the ninth transistor, and wherein the second signal is input to a gate of the eighth transistor.

4. The semiconductor device according to claim 3, wherein a fourth potential is supplied to the other of the source and the drain of the sixth transistor, wherein a fifth potential is supplied to the other of the source and the drain of the seventh transistor, wherein a sixth potential is supplied to the other of the source and the drain of the eighth transistor, wherein a seventh potential is supplied to the other of the source and the drain of the ninth transistor, wherein the fifth potential is an inversion potential of the fourth potential, and wherein the seventh potential is an inversion potential of the sixth potential.

5. The semiconductor device according to claim 1, wherein an eighth potential is supplied to the other of the source and the drain of the fifth transistor, and wherein a difference between the second potential and the eighth potential is smaller than a difference between the third potential and the eighth potential.

6. A display apparatus comprising the semiconductor device according to claim 1, a first light-emitting element, a second light-emitting element, and an insulating layer, wherein the first light-emitting element comprises a first lower electrode, a first light-emitting layer over the first lower electrode, and a first upper electrode over the first light-emitting layer, wherein the second light-emitting element comprises a second lower electrode, a second light-emitting layer over the second lower electrode, and a second upper electrode over the second light-emitting layer, and wherein the insulating layer is provided to cover an end portion of the first upper electrode and an end portion of the second upper electrode.

7. An electronic device comprising:

the display apparatus according to claim 6; and at least one of a battery, a camera, a speaker, and a microphone.

8. A semiconductor device comprising a first circuit and a second circuit, wherein the first circuit comprises a first wiring, a second wiring, a first transistor, a second transistor, a third transistor, a fourth transistor, a fifth transistor, and a capacitor, wherein one of a source and a drain of the first transistor is electrically connected to one of a source and a drain of the second transistor, wherein the one of the source and the drain of the second transistor is electrically connected to one electrode of the capacitor, wherein one of a source and a drain of the fifth transistor is electrically connected to the second circuit through the first wiring, wherein the other of the source and the drain of the fifth transistor is electrically connected to a gate of the first transistor, wherein the gate of the first transistor is electrically connected to the other electrode of the capacitor, wherein a gate of the second transistor, one of a source and a drain of the third transistor, and one of a source and a drain of the fourth transistor are electrically connected to the second circuit through the second wiring, wherein a first clock signal is input to the other of the source and the drain of the first transistor, wherein a first potential is supplied to the other of the source and the drain of the second transistor, wherein a second clock signal is input to a gate of the third transistor, wherein a second potential is supplied to the other of the source and the drain of the third transistor, wherein a third clock signal is input to a gate of the fourth transistor, wherein a third potential is supplied to the other of the source and the drain of the fourth transistor, wherein a difference between the third potential and the first potential is larger than a difference between the second potential and the first potential, wherein the second circuit is configured to supply a first control potential to the first wiring based on a first signal and a second signal input to the second circuit, and wherein the second circuit is configured to supply a second control potential to the second wiring based on the first signal and the second signal.

9. The semiconductor device according to claim 8, wherein a fourth clock signal is input to a gate of the fifth transistor.

10. The semiconductor device according to claim 8, wherein the second circuit is configured to make the second control potential an inversion potential of the first control potential when a potential of the second signal is an inversion potential of a potential of the first signal.

11. The semiconductor device according to claim 8, wherein the second circuit comprises a sixth transistor, a seventh transistor, an eighth transistor, and a ninth transistor, wherein one of a source and a drain of the sixth transistor and one of a source and a drain of the seventh transistor are electrically connected to the first wiring, wherein a gate of the seventh transistor, one of a source and a drain of the eighth transistor, and one of a source and a drain of the ninth transistor are electrically connected to the second wiring, wherein the first signal is input to a gate of the sixth transistor and a gate of the ninth transistor, and wherein the second signal is input to a gate of the eighth transistor.

12. The semiconductor device according to claim 11,
wherein a fourth potential is supplied to the other of the source and the drain of the sixth transistor,
wherein a fifth potential is supplied to the other of the source and the drain of the seventh transistor,
wherein a sixth potential is supplied to the other of the source and the drain of the eighth transistor,
wherein a seventh potential is supplied to the other of the source and the drain of the ninth transistor,
wherein the fifth potential is an inversion potential of the fourth potential, and
wherein the seventh potential is an inversion potential of the sixth potential.

13. The semiconductor device according to claim 8,
wherein the first circuit further comprises a tenth transistor,
wherein the tenth transistor is electrically connected to one of the source and the drain of the first transistor,
wherein the second clock signal is input to a gate of the tenth transistor,
wherein an eighth potential is supplied to one of a source and a drain of the tenth transistor, and
wherein a difference between the second potential and the eighth potential is smaller than a difference between the third potential and the eighth potential.

14. A display apparatus comprising the semiconductor device according to claim 8, a first light-emitting element, a second light-emitting element, and an insulating layer,
wherein the first light-emitting element comprises a first lower electrode, a first light-emitting layer over the first lower electrode, and a first upper electrode over the first light-emitting layer,
wherein the second light-emitting element comprises a second lower electrode, a second light-emitting layer over the second lower electrode, and a second upper electrode over the second light-emitting layer, and
wherein the insulating layer is provided to cover an end portion of the first upper electrode and an end portion of the second upper electrode.

15. An electronic device comprising:
the display apparatus according to claim 14; and
at least one of a battery, a camera, a speaker, and a microphone.

* * * * *